(12) United States Patent
Hayashi et al.

(10) Patent No.: US 11,177,450 B2
(45) Date of Patent: Nov. 16, 2021

(54) ORGANOELECTROLUMINESCENT ELEMENT, AND LIGHT EMISSION DEVICE, DISPLAY DEVICE, AND ILLUMINATION DEVICE IN WHICH SAID ORGANOELECTROLUMINESCENT ELEMENT IS USED

(75) Inventors: Naoyuki Hayashi, Kanagawa (JP); Hideki Yasuda, Kanagawa (JP); Koji Takaku, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 616 days.

(21) Appl. No.: 14/110,669

(22) PCT Filed: Apr. 6, 2012

(86) PCT No.: PCT/JP2012/059578
§ 371 (c)(1),
(2), (4) Date: Feb. 5, 2014

(87) PCT Pub. No.: WO2012/141108
PCT Pub. Date: Oct. 18, 2012

(65) Prior Publication Data
US 2014/0225085 A1    Aug. 14, 2014

(30) Foreign Application Priority Data

Apr. 12, 2011 (JP) .............................. JP2011-088682
Mar. 12, 2012 (JP) .............................. JP2012-054390

(51) Int. Cl.
*H01L 51/50* (2006.01)
*H01L 51/00* (2006.01)

(52) U.S. Cl.
CPC .......... *H01L 51/50* (2013.01); *H01L 51/0012* (2013.01); *H01L 51/5012* (2013.01); *H01L 51/5016* (2013.01); *H01L 51/006* (2013.01); *H01L 2251/558* (2013.01)

(58) Field of Classification Search
CPC ..................................................... H01L 51/50
See application file for complete search history.

(56) References Cited

U.S. PATENT DOCUMENTS

| 7,771,845 | B2 * | 8/2010 | Sano | .................. | H01L 51/5012 |
| | | | | | 257/E51.044 |
| 8,652,652 | B2 * | 2/2014 | Brooks | .................. | C07C 15/38 |
| | | | | | 428/690 |
| 2006/0210828 | A1 * | 9/2006 | Nakayama | ............. | C09K 11/06 |
| | | | | | 428/690 |
| 2006/0280965 | A1 * | 12/2006 | Kwong | ................... | C07C 13/62 |
| | | | | | 428/690 |
| 2008/0111476 | A1 * | 5/2008 | Choi | ...................... | C09K 11/06 |
| | | | | | 313/504 |
| 2009/0128008 | A1 * | 5/2009 | Ise | ........................ | C07D 401/14 |
| | | | | | 313/504 |
| 2010/0171109 | A1 * | 7/2010 | Nishimura | ............. | C09K 11/06 |
| | | | | | 257/40 |
| 2011/0001130 | A1 * | 1/2011 | Nishimura | ............. | C09K 11/06 |
| | | | | | 257/40 |
| 2011/0018023 | A1 * | 1/2011 | Mikami | .............. | H01L 51/5268 |
| | | | | | 257/98 |

FOREIGN PATENT DOCUMENTS

| JP | 200243056 | 2/2002 |
| JP | 2003297578 | 10/2003 |
| JP | 2005243432 | 8/2005 |
| JP | 2009-16184 | 1/2009 |
| JP | 2009123742 | 6/2009 |
| JP | 2009238507 | 10/2009 |
| JP | 2011-01475 | 1/2011 |
| JP | 201146699 | 3/2011 |
| JP | 2011228686 | 11/2011 |
| JP | 2012104553 | 5/2012 |
| WO | WO2009021107 | * 2/2009 |

OTHER PUBLICATIONS

Frischeisen et al. "Increased Light Outcoupling Efficiency in Dye-Doped Small Molecule Organic Light-Emitting Diodes With Horizontally Orientde Emitters, Organic Electronics". Organic Electronics, vol. 12, No. 5, 809-817 (2011).

* cited by examiner

*Primary Examiner* — Irina Krylova
(74) *Attorney, Agent, or Firm* — Riverside Law LLP

(57) ABSTRACT

An organoelectroluminescent element which can satisfy both a high external quantum efficiency and high power efficiency at the same time, which has on a substrate an anode, a first intermediate organic layer composed of at least one organic layer, a light-emitting layer, a second intermediate organic layer composed of at least one organic layer, and a cathode in this order, and in which light is extracted from the aforementioned anode side, wherein the aforementioned light-emitting layer contains a light-emitting material that is oriented in the horizontal direction with the substrate, the order parameter of the aforementioned light-emitting material in the aforementioned light-emitting layer is at least 0.7, and the relationship between the thickness T1 (nm) of the aforementioned first intermediate organic layer and the thickness T2 (nm) of the aforementioned second intermediate organic layer is such that $1.1 < T1/T2 < 4.0$ and also such that $20 \text{ nm} < T2 < 80 \text{ nm}$.

2 Claims, 2 Drawing Sheets

ORGANOELECTROLUMINESCENT ELEMENT, AND LIGHT EMISSION DEVICE, DISPLAY DEVICE, AND ILLUMINATION DEVICE IN WHICH SAID ORGANOELECTROLUMINESCENT ELEMENT IS USED

CROSS-REFERENCE TO RELATED APPLICATIONS

The present U.S. patent application is a U.S. National Stage Entry of international application number PCT/JP2012/059578, filed 6 Apr. 2012, which international application claims priority benefit from Japanese Patent Application Nos. 2012-054390, filed 12 Mar. 2012 and 2011-088682, filed 12 Apr. 2011, all of which are incorporated herein by reference in their entireties.

TECHNICAL FIELD

The present invention relates to an organoelectroluminescent element and to a light emission device, a display device, and an illumination device in which this organoelectroluminescent element is used.

BACKGROUND ART

Organoelectroluminescent elements are a self-emitting type of display device and are used in display and lighting applications. A display featuring an organoelectroluminescent element has advantageous display performance in that its visibility is better than that of conventional CRTs or LCDs, and that it has lower dependence on the viewing angle. Another advantage is that the display can be made more lightweight and thinner.

In addition to the advantages of light weight and thinness, an organoelectroluminescent element offers the potential to use a flexible substrate to achieve lighting in shapes that could not be obtained up to now.

The above are just some of the superior features of an organoelectroluminescent element, but the refractive index of the layers that make up an organoelectroluminescent element, including the light-emitting layer, is generally higher than that of air. For example, the refractive index of the light-emitting layer or another organic layer in an organoelectroluminescent element is from 1.6 to 2.1. Therefore, emitted light tends to be totally reflected at the interface, so the extraction efficiency thereof is less than 20%, with most of the light ending up being lost.

For example, a generally known organoelectroluminescent element is constituted by having an organic layer disposed between a pair of electrode layers on a substrate. This organic layer includes a light-emitting layer, and the organoelectroluminescent element emits light emitted from this light-emitting layer from the side of the light extraction face. In this case, because the entire reflection component (light at or above a critical angle) cannot be extracted at the interface between the organic layer and the electrode layer or the light extraction face, one problem is that the light extraction efficiency is low.

In order to solve such a problem, for example, a method has been proposed in which the light extraction efficiency is improved by using a light-emitting material that is oriented in the horizontal direction, in the light-emitting layer (Non-Patent Document 1).

In this proposal, however, the layer configuration other than the light-emitting layer has not been studied, and the external quantum efficiency needs to be further improved.

RELATED ART DOCUMENTS

Non-Patent Documents

Non-Patent Document 1: Organic Electronics, Vol. 12, No. 5, 809-817 (2011)

SUMMARY OF THE INVENTION

Problems to be Solved by the Invention

The present invention was devised in light of the aforementioned problems encountered in the past, and it is an object thereof to achieve the following: namely, it is an object of the present invention to provide an organoelectroluminescent element in which the order parameter of the light-emitting material in the light-emitting layer is at least 0.7, and the light-emitting material is oriented in the horizontal direction with respect to the substrate, wherein a high external quantum efficiency and high power efficiency can both be satisfied at the same time, and to provide a light emission device, a display device, and an illumination device in which this organoelectroluminescent element is used.

Means for Solving the Problems

Means for solving the aforementioned problems are as follows:

(1)

An organoelectroluminescent element which has on a substrate an anode, a first intermediate organic layer composed of at least one organic layer, a light-emitting layer, a second intermediate organic layer composed of at least one organic layer, and a cathode in this order and in which light is extracted from the aforementioned anode side, wherein the aforementioned light-emitting layer contains a light-emitting material that is oriented in the horizontal direction with the substrate, the order parameter of the aforementioned light-emitting material in the aforementioned light-emitting layer is at least 0.7, and the relationship between the thickness T1 (nm) of the aforementioned first intermediate organic layer and the thickness T2 (nm) of the aforementioned second intermediate organic layer is such that $1.1 < T1/T2 < 4.0$ and also such that $20 \text{ nm} < T2 < 80 \text{ nm}$.

(2)

The organoelectroluminescent element according to (1) above, wherein the aforementioned light-emitting material is a platinum complex, a pyrene derivative, or a π-conjugated compound expressed by General Formula R-1[1] below:

[1] Translator's note: In the Japanese original document, the labeling number for each of the general formulas is indicated in parentheses, but we have omitted the parentheses in the translation to avoid confusion with other parenthetical notations.

[First Chemical Formula]

General Formula R-1

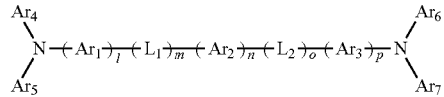

(Where $Ar_1$ to $Ar_3$ represent each independently a divalent $C_6$ to $C_{30}$ aromatic hydrocarbon group, $Ar_4$ to $Ar_7$ represent each independently a $C_6$ to $C_{30}$ aromatic hydrocarbon group, the two aromatic hydrocarbon groups constituting $Ar_4$ and $Ar_5$ may bond via a direct bond or a substituent to form a condensed heterocycle with the N replaced by $Ar_4$ and $Ar_5$, and the two aromatic hydrocarbon groups constituting $Ar_6$ and $Ar_7$ may bond via a direct bond or a substituent to form a condensed heterocycle with the N replaced by $Ar_6$ and $Ar_7$; $L_1$ and $L_2$ represent each independently a vinylene group or an acetylene group; and l, m, n, o, and p represent each independently an integer from 0 to 6, but one of l, n, and p is not 0.)

(3)

The organoelectroluminescent element according to (1) or (2) above, wherein the aforementioned light-emitting layer further contains a host material, and this host material is a triphenylene derivative.

(4)

The organoelectroluminescent element according to any one of (1) to (3) above, wherein the maximum emission wavelength of the aforementioned light-emitting material is 600 to 700 nm, and the relationship between the thickness T1 (nm) of the aforementioned first intermediate organic layer and the thickness T2 (nm) of the aforementioned second intermediate organic layer is such that $1.2 < T1/T2 < 4.0$ and also such that 30 nm $< T2 <$ 80 nm.

(5)

The organoelectroluminescent element according to any one of (1) to (3) above, wherein the maximum emission wavelength of the aforementioned light-emitting material is 400 to 500 nm, and the relationship between the thickness T1 (nm) of the aforementioned first intermediate organic layer and the thickness T2 (nm) of the aforementioned second intermediate organic layer is such that $1.1 < T1/T2 < 3.0$ and also such that 20 nm $< T2 <$ 70 nm.

(6)

The organoelectroluminescent element according to any one of (1) to (5) above, wherein a light extraction layer is formed on the aforementioned substrate.

(7)

The organoelectroluminescent element according to (6) above, wherein the refractive index of the aforementioned substrate is at least 1.8.

(8)

A light emission device in which the organoelectroluminescent element according to any one of (1) to (7) above is used.

(9)

A display device in which the organoelectroluminescent element according to any one of (1) to (7) above is used.

(10)

An illumination device in which the organoelectroluminescent element according to any one of (1) to (7) above is used.

Effects of the Invention

With the present invention, it is possible to provide an organoelectroluminescent element in which the order parameter of the light-emitting material in the light-emitting layer is at least 0.7, and the light-emitting material is oriented in the horizontal direction with respect to the substrate, wherein a high external quantum efficiency and high power efficiency can both be satisfied at the same time, and to provide a light emission device, a display device, and an illumination device in which this organoelectroluminescent element is used.

DETAILED DESCRIPTION OF EMBODIMENTS

Figure 1:
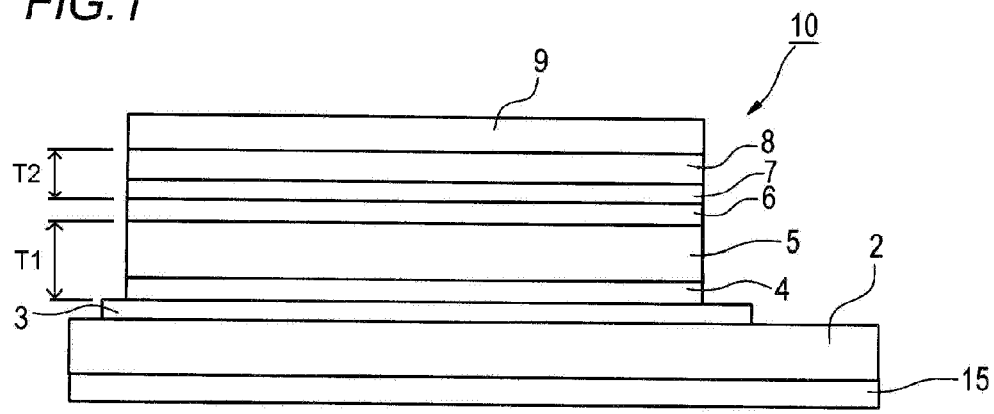
FIG. 1 is a schematic diagram showing one example of the configuration of the organoelectroluminescent element according to the present invention.

The present invention will now be described in detail below. Note that "from . . . to . . . " in this Specification indicates a range which includes the numerical values given as the minimum value and maximum value, respectively.

In the present invention, Substituent Group A and Substituent Group B are defined as follows:

(Substituent Group A)

Examples [of Substituent Group A] include alkyl groups (preferably with a carbon number of 1 to 30, more preferably with a carbon number of 1 to 20, and especially preferably with a carbon number of 1 to 10, such as a methyl, ethyl, isopropyl, tert-butyl, n-octyl, n-decyl, n-hexadecyl, cyclopropyl, cyclopentyl, and cyclohexyl); alkenyl groups (preferably with a carbon number of 2 to 30, more preferably with a carbon number of 2 to 20, and especially preferably with a carbon number of 2 to 10, such as a vinyl, allyl, 2-butenyl, and 3-pentenyl); alkynyl groups (preferably with a carbon number of 2 to 30, more preferably with a carbon number of 2 to 20, and especially preferably with a carbon number of 2 to 10, such as propargyl and 3-pentynyl); aryl groups (preferably with a carbon number of 6 to 30, more preferably with a carbon number of 6 to 20, and especially preferably with a carbon number of 6 to 12, such as phenyl, p-methylphenyl, naphthyl, and anthracenyl); amino groups (preferably with a carbon number of 0 to 30, more preferably with a carbon number of 0 to 20, and especially preferably with a carbon number of 0 to 10, such as amino, methylamino, dimethylamino, diethylamino, dibenzylamino, diphenylamino, and ditolylamino); alkoxy groups (preferably with a carbon number of 1 to 30, more preferably with a carbon number of 1 to 20, and especially preferably with a carbon number of 1 to 10, such as methoxy, ethoxy, butoxy, and 2-ethylhexyloxy); aryloxy groups (preferably with a carbon number of 6 to 30, more preferably with a carbon number of 6 to 20, and especially preferably with a carbon number of 6 to 12, such as phenyloxy, 1-naphthyloxy, and 2-naphthyloxy); heterocyclic oxy groups (preferably with a carbon number of 1 to 30, more preferably with a carbon number of 1 to 20, and especially preferably with a carbon number of 1 to 12, such as pyridyloxy, pyrazyloxy, pyrimidyloxy, and quinolyloxy); acyl groups (preferably with a carbon number of 2 to 30, more preferably with a carbon number of 2 to 20, and especially preferably with a carbon number of 2 to 12, such as acetyl, benzoyl, formyl, and pivaloyl); alkoxycarbonyl groups (preferably with a carbon number of 2 to 30, more preferably with a carbon number of 2 to 20, and especially preferably with a carbon number of 2 to 12, such as methoxycarbonyl and ethoxycarbonyl); aryloxycarbonyl groups (preferably with a carbon number of 7 to 30, more preferably with a carbon number of 7 to 20, and especially preferably with a carbon number of 7 to 12, such as phenyloxycarbonyl); acyloxy groups (preferably with a carbon number of 2 to 30, more preferably with a carbon number of 2 to 20, and especially preferably with a carbon number of 2 to 10, such as acetoxy and benzoyloxy); acylamino groups (preferably with a carbon number of 2 to 30, more preferably with a carbon number of 2 to 20, and especially preferably with a carbon number of 2 to 10, such as acetylamino and benzoylamino); alkoxycarbonylamino groups (preferably with a carbon number of 2 to 30, more preferably with a carbon number of 2 to 20, and especially preferably with a carbon number of 2 to 12, such as methoxycarbonylamino); aryloxycarbonylamino groups (preferably with a carbon number of 7 to 30, more preferably with a carbon number of 7 to 20, and especially preferably with a carbon number of 7 to 12, such as phenyloxycarbonylamino); sulfonyl amino groups (preferably with a carbon number of 1 to 30, more preferably with a carbon number of 1 to 20, and especially preferably with a carbon number of 1 to 12, such as methanesulfonyl amino and benzenesulfonyl amino); sulfamoyl groups (preferably with a carbon number of 0 to 30, more preferably with a carbon number of 0 to 20, and especially preferably with a carbon number of 0 to 12, such as sulfamoyl, methylsulfamoyl, dimethylsulfamoyl, and phenylsulfamoyl); carbamoyl groups (preferably with a carbon number of 1 to 30, more preferably with a carbon number of 1 to 20, and especially preferably with a carbon number of 1 to 12, such as carbamoyl, methylcarbamoyl, diethylcarbamoyl, and phenylcarbamoyl); alkylthio groups (preferably with a carbon number of 1 to 30, more preferably with a carbon number of 1 to 20, and especially preferably with a carbon number of 1 to 12, such as methylthio and ethylthio); arylthio groups (preferably with a carbon number of 6 to 30, more preferably with a carbon number of 6 to 20, and especially preferably with a carbon number of 6 to 12, such as phenylthio); heterocyclic thio groups (preferably with a carbon number of 1 to 30, more preferably with a carbon number of 1 to 20, and especially preferably with a carbon number of 1 to 12, such as pyridylthio, 2-benzimidazolylthio, 2-benzoxazolylthio, and 2-benzothiazolylthio); sulfonyl groups (preferably with a carbon number of 1 to 30, more preferably with a carbon number of 1 to 20, and especially preferably with a carbon number of 1 to 12, such as mesyl and tosyl); sulfinyl groups (preferably with a carbon number of 1 to 30, more preferably with a carbon number of 1 to 20, and especially preferably with a carbon number of 1 to 12, such as methanesulfinyl and benzenesulfinyl); ureido groups (preferably with a carbon number of 1 to 30, more preferably with a carbon number of 1 to 20, and especially preferably with a carbon number of 1 to 12, such as ureido, methylureido, and phenylureido); phosphoric amide groups (preferably with a carbon number of 1 to 30, more preferably with a carbon number of 1 to 20, and especially preferably with a carbon number of 1 to 12, such as diethylphosphoramide and phenylphosphoramide); a hydroxy group; a mercapto group; halogen atoms (such as a fluorine atom, chlorine atom, bromine atom, and iodine atom); a cyano group; a sulfo group; a carboxyl group; a nitro group; a hydroxamic acid group; a sulfino group; a hydrazino group; an imino group; heterocyclic groups (also including aromatic heterocyclic groups, preferably with a carbon number of 1 to 30 and more preferably with a carbon number of 1 to 12, with examples of the hetero atom including a nitrogen atom, an oxygen atom, a sulfur atom, a phosphorus atom, a silicon atom, a selenium atom, and a tellurium atom, and with concrete examples including pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, a carbazolyl group, azepinyl group, and silolyl group); silyl groups (preferably with a carbon number of 3 to 40, more preferably with a carbon number of 3 to 30, and especially preferably with a carbon number of 3 to 24, such as trimethylsilyl and triphenylsilyl); silyloxy groups (preferably with a carbon number of 3 to 40, more preferably with a carbon number of 3 to 30, and especially preferably with a carbon number of 3 to 24, such as trimethylsilyloxy and triphenylsilyloxy); and phosphoryl groups (such as a diphenylphosphoryl group and a dimethylphosphoryl group). These substituents may be further substituted, and examples of the further substituent include groups selected from the Substituent Group A described above.

(Substituent Group B)

Examples [of Substituent Group B] include alkyl groups (preferably with a carbon number of 1 to 30, more preferably with a carbon number of 1 to 20, and especially preferably with a carbon number of 1 to 10, such as a methyl, ethyl, isopropyl, tert-butyl, n-octyl, n-decyl, n-hexadecyl, cyclopropyl, cyclopentyl, and cyclohexyl); alkenyl groups (preferably with a carbon number of 2 to 30, more preferably with a carbon number of 2 to 20, and especially preferably with a carbon number of 2 to 10, such as a vinyl, allyl, 2-butenyl, and 3-pentenyl); alkynyl groups (preferably with a carbon number of 2 to 30, more preferably with a carbon number of 2 to 20, and especially preferably with a carbon number of 2 to 10, such as propargyl and 3-pentynyl); aryl groups (preferably with a carbon number of 6 to 30, more preferably with a carbon number of 6 to 20, and especially preferably with a carbon number of 6 to 12, such as phenyl, p-methylphenyl, naphthyl, and anthracenyl); a cyano group; heterocyclic groups (also including aromatic heterocyclic groups, preferably with a carbon number of 1 to 30 and more preferably with a carbon number of 1 to 12, with examples of the hetero atom including a nitrogen atom, an oxygen atom, a sulfur atom, a phosphorus atom, a silicon atom, a selenium atom, and a tellurium atom, and with concrete examples including pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, a carbazolyl group, azepinyl group, and silolyl group). These substituents may be further substituted, and examples of the further substituent include groups selected from the Substituent Group $A^2$ described above.

[2] Translator's note: "Substituent Group B" is probably intended in the original rather than "Substituent Group A."

Organoelectroluminescent Element

The organoelectroluminescent element of the present invention is an organoelectroluminescent element which has on a substrate an anode, a first intermediate organic layer composed of at least one organic layer, a light-emitting layer, a second intermediate organic layer composed of at least one organic layer, and a cathode in this order and in which light is extracted from the aforementioned anode side, wherein the aforementioned light-emitting layer contains a light-emitting material that is oriented in the horizontal direction with the substrate, the order parameter of the aforementioned light-emitting material in the aforementioned light-emitting layer is at least 0.7, and the relationship between the thickness T1 (nm) of the aforementioned first intermediate organic layer and the thickness T2 (nm) of the aforementioned second intermediate organic layer is such that 1.1<T1/T2<4.0 and also such that T2<80 nm [sic]³.

³ Translator's note: "20 nm<T2<80 nm" is probably intended in the original rather than "T2<80 nm."

With the organoelectroluminescent element of the present invention, by setting the relationship between the thickness T1 (nm) of the aforementioned first intermediate organic layer and the thickness T2 (nm) of the aforementioned second intermediate organic layer such that 1.1<T1/T2<4.0 and also such that 20 nm<T2<80 nm in an organoelectroluminescent element in which the order parameter of the light-emitting material in the light-emitting layer is at least 0.7, and the light-emitting material is oriented in the horizontal direction with the substrate, it is possible to satisfy both a high external quantum efficiency and high power efficiency at the same time.

With the iridium complexes or other such unoriented light-emitting materials that were not oriented in the horizontal direction with respect to the substrate in the light-emitting layer and that were widely used as light-emitting materials in conventional organoelectroluminescent elements, a large proportion of the emission is a component that undergoes quenching by metals, the light extraction efficiency to the outside decreases, and drive at a high voltage is necessary to raise the emission brightness, so these are undesirable from the standpoints of external quantum efficiency, power efficiency, durability, and so forth. Therefore, with a conventional element in which such an unoriented light-emitting material is used, the thickness of the organic layer between the light-emitting layer and the cathode (this corresponds to the thickness T2 (nm) of the aforementioned second intermediate organic layer) needed to be increased so as to reduce quenching by metals, and the thickness of the organic layer between this light-emitting layer and the cathode needed to be the same as or greater than the thickness of the organic layer between the light-emitting layer and the anode (this corresponds to the thickness T1 (nm) of the aforementioned first intermediate organic layer) (that is, satisfying the relationship T1≤T2), so a problem was divergence from the optimal distance due to optical interference. Furthermore, the carrier concentration was low, and electron mobility was low in the electron transport layer and electron injection layer; therefore, as the thickness of the electron transport layer and the electron injection layer increased, the drive voltage rose, which was a problem in that power efficiency suffered.

Investigation by the present inventors has revealed that, when a light-emitting material is used which is oriented in the horizontal direction with the substrate in the light-emitting layer and in which the order parameter is at least 0.7, the proportion of the emission of a component that undergoes quenching by metals is much lower than with an unoriented light-emitting material. The present invention is an organoelectroluminescent element that makes use of a light-emitting material that is oriented horizontally with respect to the substrate, wherein the thickness of the organic layer between the light-emitting layer and the anode (this corresponds to the thickness T1 (nm) of the aforementioned first intermediate organic layer) and the thickness of the organic layer between the light-emitting layer and the cathode (this corresponds to the thickness T2 (nm) of the aforementioned second intermediate organic layer) satisfy the relationship described above, the result of which is the discovery that it is possible to provide an organoelectroluminescent element in which the optimal length of optical interference can be achieved, and the thickness of the second intermediate organic layer (such as the electron injection layer or electron transport layer) can be reduced, so high external quantum efficiency and high power efficiency can both be satisfied at the same time.

Although the reason for this is not clear, it is surmised that when a light-emitting material that is oriented horizontally with respect to the substrate is used, the proportion of the emission of a component that undergoes quenching by metals is reduced significantly, which allows the distance between the cathode and the light-emitting layer to be reduced, and also that if the thickness of the organic layer between the light-emitting layer and the anode and the thickness of the organic layer between the light-emitting layer and the cathode satisfy the aforementioned relationship, the amplification effect of optical interference will be optimal.

Organoelectroluminescent Element

The organoelectroluminescent element of the present invention will now be described below.

The present invention provides an organoelectroluminescent element which has on a substrate an anode, a first intermediate organic layer composed of at least one organic layer, a light-emitting layer, a second intermediate organic layer composed of at least one organic layer, and a cathode in this order and in which light is extracted from the aforementioned anode side.

FIG. 1 shows an example of the configuration of the organoelectroluminescent element according to the present invention. The organoelectroluminescent element 10 according to the present invention shown in FIG. 1 is such that a light-emitting layer 6 is sandwiched between an anode 3 and a cathode 9 on a support substrate 2, and a light extraction layer 15 is formed on the side opposite from the side on which the anode 3 is formed. In concrete terms, a hole injection layer 4, a hole transport layer 5, the light-emitting layer 6, a first electron transport layer 7, and a second electron transport layer 8 are formed in this order between the anode 3 and the cathode 9.

In the configuration of the organoelectroluminescent element shown in FIG. 1, the first intermediate organic layer is composed of the hole injection layer 4 and the hole transport layer 5, and the thickness T1 of the first intermediate organic layer is the sum of the thickness of the hole injection layer 4 and the thickness of the hole transport layer 5. Similarly, the second intermediate organic layer is composed of the first electron transport layer 7 and the second electron transport layer 8, and the thickness T2 of the second intermediate organic layer is the sum of the thickness of the first electron transport layer 7 and the thickness of the second electron transport layer 8.

For the sake of the properties of a light-emitting element, the anode is preferably either transparent or semi-transparent.

<Layer Configuration of Organoelectroluminescent Element>

There are no particular restrictions on the configuration of the organic layers that are present in an organoelectroluminescent element as long as the aforementioned conditions are satisfied, which can be suitably selected according to the purpose and application of the organoelectroluminescent element. The organic layers are formed on the front face [sic]⁴ or one face of the aforementioned anode or the aforementioned cathode.

⁴ Translator's note: The word for "front face" here is probably an error in the original for "entire surface," which happens to be homophonous in Japanese.

Concrete examples of the layer configuration are as follows, but the present invention is in no way limited to these configurations. Note that in the following layer configurations, the layers described between the anode and the light-emitting layer correspond to the first intermediate organic layer if they are organic layers, and the layers described between the light-emitting layer and the cathode correspond to the second intermediate organic layer.

anode/hole transport layer/light-emitting layer/electron transport layer/cathode anode/hole transport layer/light-emitting layer/blocking layer/electron transport layer/cathode anode/hole transport layer/light-emitting layer/blocking layer/electron transport layer/electron injection layer/cathode anode/hole injection layer/hole transport layer/light-emitting layer/blocking layer/electron transport layer/cathode anode/hole injection layer/hole transport layer/light-emitting layer/electron transport layer/cathode anode/hole injection layer/hole transport layer/light-emitting layer/electron transport layer/electron injection layer/cathode anode/hole injection layer/hole transport layer/light-emitting layer/first electron transport layer/second electron transport layer/cathode anode/hole injection layer/hole transport layer/light-emitting layer/blocking layer/electron transport layer/electron injection layer/cathode anode/hole injection layer/hole transport layer/blocking layer/light-emitting layer/blocking layer/electron transport layer/electron injection layer/cathode <Substrate>

The substrate used in the present invention is preferably a substrate that will not scatter or attenuate light emitted from the organic layers. In the case of an organic material, one with excellent heat resistance, dimensional stability, solvent resistance, electrical insulation properties, and workability is preferable.

If a light extraction layer (described below) is formed on the substrate in the present invention, it is preferable to use glass with a high refractive index as the substrate in terms of further reducing guided light in the interior of the substrate and enhancing the external quantum efficiency and power efficiency, and it is more preferable if the refractive index of this glass with a high refractive index is at least 1.8. The refractive index of this glass with a high refractive index is ordinarily 2.0 or less.

The anode may be formed on the substrate such as a high-refractive-index glass so as to be in direct contact therewith or may also be formed via a light extraction layer (described below).

<Light Extraction Layer>

In the present invention, it is preferable for a light extraction layer to be formed on the substrate because the light extraction layer will reduce guided light inside the substrate and will increase the external quantum efficiency and the power efficiency. The light extraction layer formed on the substrate may be formed on the opposite side of the substrate from the side on which the anode is formed, or it may be formed at the interface between the substrate and the anode on the same side of the substrate as the side on which the anode is formed.

Examples of light extraction layers include a light scattering layer and a prism sheet. In concrete terms, a light scattering layer is a polymer layer composed of titanium dioxide, silica, or another such inorganic material, or polystyrene, PMMA, or another such organic material, and in which microparticles (from a few nanometers to a few microns in size) are dispersed, while a prism sheet is in the form of a triangular pyramid composed of an organic material formed by printing (such as screen printing), embossing, light patterning, nanoimprinting, or the like.

These layers can be formed directly on the substrate, or by forming them on a film and then transferring them to the substrate, or by bonding a film to the substrate, or another such method. Moreover, these layers may be formed either at the interface between the substrate and the air or at the interface between the substrate and a transparent electrode (the anode), or at both locations.

In addition, either a prism sheet or a light scattering layer may be used, or both may be used in combination.

The thickness of the light extraction layer is preferably 0.01 to 10 µm, more preferably 0.1 to 5 µm, and even more preferably 0.5 to 3 µm.

<Anode>

In general, there are no particular restrictions on the shape, structure, size, and so forth of the anode as long as it functions as an electrode that supplies holes to the organic layers and it can also extract the light generated at the light-emitting layer of the element from the anode side; one can be suitably selected from publicly known electrode materials depending on the purpose and application of the light-emitting element. As was discussed above, the anode is usually provided as a transparent or semi-transparent anode.

<Cathode>

In general, there are no particular restrictions on the shape, structure, size, and so forth of the cathode as long as it functions as an electrode that injects electrons into the organic layers, and one can be suitably selected from publicly known electrode materials depending on the purpose and application of the light-emitting element.

For the substrate, anode, and cathode, what is discussed in paragraph numbers [0070] to [0089] of Japanese Laid-Open Patent Application 2008-270736 can be applied to the present invention.

<Organic Layers>

The organic layers of the present invention will be described.

—Formation of Organic Layers—

In the organoelectroluminescent element of the present invention, each of the organic layers can be favorably formed by vapor deposition, sputtering, or another such dry film formation method, or by transfer, printing, spin coating, bar coating, ink jet, spray, or another such solution coating process. It is considered that the use of a liquid coating process leads to increased productivity and increased surface area of the organic EL element.

Dry methods that can be used include vapor deposition and sputtering, while wet methods that can be used include dipping, spin coating, dip coating, casting, die coating, roll coating, bar coating, gravure coating, spray coating, and inkjetting. The appropriate film formation method can be selected as dictated by the material of the organic layer. If the film is formed by a wet method, it may be dried afterward. The temperature, pressure, and other conditions in the drying are selected so as not to damage the coating layer.

The coating solution used in the aforementioned wet film formation methods (coating processes) is usually composed of the material of the organic layer and a solvent for dissolving or dispersing it. There are no particular restrictions on the solvent, which may be selected according to the material used for the organic layer.

When the material for the organoelectroluminescent element is used as a coating solution, the amount contained in the coating solution, based on total solids, is preferably 0.1 to 50 wt %, more preferably 0.3 to 40 wt %, and even more preferably 0.3 to 30 wt %. The viscosity is generally 1 to 30 mPa·s, more preferably 1.5 to 20 mPa·s, and even more preferably 1.5 to 15 mPa·s.

The coating solution is preferably obtained by dissolving the organoelectroluminescent element material in a specified organic solvent, filtering the solution, and then using [the product] to coat a specified support or layer. The pore size of the filter used for filtration is 2.0 μm or less, more preferably 0.5 μm or less, and even more preferably 0.3 μm or less, and is preferably made of polytetrafluoroethylene (PTFE), polyethylene, or nylon.

Examples of solvents include publicly known organic solvents such as aromatic hydrocarbon-based solvents, alcohol-based solvents, ketone-based solvents, aliphatic hydrocarbon-based solvents, and amide-based solvents.

Examples of aromatic hydrocarbon-based solvents include benzene, toluene, xylene, trimethylbenzene, tetramethylbenzene, cumene ethylbenzenen [sic][5], methyl propyl benzene, and methyl isopropyl benzene, with toluene, xylene, cumene, and trimethylbenzene being more preferable. The dielectric constant of an aromatic hydrocarbon-based solvent is usually 3 or lower.

[5] Translator's note: apparent error in the original; "cumene ethylbenzenen" should be "cumene, ethylbenzenen" (as two separate terms).

Examples of alcohol-based solvents include methanol, ethanol, butanol, benzyl alcohol, and cyclohexanol, with butanol, benzyl alcohol, and cyclohexanol being more preferable. The dielectric constant of an alcohol-based solvent is usually 10 to 40.

Examples of ketone-based solvents include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate, with methyl ethyl ketone, methyl isobutyl ketone, and propylene carbonate being preferable. The dielectric constant of a ketone-based solvent is usually 10 to 90.

Examples of aliphatic hydrocarbon-based solvents include pentane, hexane, octane, and decane, with octane and decane being preferable. The dielectric constant of an aliphatic hydrocarbon-based solvent is usually 1.5 to 2.0.

Examples of amide-based solvents include N-methyl-2-pyrrolidone, N-ethyl-2-pyrrolidone, N,N-dimethylacetamide, N,N-dimethylformamide[6], and 1,3-dimethyl-2-imidazolidinone, with N-methyl-2-pyrrolidone and 1,3-dimethyl-2-imidazolidinone being preferable. The dielectric constant of an amide-based solvent is usually 30 to 40.

[6] Translator's note: This chemical term appears garbled as a nonsensical word in the original Japanese document due to an apparent word processing error. We have ignored this obvious error and used a most likely intended chemical term in this translation.

The aforementioned solvents may be used alone, or two or more types may be used together.

Furthermore, a mixture of an aromatic hydrocarbon-based solvent (hereinafter, also referred to as "first solvent") and a second solvent having a higher dielectric constant than the first solvent may be used.

An alcohol-based solvent, amide-based solvent, or ketone-based solvent is preferably used as the second solvent, and the use of an alcohol-based solvent is more preferable.

The mix ratio (by weight) of the first solvent and the second solvent is 1/99 to 99/1, preferably 10/90 to 90/10, and more preferably 20/80 to 70/30. A mixed solvent containing at least 60 wt % of the first solvent is preferable.

If the coating solution for forming the organic layer contains a compound having a polymerizable group, and the polymer that forms the organic layer is formed by the polymerization reaction of this compound having a polymerizable group, the polymerization reaction will be promoted in the formation of the polymer by heating or optical irradiation following the application of the organic film.

There are no particular restrictions on the heating temperature and duration after coating so long as the polymerization reaction proceeds, but the heating temperature is generally from 100 to 200° C., and preferably from 120 to 160° C. The heating time is generally from 1 to 120 minutes, preferably from 1 to 60 minutes, and more preferably from 1 to 30 minutes.

Further examples include a polymerization reaction under UV irradiation, a polymerization reaction with a platinum catalyst, and a polymerization reaction with an iron catalyst such as iron chloride. These polymerization methods may be used in combination with a polymerization method involving heating.

(Light-Emitting Layer)

<Light-Emitting Material>

The light-emitting material contained by the light-emitting layer in the present invention is oriented in the horizontal direction with the substrate in the light-emitting layer. In the present application, [the phrase] "the light-emitting material is oriented in the horizontal direction with the substrate" refers to a state in which the long-axis direction of the light-emitting material and the direction of the horizontal plane of the substrate substantially coincide, or in the case of a planar light-emitting material, a state in which the plane of the light-emitting material and the direction of the horizontal plane of the substrate substantially coincide. Whether the light-emitting material is oriented in the horizontal direction with the substrate can be confirmed by a method such as the deflection measurement of photoluminescence discussed, for example, in non-patent document titled ATR-IR Deflection Measurement (Applied Physics Letters, Vol. 96, 073302).

The order parameter of the light-emitting material in the light-emitting layer in the present invention is at least 0.7. With regard to the order parameter of the light-emitting material in the light-emitting layer, for example, a washed quartz substrate is put in a vapor deposition device, a film is produced by vapor-depositing a material containing the light-emitting material, and the order parameter of the light-emitting material can be calculated by the aforementioned deflection measurement of ATR-IR, deflection measurement of photoluminescence, or another such method. A state in which the order parameter measured by a method such as these is at least 0.7 refers to a state in which the long-axis direction of the light-emitting material in the light-emitting layer and the direction of the horizontal plane of the substrate substantially coincide, or in the case of a planar light-emitting material, a state in which the plane of the light-emitting material and the direction of the horizontal plane of the substrate substantially coincide (that is, a state in which "the light-emitting material is oriented in the horizontal direction with the substrate"), and this significantly reduces the proportion of the emission of a component that undergoes quenching by metals when the element is used for organic electroluminescence.

The order parameter of the light-emitting material in the light-emitting layer in the present invention is preferably at least 0.7 and no more than 1.0, and more preferably at least 0.8 and no more than 1.0.

Any light-emitting material publicly known in the past can be used as the light-emitting material in the present invention so long as it is oriented horizontally with the substrate in the light-emitting layer and the order parameter is at least 0.7, but from the standpoint of improving the orientation of the light-emitting material, the aspect ratio (molecular length/molecular thickness) is preferably greater than 3, more preferably greater than 5, and even more preferably greater than 5 and no more than 30, with 5.3 to 20 being especially favorable.

If the aforementioned aspect ratio is greater than 3, there will be little molecular fluctuation, and the decrease in orientation will be suppressed.

Figure 4:
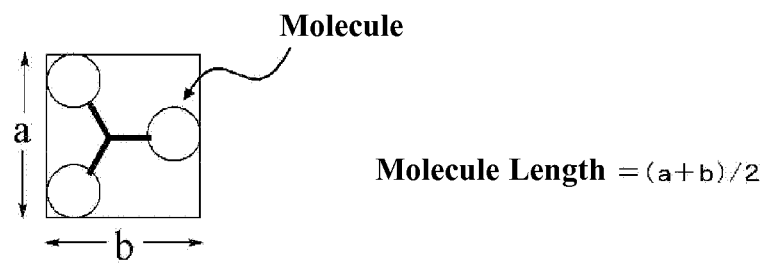
FIG. 4 is a model diagram for illustrating the molecular length of a material.

Note that in the present invention, the "molecular length" of the host material (described later) and the light-emitting material means the average values ((a+b)/2) of the lengths a and b of two sides of the closest quadrangle when the molecule of the material is imagined to have a flat structure as shown in FIG. 4. The term "closest quadrangle" here is defined as a quadrangle when the average values of a and b ((a+b)/2) are at their minimum out of a quadrangle (rectangle or square) that is tangent to the molecule on two sides. This "molecular length" is stipulated as follows by the theoretical calculation: Specifically, a density functional method is used, and in concrete terms, [this length is found] by using Gaussian 03 (from the US firm of Gaussian) to perform structural optimization computation with a basis function of 6-31G* and an exchange-correlation functional of B3LYP/LANL2DZ. The optimized structure obtained by structural optimization computation is used to define the molecular length as the average length of two sides of the closest quadrangle in ball-and-stick display.

The term "molecular thickness" means the thickness of the molecule in the Z axis direction, which is perpendicular to the X axis and the Y axis when we let the flat portions of the aforementioned flat structure be the X axis and Y axis (for example, the Y axis is the direction of the side with length a in FIG. 4, and the X axis is the direction of the side with length b). The molecular thickness is also found by the same method as that used for the molecular length, and the length in the thickness direction of the molecular in ball-and-stick display is defined as the molecular thickness.

Fluorescent materials and phosphorescent materials that satisfy the aforementioned conditions can be used as the light-emitting material, but a platinum complex (a phosphorescent material), a pyrene derivative (a fluorescent material), a perylene derivative (a fluorescent material), or a π-conjugated compound expressed by General Formula R-1 (described later) is preferable because it has a planar structure, and there is a greater likelihood that the aforementioned aspect ratio will be 3 or higher. A platinum complex (a phosphorescent material), a pyrene derivative (a fluorescent material), or a π-conjugated compound expressed by General Formula R-1 (described later) is more preferable from the standpoint of planarity.

Platinum Complex

The platinum complex is preferably platinum (a platinum complex) that is tetradentate, which is a planar coordination structure, and a platinum complex with a salen-based or porphyrin-based skeleton is more preferable.

The aforementioned platinum complex is preferably a platinum complex expressed by General Formula C-1.

[Second Chemical Formula]

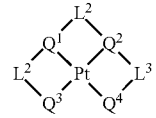

(C-1)

In the formula, $Q^1$, $Q^2$, $Q^3$, and $Q^4$ represent each independently a ligand coordinated to platinum. $L^1$, $L^2$, and $L^3$ represent each independently a single bond or a divalent linking group.

General Formula C-1 will now be described.

$Q^1$, $Q^2$, $Q^3$, and $Q^4$ represent each independently a ligand coordinated to platinum. The bonds between the platinum and $Q^1$, $Q^2$, $Q^3$, and $Q^4$ here may be covalent bonds, ion bonds, coordination bonds, or the like.

The atom in $Q^1$, $Q^2$, $Q^3$, and $Q^4$ that is bound to the platinum is preferably a carbon atom, a nitrogen atom, an oxygen atom, a sulfur atom, or a phosphorus atom. Of the atoms in $Q^1$, $Q^2$, $Q^3$, and $Q^4$ that are bound to the platinum, at least one is preferably a carbon atom, more preferably two are carbon atoms, and it is especially preferable if two are carbon atoms and two are nitrogen atoms.

$Q^1$, $Q^2$, $Q^3$, and $Q^4$ bound to platinum by a carbon atom may be either an anionic ligand or a neutral ligand. Examples of anionic ligands include a vinyl ligand, an aromatic hydrocarbon ring ligand (such as a benzene ligand, a naphthalene ligand, an anthracene ligand, and a phenanthrene ligand), a heterocyclic ligand (such as a furan ligand, a thiophene ligand, a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, as well as condensed rings containing these [ligands] (such as a quinoline ligand or a benzothiazole ligand)). Examples of neutral ligands include a carbene ligand.

$Q^1$, $Q^2$, $Q^3$, and $Q^4$ bound to a platinum by a nitrogen atom may be either a neutral ligand or anionic ligand, and examples of neutral ligands include a nitrogen-containing aromatic heterocyclic ligand (such as a pyridine ligand, a pyrazine ligand, a pyrimidine ligand, a pyridazine ligand, a triazine ligand, an imidazole ligand, a pyrazole ligand, a triazole ligand, an oxazole ligand, a thiazole ligand, as well as condensed rings containing these [ligands] (such as a quinoline ligand or a benzimidazole ligand)), an amine ligand, a nitrile ligand, and an imine ligand. Examples of anionic ligands include an amino ligand, an imino ligand, a nitrogen-containing aromatic heterocyclic ligand (such as a pyrrole ligand, an imidazole ligand, a triazole ligand, as well as condensed rings containing these [ligands] (such as an indole ligand or a benzimidazole ligand)).

$Q^1$, $Q^2$, $Q^3$, and $Q^4$ bound to a platinum by an oxygen atom may be either a neutral ligand or anionic ligand, and examples of neutral ligands include an ether ligand, a ketone ligand, an ester ligand, an amido ligand, an oxygen-containing heterocyclic ligand (such as a furane ligand, an oxazole ligand, and condensed rings containing these [ligands] (such as a benzoxazole ligand)). Examples of anionic ligands include an alkoxy ligand, an aryloxy ligand, a heteroaryloxy ligand, an acyloxy ligand, and a silyloxy ligand.

$Q^1$, $Q^2$, $Q^3$, and $Q^4$ bound to a platinum by a sulfur atom may be either a neutral ligand or anionic ligand, and examples of neutral ligands include a thioether ligand, a thioketone ligand, a thioester ligand, a thioamido ligand, a sulfur-containing heterocyclic ligand (such as a thiophene ligand, a thiazole ligand, and condensed rings containing these [ligands] (such as a benzothiazole ligand)). Examples of anionic ligands include an alkylmercapto ligand, an arylmercapto ligand, and a heteroarylmercapto ligand.

$Q^1$, $Q^2$, $Q^3$, and $Q^4$ bound to a platinum by a phosphorus atom may be either a neutral ligand or anionic ligand, and examples of neutral ligands include a phosphine ligand, a phosphate ester ligand, a phosphite ester ligand, a phosphorus-containing heterocyclic ligand (such as a phosphinine ligand). Examples of anionic ligands include a phosphino ligand, a phosphinyl ligand, and a phosphoryl ligand.

The ligands represented by $Q^1$, $Q^2$, $Q^3$, and $Q^4$ may have a substituent, and those listed as the aforementioned Substituent Group A can be used as the substituent as needed. Moreover, the substituents may also be linked to each other. If substituents of $Q^3$ and $Q^4$ are linked to each other, the platinum complex expressed by General Formula C-1 is a platinum complex of a cyclic tetradentate ligand.

The ligands represented by $Q^1$, $Q^2$, $Q^3$, and $Q^4$ are preferably an aromatic hydrocarbon ring ligand bound to platinum by a carbon atom, an aromatic heterocyclic ligand bound to platinum by a carbon atom, a nitrogen-containing aromatic heterocyclic ligand bound to platinum by a nitrogen atom, an acyloxy ligand, an alkoxy ligand, an aryloxy ligand, a heteroaryloxy ligand, or a silyloxy ligand, more preferably an aromatic hydrocarbon ring ligand bound to platinum by a carbon atom, an aromatic heterocyclic ligand bound to platinum by a carbon atom, a nitrogen-containing aromatic heterocyclic ligand bound to platinum by a nitrogen atom, an acyloxy ligand, or an aryloxy ligand, and even more preferably an aromatic hydrocarbon ring ligand bound to platinum by a carbon atom, an aromatic heterocyclic ligand bound to platinum by a carbon atom, a nitrogen-containing aromatic heterocyclic ligand bound to platinum by a nitrogen atom, or an acyloxy ligand.

$L^1$, $L^2$, and $L^3$ represent a single bond, a double bond, a divalent linking group, or a group that is a combination of these. Examples of the divalent linking group represented by $L^1$, $L^2$, and $L^3$ include alkylene groups (such as methylene, ethylene, and propylene), arylene groups (phenylene and naphthalenediyl), heteroarylene groups (such as pyridinediyl and thiophenediyl), imino groups (—NR—) (such as a phenylimino group), an oxy group (—O—), a thio group (—S—), phosphinidene groups (—PR—) (such as a phenylphosphinidene group), silylene groups (—SiRR'—) (such as a dimethylsilylene group and diphenylsilylene group), a carbonyl group, as well as combinations of these. These linking groups may further have a substituent. R and R' represent each independently a substituent. The substituents listed as the aforementioned Substituent Group A can be used as these substituents. If there are a plurality of [each of] these substituents, the substituents may bond to each other to form a ring.

From the standpoints of the stability of the complex and luminescent quantum yield, $L^2$ and $L^3$ are preferably a single bond, an alkylene group, an arylene group, a heteroarylene group, an imino group, an oxy group, a thio group, or a silylene group, more preferably a single bond, an alkylene group, an arylene group, or an imino group, even more preferably a single bond, an alkylene group, or an arylene group, still more preferably a single bond, a methylene group, or a phenylene group, yet still more preferably a single bond or a methylene group in which two hydrogen atoms are substituted, especially preferably a single bond or a dimethylmethylene group, and most preferably a single bond.

$L^1$ is preferably an alkylene group, an arylene group, a heteroarylene group, an imino group, an oxy group, a thio group, a silylene group, or a carbonyl group, more preferably an alkylene group, an arylene group, or an imino group, even more preferably an alkylene group or an imino group, especially preferably a methylene group or an imino group. These may have a substituent, and the substituents listed as the aforementioned Substituent Group A can be used as these substituents. If there are a plurality of [each of] these substituents, the substituents may bond to each other to form a ring.

$L^1$ is more preferably a single bond, a methylene group in which two hydrogen atoms are substituted, or an arylimino group that may be substituted, even more preferably a dimethylmethylene group, an ethylmethylmethylene group, a methylpropylmethylene group, an isobutylmethylmethylene group, a cyclohexanediyl group, a cyclopentanediyl group, a fluoromethylmethylene group, or a phenylimino group, and especially preferably a dimethylmethylene group or a phenylimino group. If possible, these groups may further be substituted with a group [from those] listed in the aforementioned Substituent Group A.

An example of preferred modes of the platinum complex expressed by General Formula C-1 is a platinum complex expressed by General Formula C-2 below:

[Third Chemical Formula]

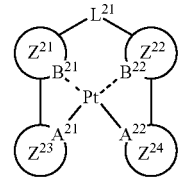

(C-2)

In the formula, $L^{21}$ represents a single bond or a divalent linking group. $A^{21}$, $A^{22}$, $B^{21}$, and $B^{22}$ represent each independently a carbon atom or a nitrogen atom. However, at least two of $A^{21}$, $A^{22}$, $B^{21}$, and B22 represent a nitrogen atom. $Z^{21}$, $Z^{22}$, $Z^{23}$, and $Z^{24}$ represent each independently a benzene ring or a nitrogen-containing aromatic heterocycle.

General Formula C-2 will now be described.

$L^{21}$ represents a single bond or a divalent linking group, and the preferred ranges are the same as those of $L^1$ in General Formula C-1 above.

$A^{21}$, $A^{22}$, $B^{21}$, and $B^{22}$ represent each independently a carbon atom or a nitrogen atom, but at least two of these represent a nitrogen atom. In addition, it is preferable if two or three of $A^{21}$, $A^{22}$, $B^{21}$, and $B^{22}$ represent a nitrogen atom, and it is more preferable if two of these represent a nitrogen atom. From the standpoint of the stability of the complex, it is preferable for $A^{21}$ and $A^{22}$ to represent a nitrogen atom or for $B^{21}$ and $B^{22}$ to represent a nitrogen atom.

$Z^{21}$, $Z^{22}$, $Z^{23}$, and $Z^{24}$ represent each independently a benzene ring or a nitrogen-containing aromatic heterocycle.

Examples of the nitrogen-containing aromatic heterocycle represented by $Z^{21}$, $Z^{22}$, $Z^{23}$, and $Z^{24}$ include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, and a thiadiazole ring.

From the standpoints of orientation and the stability as the material for an organoelectroluminescent element, the ring represented by $Z^{21}$ and $Z^{22}$ is preferably a benzene ring, a pyridine ring, a pyrazine ring, an imidazole ring, or a pyrazole ring, and more preferably a benzene ring, a pyridine ring, or a pyrazole ring.

From the standpoints of the stability of the complex, control of emission wavelength, and luminescent quantum yield, the ring represented by $Z^{23}$ and $Z^{24}$ is preferably a benzene ring, a pyridine ring, a pyrazine ring, an imidazole ring, or a pyrazole ring, more preferably a benzene ring, a pyridine ring, or a pyrazole ring, and even more preferably a benzene ring or a pyridine ring.

The aforementioned benzene ring and nitrogen-containing aromatic heterocycle represented by $Z^{21}$, $Z^{22}$, $Z^{23}$, and $Z^{24}$ may have a substituent, and [a group from] the aforementioned Substituent Group A can be used as a substituent on a carbon atom, while [a group from] the aforementioned Substituent Group B can be used as a substituent on a nitrogen atom.

The substituent on a carbon atom is preferably an alkyl group, a fluoroalkyl group, an aryl group, a heterocyclic group, a dialkylamino group, a diarylamino group, an alkoxy group, an aryloxy group, a silyl group, a cyano group, or a halogen atom, more preferably an alkyl group, a fluoroalkyl group, an aryl group, an aryloxy group, a heterocyclic group, a diarylamino group, an alkoxy group, a cyano group, or a halogen atom, and even more preferably an alkyl group, an alkoxy group, an aryl group, an aryloxy group, a fluorine atom, or a cyano group.

The aforementioned alkyl group represents a substituted or unsubstituted $C_1$ to $C_{20}$ alkyl group and may have a linear, branched, or cyclic structure. The aforementioned alkyl group is preferably with a carbon number of 1 to 12, examples of which include a methyl group, a butyl group, a pentyl group, a hexyl group, an octyl group, a decyl group, and a dodecyl group.

The aforementioned aryl group represents a substituted or unsubstituted $C_6$ to $C_{10}$ aryl group and may be condensed into a ring, examples of which include a phenyl group, a toluyl group, and a naphthyl group.

The aforementioned fluoroalkyl group is preferably a trifluoromethyl group.

The aforementioned alkoxy group represents a substituted or unsubstituted $C_1$ to $C_{20}$ alkoxy group and may have a linear, branched, or cyclic structure. The aforementioned alkoxy group is preferably with a carbon number of 1 to 12, examples of which include a methoxy group, a butyloxy group, an octyloxy group, a decyloxy group, a dodecyloxy group, an s-octyloxy group, and a benzyloxy group.

The aforementioned heterocyclic group represents a substituted or unsubstituted $C_6$ to $C_{10}$ nitrogen-containing aromatic heterocyclic group and may be condensed into a ring, examples of which include a pyridine ring, a pyrazine ring, a pyrimidine ring, a pyridazine ring, a triazine ring, and a carbazole ring, with a carbazole ring being preferable.

The aforementioned diarylamino group represents a substituted or unsubstituted $C_6$ to $C_{10}$ diarylamino group and may be condensed into a ring, examples of which include a diphenylamino group, a ditoluylamino group, and a dinaphthylamino group.

The aforementioned dialkylamino group represents a substituted or unsubstituted $C_2$ to $C_{20}$ dialkylamino group and may have a linear, branched, or cyclic structure. The aforementioned dialkylamino group is preferably with a carbon number of 2 to 12, concrete examples of which include a dimethylamino group, a diethylamino group, a dioctylamino group, a didecylamino group, a didodecylamino group, a di-t-butylamino group, a di-t-amylamino group, and a di-s-butylamino group.

The aforementioned aryloxy group represents a substituted or unsubstituted $C_6$ to $C_{10}$ aryloxy group and may be condensed into a ring, examples of which include a phenyloxy group, a toluyloxy group, and a naphthyloxy group.

The aforementioned silyl group represents a silyl group which has been substituted with a $C_3$ to $C_{24}$ carbon atom and may be a trialkylsilyl group, an aryldialkylsilyl group, an alkyldiarylsilyl group, or a triarylsilyl group. The aforementioned silyl group is preferably with a carbon number of 3 to 18, concrete examples of which include a trimethylsilyl group, a t-butyldimethylsilyl group, a triphenylsilyl group, and a t-butyldiphenylsilyl group.

The halogen atom is preferably a fluorine atom.

Of these, a linear alkyl group or the aforementioned substituent having a linear alkyl group as a substituent is preferable from the standpoint of aspect ratio.

Substituents are appropriately selected for the purpose of controlling the emission wavelength and electric potential, but if the wavelength is to be lengthened, [the substituent is] preferably an electron-donating group or an aromatic ring group; for example, an alkyl group, a dialkylamino group, an alkoxy group, an aryl group, an aromatic heterocyclic group, or the like is selected. Furthermore, if the wavelength is to be shortened, [the substituent is] preferably an electron-withdrawing group; for example, a fluorine atom, a cyano group, a trifluoroalkyl group, or the like is selected.

An alkyl group, an aryl group, or an aromatic heterocyclic group is preferable as a substituent on a nitrogen atom, and from the standpoint of the stability of the complex, an alkyl group or an aryl group is preferable.

The substituents on $Z^{21}$, $Z^{22}$, $Z^{23}$, and $Z^{24}$ may be linked to each other to form a condensed ring, and examples of the ring thus formed include a benzene ring, a pyridine ring, a pyrazine ring, a pyridazine ring, a pyrimidine ring, an imidazole ring, an oxazole ring, a thiazole ring, a pyrazole ring, a thiophene ring, and a furan ring. When the substituents belonging to $Z^{23}$ and $Z^{24}$ link to each other, the platinum complex expressed by General Formula C-2 is a platinum complex of cyclic tetradentate ligand.

One of the more preferred modes of the platinum complex expressed by General Formula C-2 is a platinum complex expressed by General Formula C-3 below:

[Fourth Chemical Formula]

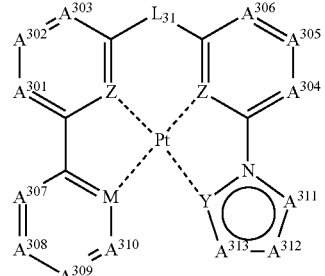

(C-3)

In the formula, $A^{301}$ to $A^{313}$ represent each independently C—R or a nitrogen atom. R represents a hydrogen atom or a substituent. $L^{31}$ represents a single bond or a divalent linking group. Y, Z, and M represent each independently a carbon atom or a nitrogen atom, and either Z or Y is a nitrogen atom.

General Formula C-3 will now be described.

$L^{31}$ is defined the same as $L^{21}$ in General Formula C-2, and the preferred ranges are also the same.

$A^{301}$ to $A^{306}$ represent each independently C—R or a nitrogen atom. R represents a hydrogen atom or a substituent. Substituents listed as the aforementioned Substituent Group A can be used as the substituent represented by R.

$A^{301}$ to $A^{306}$ are preferably C—R, and the R [groups] may be linked to each other to form a ring. If $A^{301}$ to $A^{306}$ are C—R, the R [groups] of $A^{302}$ and $A^{305}$ are preferably a hydrogen atom, an alkyl group, a trifluoroalkyl group, an aryl group, a heterocyclic group, a dialkylamino group, a diarylamino group, an alkoxy group, an aryloxy group, a silyl group, a cyano group, or a halogen atom, more preferably a hydrogen atom, an alkyl group, a trifluoroalkyl group, an aryl group, a heterocyclic group, a diarylamino group, an alkoxy group, a cyano group, or a halogen atom, even more preferably a hydrogen atom, an alkyl group, an alkoxy group, or a cyano group, and especially preferably a hydrogen atom. These alkyl group and aryl group may further have a substituent, and examples of this substituent include an alkyl group, an aryl group, a cyano group, an amino group, a halogen atom, and a fluoroalkyl group, and are preferably a $C_1$ to $C_6$ alkyl group, a cyano group, an amino group, a halogen atom, and a fluoroalkyl group (preferably a trifluoromethyl group), more preferably a $C_1$ to $C_6$ alkyl group and a halogen atom (preferably a fluorine atom). If $A^{302}$ and $A^{305}$ are C—R, the R [groups] of these $A^{302}$ and $A^{305}$ are preferably an aryl group from the standpoint of improving durability of the element, and from the standpoint of short emission wavelength, a hydrogen atom, an alkyl group, an amino group, an alkoxy group, a fluorine atom, or a cyano group is preferable.

The R [groups] of $A^{301}$, $A^{303}$, $A^{304}$, and $A^{306}$ are preferably a hydrogen atom, an alkyl group, an aryl group, an amino group, an alkoxy group, an aryloxy group, a fluorine atom, or a cyano group, more preferably a hydrogen atom, an amino group, an alkoxy group, an aryloxy group, or a fluorine atom, and especially preferably a hydrogen atom.

$A^{307}$, $A^{308}$, $A^{309}$, and $A^{310}$ represent each independently C—R or a nitrogen atom. R represents a hydrogen atom or a substituent. Substituents listed as the aforementioned Substituent Group A can be used as the substituent represented by R. If $A^{307}$, $A^{308}$, $A^{309}$, and $A^{310}$ are C—R, the R [groups] are preferably a hydrogen atom, an alkyl group, a trifluoroalkyl group, an aryl group, an aromatic heterocyclic group, a dialkylamino group, a diarylamino group, an alkyloxy group, a cyano group, or a halogen atom, more preferably a hydrogen atom, an alkyl group, a trifluoroalkyl group, an aryl group, a dialkylamino group, a cyano group, or a fluorine atom, and even more preferably a hydrogen atom, an alkyl group, a trifluoromethyl group, or a fluorine atom. Moreover, if possible, the substituents may be linked to each other to form a condensed ring structure. When the emission wavelength is shifted to the short wavelength side, it is preferable for $A^{308}$ to be a nitrogen atom.

Examples of the six-membered ring formed from $A^{307}$, $A^{308}$, $A^{309}$, and $A^{310}$ and two carbon atoms in General Formula C-3 include a benzene ring, a pyridine ring, a pyrazine ring, a pyrimidine ring, a pyridazine ring, and a triazine ring, with a benzene ring, a pyridine ring, a pyrazine ring, a pyrimidine ring, and a pyridazine ring being more preferable, and a benzene ring and a pyridine ring being especially favorable. In terms of being easier to form a metal complex, it is advantageous for the aforementioned six-membered ring to be a pyridine ring, a pyrazine ring, a pyrimidine ring, or a pyridazine ring (with a pyridine ring being especially favorable) because the acidity of the hydrogen atoms present at the locations where the metal-carbon bonds are formed will be higher than with a benzene ring.

$A^{311}$, $A^{312}$, and $A^{313}$ represent each independently C—R or a nitrogen atom. R represents a hydrogen atom or a substituent. Substituents listed as the aforementioned Substituent Group A can be used as the substituent represented by R. If $A^{311}$, $A^{312}$, and $A^{313}$ are C—R, the R [groups] are preferably a hydrogen atom, an alkyl group, a trifluoroalkyl group, an aryl group, a heterocyclic group, a dialkylamino group, a diarylamino group, an alkoxy group, an aryloxy group, a cyano group, or a halogen atom, more preferably a hydrogen atom, an alkyl group, a trifluoroalkyl group, an aryl group, a dialkylamino group, a cyano group, or a fluorine atom, and even more preferably a hydrogen atom, an alkyl group, a trifluoromethyl group, or a fluorine atom. In addition, if possible, the substituents may be linked to each other to form a condensed ring structure.

It is preferable for at least one of $A^{311}$, $A^{312}$, and $A^{313}$ to be a nitrogen atom, and it is especially preferable for $A^{311}$ to be a nitrogen atom.

One of the more preferred modes of the platinum complex expressed by General Formula C-3 is a platinum complex expressed by General Formula C-3-1 below:

[Fifth Chemical Formula]

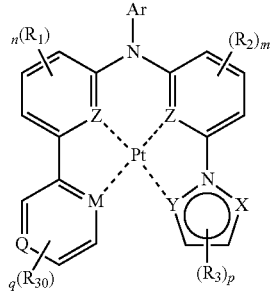

(C-3-1)

In the formula, X, Y, Z, and M represent each independently a carbon atom or a nitrogen atom. However, either Z or Y is a nitrogen atom. When Y is a nitrogen atom, X is a carbon atom. m, n, p, and q represent each independently an integer from 0 to 3. Ar represents a substituted or unsubstituted aryl group. $R_1$ to $R_3$ and $R_{30}$ represent each independently an alkyl group, an aryl group, an alkoxy group, an aryloxy group, a fluorine atom, a cyano group, a silyl group, or a heterocyclic group. If m, n, p, and q are 2 or greater, respectively adjacent ones of the plurality of $R_1$, $R_2$, $R_3$, and $R_{30}$ [groups] may be linked to each other to form a cyclic structure. Q is a carbon atom or a nitrogen atom.

General Formula C-3-1 will now be described.

X, Y, and Z represent a carbon atom or a nitrogen atom, either Z or Y is a nitrogen atom, and when Y is a nitrogen atom, X is a carbon atom. It is preferable for Z to be a carbon atom, for Y to be a nitrogen atom, and for X to be a carbon atom.

m, n, and p represent each independently an integer from 0 to 3. Of these, m is preferably from 0 to 2 and more preferably 0 or 1. n is preferably from 0 to 2 and more preferably 0 or 1. p is preferably from 0 to 2 and more preferably 0 or 1.

$R_1$ to $R_3$ represent each independently an alkyl group, an aryl group, an alkoxy group, an aryloxy group, a fluorine atom, a cyano group, a silyl group, or a heterocyclic group.

The aforementioned alkyl group represents a substituted or unsubstituted $C_1$ to $C_{20}$ alkyl group and may have a linear, branched, or cyclic structure. The aforementioned alkyl group is preferably with a carbon number of 1 to 12, concrete examples of which include a methyl group, a butyl group, a pentyl group, a hexyl group, an octyl group, a decyl group, and a dodecyl group.

The aforementioned aryl group represents a substituted or unsubstituted $C_6$ to $C_{10}$ aryl group and may be condensed into a ring, examples of which include a phenyl group, a toluyl group, and a naphthyl group.

The aforementioned alkoxy group represents a substituted or unsubstituted $C_1$ to $C_{20}$ alkoxy group and may have a linear, branched, or cyclic structure. The aforementioned alkoxy group is preferably with a carbon number of 1 to 12, concrete examples of which include a methoxy group, an octyloxy group, a decyloxy group, a dodecyloxy group, an s-octyloxy group, and a benzyloxy group.

The aforementioned aryloxy group represents a substituted or unsubstituted $C_6$ to $C_{10}$ aryloxy group and may be condensed into a ring, examples of which include a phenyloxy group, a toluyloxy group, and a naphthyloxy group.

The aforementioned silyl group represents a silyl group which has been substituted with a $C_3$ to $C_{24}$ hydrocarbon group and may be a trialkylsilyl group, an aryldialkylsilyl group, an alkyldiarylsilyl group, or a triarylsilyl group. The aforementioned silyl group is preferably with a carbon number of 3 to 18, concrete examples of which include a trimethylsilyl group, a t-butyldimethylsilyl group, a triphenylsilyl group, and a t-butyldiphenylsilyl group.

Examples of the aforementioned heterocyclic group include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, and a thiadiazole ring, a thiophen ring, and a furan ring.

Of these, from the standpoint of aspect ratio, a linear alkyl group or, in the case of a group other than an alkyl group, having an alkyl group as a substituent is preferable.

Furthermore, $R_1$ and $R_2$ are preferably an alkyl group, an aryl group, a fluorine atom, a cyano group, or a silyl group, more preferably an alkyl group or an aryl group, and [even more] preferably a phenyl group.

$R_3$ is preferably an alkyl group or an aryl group, more preferably a methyl group, a trifluoromethyl group, or a phenyl group, and even more preferably a methyl group or a trifluoromethyl group.

Examples of the aryl group represented by Ar include a phenyl group and a naphthyl group, with a phenyl group being preferable. The aryl group represented by Ar may further have a substituent, and examples of this substituent include an alkyl group, an aryl group, a cyano group, an amino group, a fluorine atom, and a fluoroalkyl group, with a $C_1$ to $C_6$ alkyl group, a cyano group, an amino group, a fluorine atom, or a fluoroalkyl group (preferably a trifluoromethyl group) being preferable, and a $C_1$ to $C_6$ alkyl group or a fluorine atom being more preferable. Ar is more preferably a phenyl group having a substituent, and this substituent is preferably a methyl group, a t-butyl group, a 4-pentyl-cyclohexyl group, a 4-pentyl-cyclohexylmethoxy group, or the like.

If m, n, and p are 2 or greater, respectively adjacent ones of the plurality of $R_1$ to $R_3$ [groups] may be linked to each other to form a cyclic structure.

M and Q are each independently a carbon atom or a nitrogen atom.

q represents an integer from 0 to 3 and is preferably an integer from 0 to 2.

$R_{30}$ represents an alkyl group, an aryl group, an alkoxy group, an aryloxy group, a fluorine atom, a cyano group, a silyl group, or a heterocyclic group.

The aforementioned alkyl group represents a substituted or unsubstituted $C_1$ to $C_{20}$ alkyl group and may have a linear, branched, or cyclic structure. The aforementioned alkyl group is preferably with a carbon number of 1 to 12, concrete examples of which include a methyl group, an octyl group, a decyl group, a dodecyl group, an n-butyl group, a t-butyl group, a t-amyl group, and an s-butyl group.

The aforementioned aryl group represents a substituted or unsubstituted $C_6$ to $C_{10}$ aryl group and may be condensed into a ring, examples of which include a phenyl group, a toluyl group, and a naphthyl group.

The aforementioned alkoxy group represents a substituted or unsubstituted $C_1$ to $C_{20}$ alkoxy group and may have a linear, branched, or cyclic structure. The aforementioned alkoxy group is preferably with a carbon number of 1 to 12, concrete examples of which include a methoxy group, an octyloxy group, a decyloxy group, a dodecyloxy group, an s-octyloxy group, and a benzyloxy group.

The aforementioned aryloxy group represents a substituted or unsubstituted $C_6$ to $C_{10}$ aryloxy group and may be condensed into a ring, concrete examples of which include a phenyloxy group, a toluyloxy group, and a naphthyloxy group.

The aforementioned silyl group represents a silyl group which has been substituted with a $C_3$ to $C_{24}$ carbon atom and may be a trialkylsilyl group, an aryldialkylsilyl group, an alkyldiarylsilyl group, or a triarylsilyl group. The aforementioned silyl group is preferably with a carbon number of 3 to 18, concrete examples of which include a trimethylsilyl group, a t-butyldimethylsilyl group, a triphenylsilyl group, and a t-butyldiphenylsilyl group.

Examples of the aforementioned heterocyclic group include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophen ring, and a furan ring.

$R_{30}$ is preferably a fluorine atom.

From the standpoint of aspect ratio, $R_{30}$ is preferably a chain-form alkyl group or, in the case of a group other than an alkyl group, having an alkyl group as a substituent is preferable.

One of the more preferred modes of the platinum complex expressed by General Formula C-2 is a platinum complex expressed by General Formula C-4 below:

[Sixth Chemical Formula]

General Formula C-4

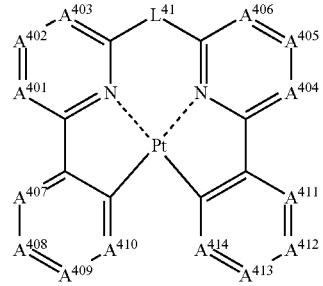

In the formula, $A^{401}$ to $A^{414}$ represent each independently C—R or a nitrogen atom. R represents a hydrogen atom or a substituent. $L^{41}$ represents a single bond or a divalent linking group.

General Formula C-4 will now be described.

$A^{401}$ to $A^{414}$ represent each independently C—R or a nitrogen atom. R represents a hydrogen atom or a substituent.

Substituents listed as the aforementioned Substituent Group A can be used as the substituent expressed by R.

$A^{401}$ to $A^{406}$ are preferably C—R, and the R [groups] may be linked to each other to form a ring. If $A^{401}$ to $A^{406}$ are C—R, the R [groups] of $A^{402}$ and $A^{405}$ are preferably a hydrogen atom, an alkyl group, an aryl group, an amino group, an alkoxy group, an aryloxy group, a fluorine atom, or a cyano group, more preferably a hydrogen atom, an alkyl group, an amino group, an alkoxy group, an aryloxy group, or a fluorine atom, and especially preferably a hydrogen atom or an alkyl group. The R [groups] of $A^{401}$, $A^{403}$, $A^{404}$, and $A^{406}$ are preferably a hydrogen atom, an alkyl group, an aryl group, an amino group, an alkoxy group, an aryloxy group, a fluorine atom, or a cyano group, more preferably a hydrogen atom, an amino group, an alkoxy group, an aryloxy group, or a fluorine atom, and especially preferably a hydrogen atom.

$L^{41}$ is defined the same as $L^{21}$ in General Formula C-2 above, and the preferred ranges are also the same.

For $A^{407}$ to $A^{414}$, the number of nitrogen atoms in $A^{407}$ to $A^{410}$ and in $A^{411}$ to $A^{414}$ is each preferably 0 to 2 and more preferably 0 or 1.

If $A^{407}$ to $A^{414}$ represent C—R, the R [groups] of $A^{408}$ and $A^{412}$ are preferably a hydrogen atom, an alkyl group, a trifluoroalkyl group, an aryl group, an amino group, an alkoxy group, an aryloxy group, a fluorine atom, or a cyano group, more preferably a hydrogen atom, a trifluoroalkyl group, an alkyl group, an aryl group, a fluorine atom, or a cyano group, and especially preferably a hydrogen atom, a phenyl group, a trifluoroalkyl group, or a cyano group. The R[groups] of $A^{407}$, $A^{409}$, $A^{411}$, and $A^{413}$ are preferably a hydrogen atom, an alkyl group, a trifluoroalkyl group, an aryl group, an amino group, an alkoxy group, an aryloxy group, a fluorine atom, or a cyano group, more preferably a hydrogen atom, a trifluoroalkyl group, a fluorine atom, or a cyano group, and especially preferably a hydrogen atom, a phenyl group, or a fluorine atom. The R [groups] of $A^{410}$ and $A^{414}$ are preferably a hydrogen atom or a fluorine atom and more preferably a hydrogen atom. If any of $A^{407}$ to $A^{409}$ and $A^{411}$ to $A^{413}$ represents C—R, the R [groups] may be linked to each other to form a ring, and examples of the ring thus formed include a benzene ring and a pyridine ring.

One of the more preferred modes of the platinum complex expressed by General Formula C-2 is a platinum complex expressed by General Formula C-5 below:

[Seventh Chemical Formula]

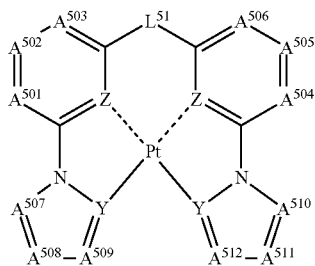

(C-5)

In the formula, $A^{501}$ to $A^{512}$ represent each independently C—R or a nitrogen atom. R represents a hydrogen atom or a substituent. $L^{51}$ represents a single bond or a divalent linking group. Y and Z represent each independently a carbon atom or a nitrogen atom, and at least either one is a nitrogen atom.

General Formula C-5 will now be described. $A^{501}$ to $A^{506}$ and $L^{51}$ are defined the same as $A^{401}$ to $A^{406}$ and $L^{41}$ in General Formula C-4 above, and the preferred ranges are also the same.

$A^{507}$, $A^{508}$, $A^{509}$, $A^{510}$, $A^{511}$ and $A^{512}$ represent each independently C—R or a nitrogen atom. R represents a hydrogen atom or a substituent. Substituents listed as the aforementioned Substituent Group A can be used as the substituent represented by R. If $A^{507}$, $A^{508}$, $A^{509}$, $A^{510}$, $A^{511}$ and $A^{512}$ are C—R, R is preferably a hydrogen atom, an alkyl group, a trifluoroalkyl group, an aryl group, an aromatic heterocyclic group, a dialkylamino group, a diarylamino group, an alkyloxy group, a cyano group, or a halogen atom, more preferably a hydrogen atom, an alkyl group, a trifluoroalkyl group, an aryl group, a dialkylamino group, a cyano group, or a fluorine atom, and even more preferably a hydrogen atom, an alkyl group, a trifluoromethyl group, or a fluorine atom. Moreover, if possible, the substituents may be linked to each other to form a condensed ring structure.

A mode is also preferable in which at least one of $A^{507}$, $A^{508}$, and $A^{509}$ and at least one of $A^{510}$, $A^{511}$, and $A^{512}$ are nitrogen atoms, and in the case of this mode, it is preferable for $A^{510}$ or $A^{507}$ to be a nitrogen atom.

One of the more preferred modes of the platinum complex expressed by General Formula C-5 is a platinum complex expressed by General Formula C-5-1 below:

[Eighth Chemical Formula]

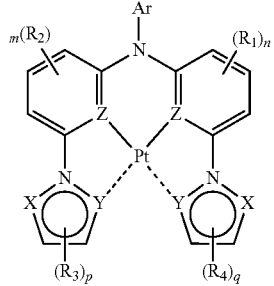

(C-5-1)

In the formula, X, Y, and Z represent each independently a carbon atom or a nitrogen atom. However, either Z or Y is a nitrogen atom. When Y is a nitrogen atom, X is a carbon atom. m, n, p, and q represent each independently an integer from 0 to 3. Ar represents a substituted or unsubstituted aryl group. $R_1$ to $R_4$ represent each independently an alkyl group, an aryl group, an alkoxy group, an aryloxy group, a fluorine atom, a cyano group, a silyl group, or a heterocyclic group. If m, n, p, and q are 2 or greater, respectively adjacent ones of the plurality of $R_1$ to $R_4$ [groups] may be linked to each other to form a cyclic structure.

General Formula C-5-1 will now be described.

X, Y, and Z represent a carbon atom or a nitrogen atom, either Z or Y is a nitrogen atom, and when Y is a nitrogen atom, X is a carbon atom. It is preferable for Z to be a carbon atom, for Y to be a nitrogen atom, and for X to be a carbon atom.

m, n, p, and q represent each independently an integer from 0 to 3. Of these, m is preferably from 0 to 2 and more preferably 0 or 1. n is preferably from 0 to 2 and more preferably 0 or 1. p is preferably from 0 to 2 and more preferably 0 or 1. q is preferably from 0 to 2 and more preferably 0 or 1.

$R_1$ to $R_4$ represent each independently an alkyl group, an aryl group, an alkoxy group, an aryloxy group, a fluorine atom, a cyano group, a silyl group, or a heterocyclic group.

The aforementioned alkyl group represents a substituted or unsubstituted $C_1$ to $C_{20}$ alkyl group and may have a linear, branched, or cyclic structure. The aforementioned alkyl group is preferably with a carbon number of 1 to 12, concrete examples of which include a methyl group, a butyl group, a pentyl group, a hexyl group, an octyl group, a decyl group, and a dodecyl group.

The aforementioned aryl group represents a substituted or unsubstituted $C_6$ to $C_{10}$ aryl group and may be condensed into a ring, examples of which include a phenyl group, a toluyl group, and a naphthyl group.

The aforementioned alkoxy group represents a substituted or unsubstituted $C_1$ to $C_{20}$ alkoxy group and may have a linear, branched, or cyclic structure. The aforementioned alkoxy group is preferably with a carbon number of 1 to 12, concrete examples of which include a methoxy group, an octyloxy group, a decyloxy group, a dodecyloxy group, an s-octyloxy group, and a benzyloxy group.

The aforementioned aryloxy group represents a substituted or unsubstituted $C_6$ to $C_{10}$ aryloxy group and may be condensed into a ring, examples of which include a phenyloxy group, a toluyloxy group, and a naphthyloxy group.

The aforementioned silyl group represents a silyl group which has been substituted with a $C_3$ to $C_{24}$ hydrocarbon group and may be a trialkylsilyl group, an aryldialkylsilyl group, an alkyldiarylsilyl group, or a triarylsilyl group. The aforementioned silyl group is preferably with a carbon number of 3 to 18, concrete examples of which include a trimethylsilyl group, a t-butyldimethylsilyl group, a triphenylsilyl group, and a t-butyldiphenylsilyl group.

Examples of the aforementioned heterocyclic group include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophen ring, and a furan ring.

Of these, from the standpoint of aspect ratio, a linear alkyl group or, in the case of a group other than an alkyl group, having an alkyl group as a substituent is preferable.

In addition, $R_1$ and $R_2$ are [each] preferably an alkyl group, an aryl group, a fluorine atom, a cyano group, or a silyl group, and more preferably an alkyl group or an aryl group.

Furthermore, $R_3$ and $R_4$ are [each] preferably an alkyl group or an aryl group, more preferably a methyl group, a trifluoromethyl group, or a phenyl group, and even more preferably a methyl group or a trifluoromethyl group.

Examples of the aryl group represented by Ar include a phenyl group and a naphthyl group, with a phenyl group being preferable. The aryl group represented by Ar may further have a substituent, and examples of this substituent include an alkyl group, an aryl group, a cyano group, an amino group, a fluorine atom, and a fluoroalkyl group, with a $C_1$ to $C_6$ alkyl group, a cyano group, an amino group, a fluorine atom, or a fluoroalkyl group (preferably a trifluoromethyl group) being preferable, and a $C_1$ to $C_6$ alkyl group or a fluorine atom being more preferable. Ar is preferably a phenyl group having a substituent, and this substituent is preferably a methyl group, a t-butyl group, or a 4-methylcyclohexyl group.

If m, n, p, and q are 2 or greater, respectively adjacent ones of the plurality of $R_1$ to $R_4$ [groups] may be linked to each other to form a cyclic structure.

One of the more preferred modes of the platinum complex expressed by General Formula C-2 is a platinum complex expressed by General Formula C-6 below:

[Ninth Chemical Formula]

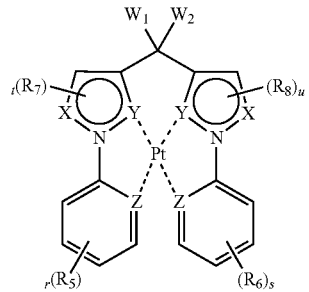

(C-6)

In the formula, X, Y, and Z represent each independently a carbon atom or a nitrogen atom. However, either Z or Y is a nitrogen atom. When Y is a nitrogen atom, X is a carbon atom. r, s, t, and u represent each independently an integer from 0 to 3. $R_5$ to $R_8$ represent each independently an alkyl group, an aryl group, an alkoxy group, an aryloxy group, a fluorine atom, a cyano group, a silyl group, or a heterocyclic group. If r, s, t, and u are 2 or greater, respectively adjacent ones of the plurality of $R_5$ to $R_8$ [groups] may be linked to each other to form a cyclic structure. $W_1$ and $W_2$ represent each independently an alkyl group and may bond to each other to form a cyclic structure.

General Formula C-6 will now be described.

X, Y, and Z are defined the same as X, Y, and Z in General Formula C-5-1, and the preferred ranges are also the same.

$R_5$ to $R_8$ are defined the same as $R_1$ to $R_4$ in General Formula C-5-1.

$R_5$ and $R_6$ are preferably an alkyl group, an alkoxy group, an aryl group, a fluorine atom, or a cyano group.

The alkyl group represented by $R_5$ and $R_6$ may have a substituent and is preferably a methyl group, a butyl group, an octyl group, a decyl group, a dodecyl group, or the like.

The alkoxy group represented by $R_5$ and $R_6$ is preferably a decyloxy group.

The aryl group represented by $R_5$ and $R_6$ is preferably a phenyl group that may have a substituent, and this substituent is preferably an alkyl group and more preferably a propyl group or a butyl group.

$R_7$ and $R_8$ are preferably an alkyl group or an aryl group.

r, s, t, and u represent each independently an integer from 0 to 3. Of these, r is preferably from 0 to 2 and more preferably 0 or 1. s is preferably from 0 to 2 and more preferably 0 or 1. t is preferably 0 or 1, and u is preferably 0 or 1.

If r, s, t, and u are 2 or greater, respectively adjacent ones of the plurality of $R_5$ to $R_8$ [groups] may be linked to each other to form a cyclic structure. Examples of this cyclic structure include structures in which a benzene ring, a benzofuran ring, a six-membered ring having Z, a fluorene ring, or the like is formed.

$W_1$ and $W_2$ represent a $C_1$ to $C_{10}$ alkyl group and may bond to each other to form a cyclic structure.

Examples of the alkyl group represented by $W_1$ and $W_2$ include a methyl group, an ethyl group, an n-propyl group, an n-butyl group, and a pentyl group, with a methyl group being preferable.

Moreover, an example of the cyclic structure formed by the bonding of $W_1$ and $W_2$ is a cyclohexyl ring structure.

From the standpoint of high aspect ratio, it is preferable if $W_1$ and $W_2$ are a methyl group or bond to each other to form a cyclohexyl ring structure.

Another one of the more preferred modes of the platinum complex expressed by General Formula C-1 is a platinum complex expressed by General Formula C-7 below:

[Tenth Chemical Formula]

(C-7)

In the formula, $L^{61}$ represents a single bond or a divalent linking group. $A^{61}$ represents a carbon atom or a nitrogen atom. $Z^{61}$ and $Z^{62}$ represent each independently a nitrogen-containing aromatic heterocycle. $Z^{63}$ represents a benzene ring or an aromatic heterocycle. Q is an anionic acyclic ligand bound to platinum.

General Formula C-7 will now be described.

$L^{61}$ represents a single bond or a divalent linking group, and the preferred ranges are the same as those of $L^1$ in General Formula C-1 above.

$A^{61}$ represents a carbon atom or a nitrogen atom. From the standpoint of the stability of the complex and the standpoint of luminescent quantum yield of the complex, $A^{61}$ is preferably a carbon atom.

$Z^{61}$ and $Z^{62}$ are respectively defined the same as $Z^{21}$ and $Z^{22}$ in General Formula C-2 above, and the preferred ranges are also the same. $Z^{63}$ is defined the same as $Z^{23}$ in General Formula C-2 above, and the preferred ranges are also the same.

Q is an anionic acyclic ligand bound to platinum. An acyclic ligand is one in which the atom bound to platinum does not form a ring in a ligand state. The atom in Q that is bound to platinum is preferably a carbon atom, a nitrogen atom, an oxygen atom, or a sulfur atom, more preferably a nitrogen atom or an oxygen atom, and most preferably an oxygen atom.

A vinyl ligand is an example of Q that is bound to platinum by a carbon atom. Examples of Q bound to platinum by a nitrogen atom include an amino ligand and an imino ligand. Examples of Q bound to platinum by an oxygen atom include an alkoxy ligand, an aryloxy ligand, a heteroaryloxy ligand, an acyloxy ligand, a silyloxy ligand, a carboxyl ligand, a phosphate ligand, and a sulfonate ligand. Examples of Q bound to platinum by a sulfur atom include an alkylmercapto ligand, an arylmercapto ligand, a heteroarylmercapto ligand, and a thiocarboxylate ligand.

The ligand represented by Q may have a substituent. Those listed as the aforementioned Substituent Group A can be used as the substituent as needed. In addition, the substituents may also be linked to each other.

The ligand represented by Q is preferably a ligand bound to platinum by an oxygen atom, more preferably an acyloxy ligand, an alkoxy ligand, an aryloxy ligand, a heteroaryloxy ligand, or a silyloxy ligand, and even more preferably an acyloxy ligand.

One of the more preferred modes of the platinum complex expressed by General Formula C-7 is a platinum complex expressed by General Formula C-8 below:

[Eleventh Chemical Formula]

(C-8)

In the formula, $A^{701}$ to $A^{710}$ represent each independently C—R or a nitrogen atom. R represents a hydrogen atom or a substituent. $L^{71}$ represents a single bond or a divalent linking group. Q is an anionic acyclic ligand bound to platinum.

General Formula C-8 will now be described.

$L^{71}$ is defined the same as $L^{61}$ in General Formula C-6 [sic][7] above, and the preferred ranges are also the same. $A^{701}$ to $A^{710}$ are defined the same as $A^{401}$ to $A^{410}$ in General Formula C-4, and the preferred ranges are also the same. Y [sic][8] is defined the same as that in General Formula C-6, and the preferred ranges are also the same.

[7] Translator's note: apparent error in the original; "General Formula C-6" should be "General Formula C-7."

[8] Translator's note: there is no "Y" in this chemical formula.

Another preferred mode of the platinum complex expressed by General Formula C-1 is a platinum complex expressed by General Formula C-9 below:

[Twelfth Chemical Formula]

(C-9)

In the formula, A and B represent a cyclic structure; A represents an aromatic ring, while B represents an aromatic heterocycle. When either A or B forms a ring, the other may not form a ring. $R_{13}$ to $R_{16}$ represent each independently a hydrogen atom, an alkyl group, an aryl group, a silyl group, or a heterocyclic group, and [each pair of] $R_{14}$ and $R_{15}$, and $R_{13}$ and $R_{16}$ may bond to each other to form a cyclic structure.

General Formula C-9 will now be described.

A represents an aromatic ring. Examples of the aromatic ring include an aromatic hydrocarbon ring and an aromatic heterocycle, with an aromatic hydrocarbon ring being preferable. The aromatic hydrocarbon ring represented by A is preferably a benzene ring or a naphthalene ring. The aromatic heterocycle represented by A is preferably a pyridine ring, a pyrazine ring, a pyrimidine ring, or a quinoline ring.

B represents an aromatic heterocycle. The aromatic heterocycle represented by B is preferably a pyridine ring or a pyrimidine ring.

The combination of A and B is preferably A being a benzene ring and B being acyclic (not forming a ring), or A being a naphthalene ring and B being acyclic, and more preferably A being a benzene ring and B being a pyridine ring, or A being acyclic and B being a pyridine ring.

$R_{13}$ to $R_{16}$ represent [each independently] a hydrogen atom, an alkyl group, an aryl group, a silyl group, or a heterocyclic group, and [each pair of] $R_{14}$ and $R_{15}$, and $R_{13}$ and $R_{16}$ may bond to each other to form a cyclic structure.

The aforementioned alkyl group represents a substituted or unsubstituted $C_1$ to $C_{20}$ alkyl group and may have a linear, branched, or cyclic structure. The aforementioned alkyl group is preferably with a carbon number of 1 to 12, and examples include a methyl group, a butyl group, a pentyl group, a hexyl group, an octyl group, a decyl group, and a dodecyl group.

The aforementioned aryl group represents a substituted or unsubstituted $C_6$ to $C_{10}$ aryl group and may be condensed into a ring, examples of which include a phenyl group, a tolyl group, and a naphthyl group.

The aforementioned silyl group represents a silyl group which has been substituted with a $C_3$ to $C_{24}$ carbon atom and may be a trialkylsilyl group, an aryldialkylsilyl group, an alkyldiarylsilyl group, or a triarylsilyl group. The aforementioned silyl group is preferably with a carbon number of 3 to 18, with examples including a trimethylsilyl group, a t-butyldimethylsilyl group, a triphenylsilyl group, and a t-butyldiphenylsilyl group.

Examples of the aforementioned heterocyclic group include a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophene ring, and a furan ring.

With regard to $R_{13}$, $R_{14}$, $R_{15}$, and $R_{16}$, it is preferable for [each of these] to be a substituted or unsubstituted aryl group or for each [pair of] $R_{13}$ and $R_{16}$, and $R_{14}$ and $R_{15}$ to be bonded to form an aromatic ring. An example of this aromatic ring is a benzene ring. This aromatic ring may further have a substituent, examples of which include an alkyl group (methyl group, butyl group, pentyl group, hexyl group, octyl group, and decyl group) and an alkoxy group (methoxy group, ethoxy group, butoxy group, etc.).

Of these, from the standpoints of molecular size and aspect ratio, an aromatic ring in which $R_{13}$ and $R_{16}$, and $R_{14}$ and $R_{15}$ are respectively bonded is preferable.

An example of a more preferred mode of the compound expressed by General Formula C-9 is a compound of General Formula C-9-1 below.

[Thirteenth Chemical Formula]

(C-9-1)

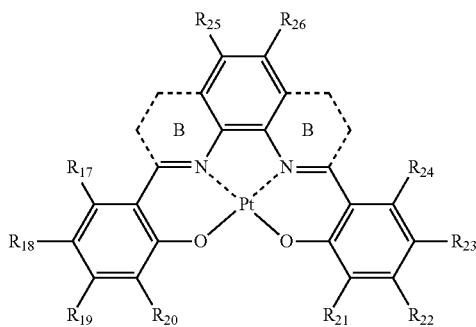

In the formula, B may form an aromatic 6-membered heterocycle.

$R_{17}$ to $R_{26}$ represent each independently an alkyl group, an aryl group, an alkoxy group, an aryloxy group, a fluorine atom, a cyano group, a silyl group, or a heterocyclic group, and [each pair of] $R_{17}$ and $R_{18}$, $R_{18}$ and $R_{19}$, $R_{19}$ and $R_{20}$, $R_{21}$ and $R_{22}$, $R_{22}$ and $R_{23}$, $R_{23}$ and $R_{24}$, and $R_{25}$ and $R_{26}$ may bond to each other to form a cyclic structure. Preferred examples of the alkyl groups, aryl groups, alkoxy groups, aryloxy groups, cyano groups, silyl groups, or heterocyclic groups represented by $R_{17}$ to $R_{26}$ are the same as the examples of the respective groups expressed by $R_{13}$ to $R_{26}$.

$R_{17}$, $R_{20}$, $R_{21}$, and $R_{24}$ are preferably a hydrogen atom or an alkyl group.

$R_{18}$, $R_{19}$, $R_{22}$, and $R_{23}$ are [each] preferably an alkyl group, an alkoxy group, an aryl group, an aryloxy group, a fluorine atom, a cyano group, or a silyl group, more preferably an alkyl group or an alkoxy group, and even more preferably a decyloxy group or a dodecyloxy group.

$R_{25}$ and $R_{26}$ are preferably a hydrogen atom, an alkyl group, a fluorine atom, or an aromatic ring in which $R_{25}$ and $R_{26}$ are bonded.

The aromatic six-membered heterocycle represented by B is preferably a pyridine ring or a pyrimidine ring, with a pyridine ring being more preferable. This ring may have a substituent, and examples of the substituent include an alkyl group (methyl group or butyl group) and an aryl group (phenyl group).

If $R_{17}$ to $R_{26}$ are chain-form alkyl groups or groups other than an alkyl group, they preferably have an alkyl group as a substituent from the standpoint of aspect ratio.

The platinum complex expressed by General Formula C-1 is preferably a platinum complex expressed by any of General Formula C-2, C-7, or C-9 and more preferably a platinum complex expressed by General Formula C-2 or C-9. The platinum complex expressed by General Formula C-2 is preferably a platinum complex expressed by any of General Formula C-3, C-4, C-5, or C-6, more preferably a platinum complex expressed by any of General Formula C-3-1, C-5-1, or C-6, and especially preferably a platinum complex expressed by General Formula C-5-1 or C-6.

Concrete examples of the platinum complex expressed by General Formula C-1 include the compounds described in [0143] to [0152], [0157], [0158], and [0162] to [0168] in Japanese Laid-Open Patent Application 2005-310733, the compounds described in [0065] to [0083] in Japanese Laid-Open Patent Application 2006-256999, the compounds described in [0065] to [0090] in Japanese Laid-Open Patent Application 2006-93542, the compounds described in [0063] to [0071] in Japanese Laid-Open Patent Application 2007-73891, the compounds described in [0079] to [0083] in Japanese Laid-Open Patent Application 2007-324309, the compounds described in [0065] to [0090] in Japanese Laid-Open Patent Application 2006-93542, the compounds described in [0055] to [0071] in Japanese Laid-Open Patent Application 2007-96255, and the compounds described in [0043] to [0046] in Japanese Laid-Open Patent Application 2006-313796.

Examples of the platinum complex expressed by General Formula C-1 and other platinum complexes having an aspect ratio that is greater than 3 will be shown below. Note that the alkyl group and the alkyl group [sic] in the compounds shown as examples include linear alkyl groups, branched alkyl groups, and cycloalkyl groups, with a linear alkyl group being preferable.

[Fourteenth Chemical Formula]
1
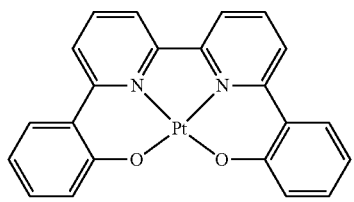
2
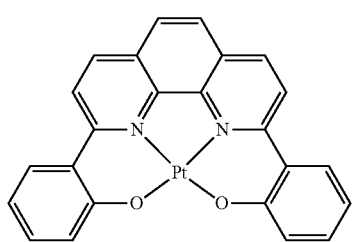
3
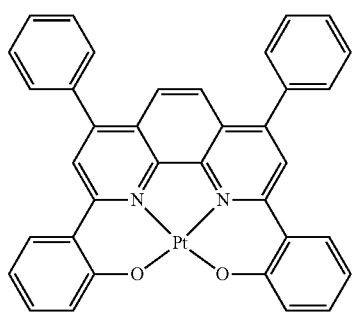
4
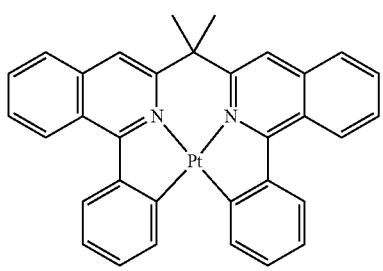
5
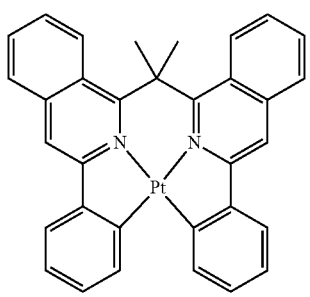
6
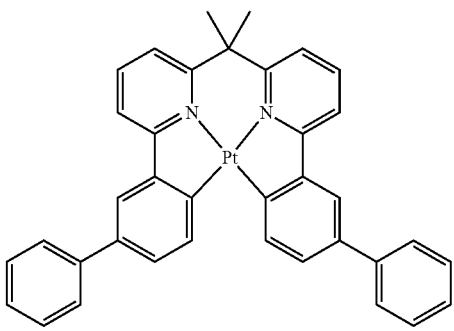
7
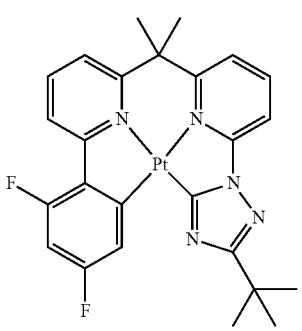
8
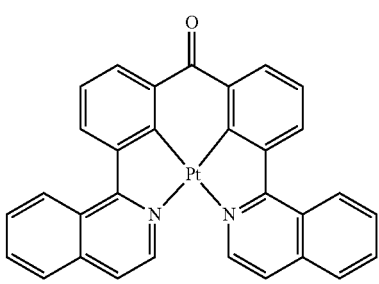
9
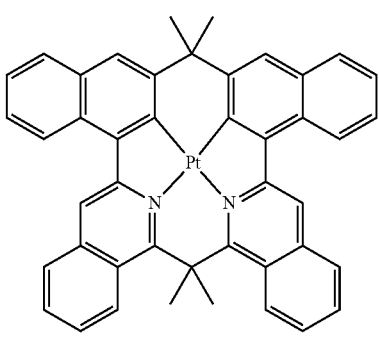
10
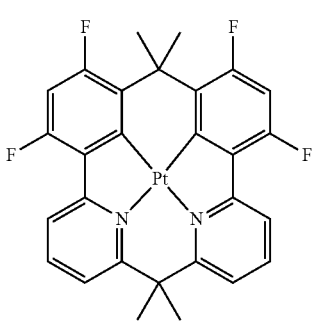

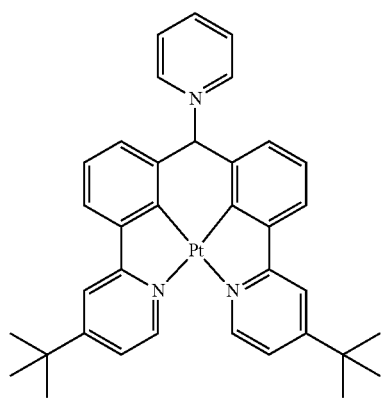
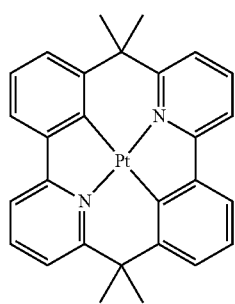
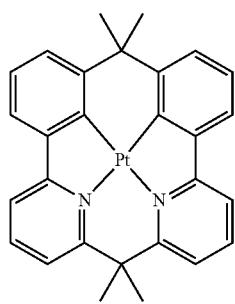
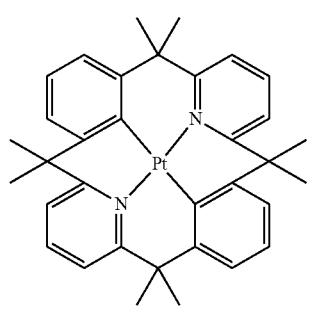
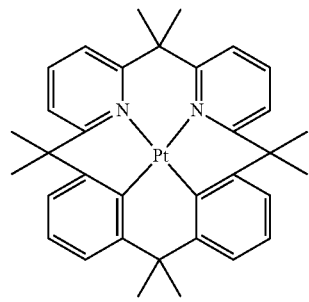
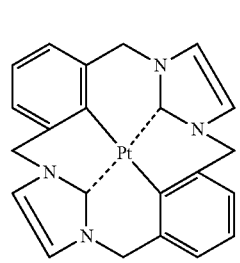
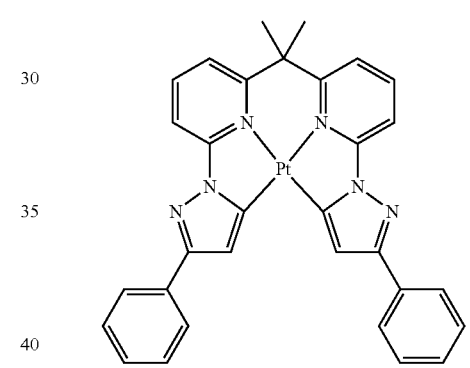
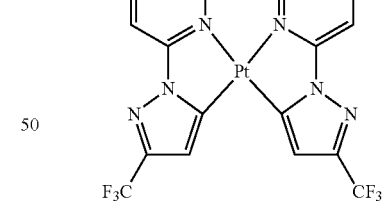
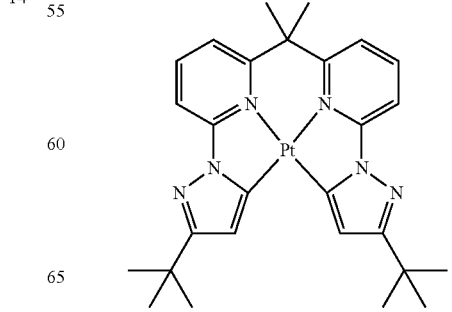

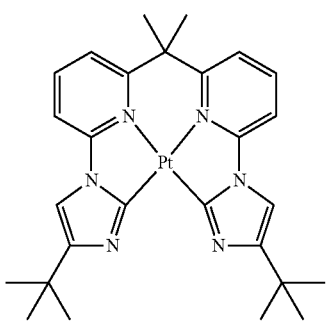
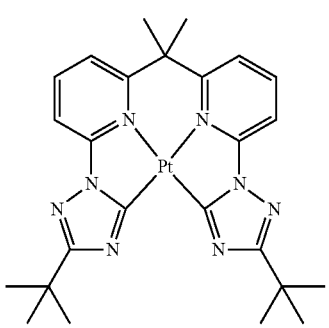
[Fifteenth Chemical Formula]
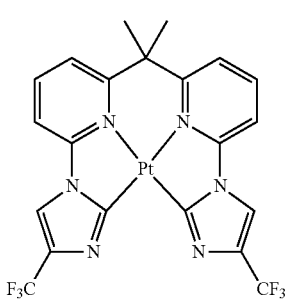
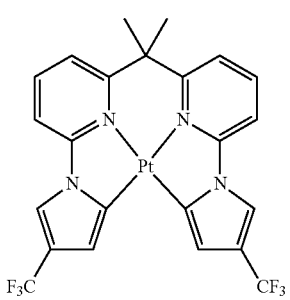
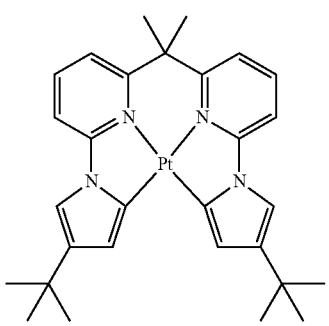
20
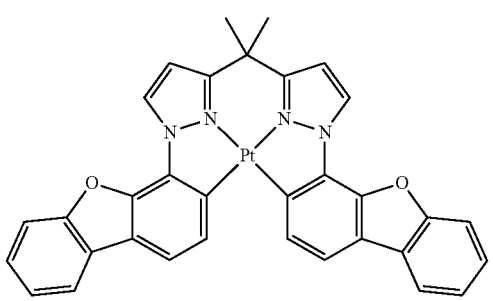
21
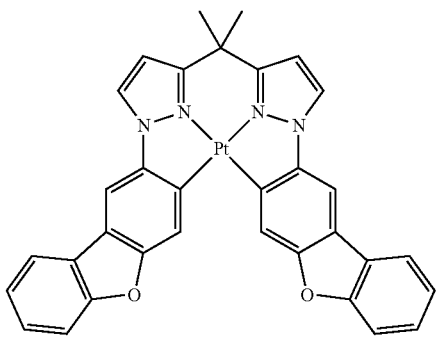
22
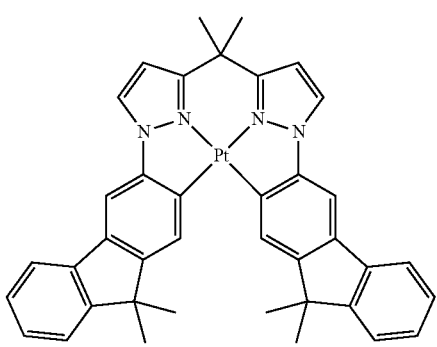
23
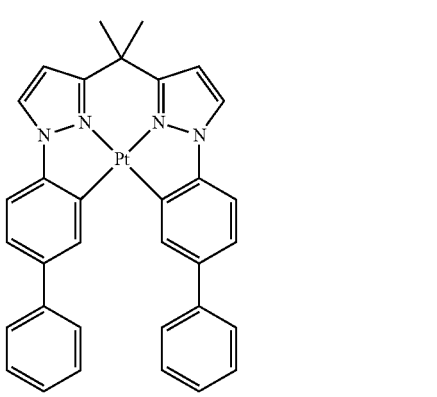
24

29
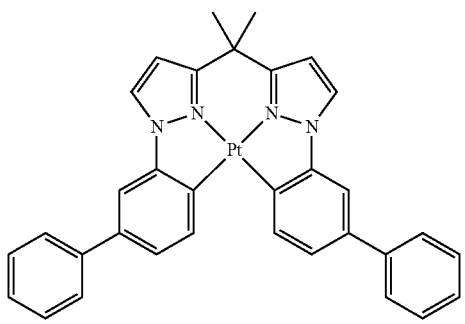
30
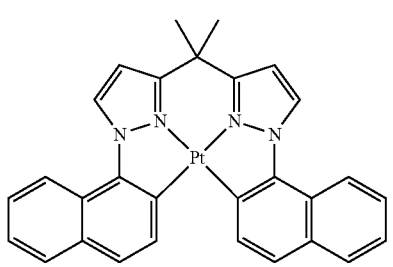
31
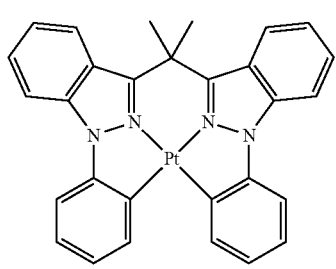
32
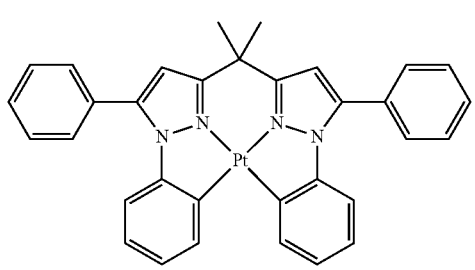
33
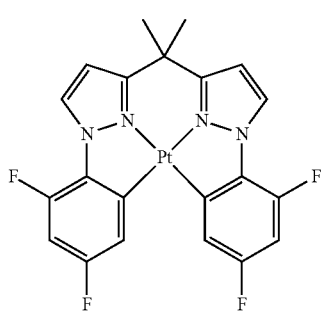
34
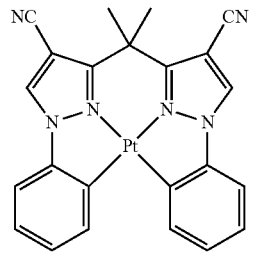
35
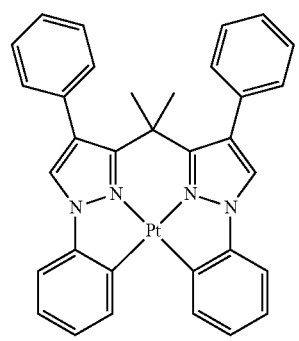
36
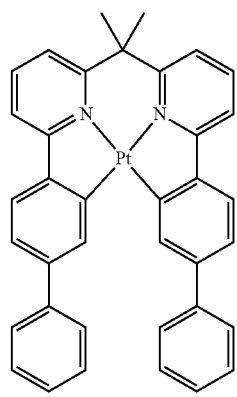
37
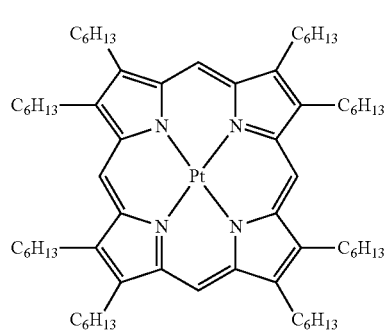
38
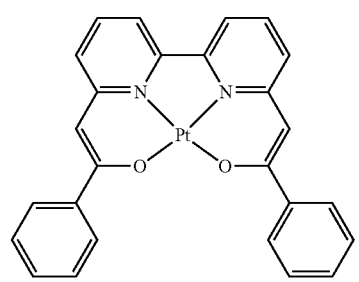

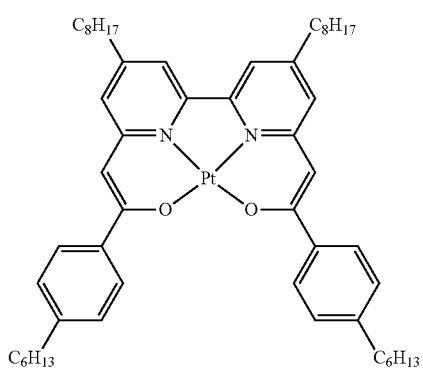
39
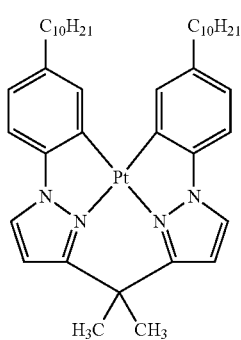
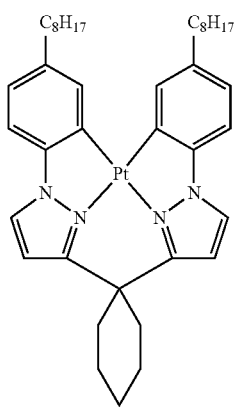
[Sixteenth Chemical Formula]
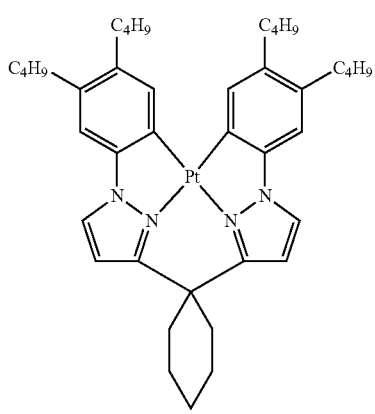
42
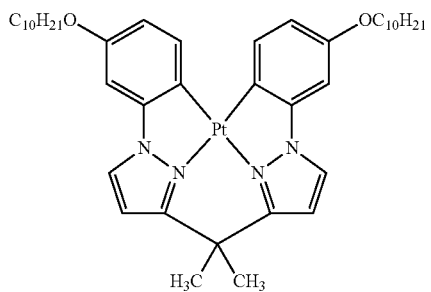
43
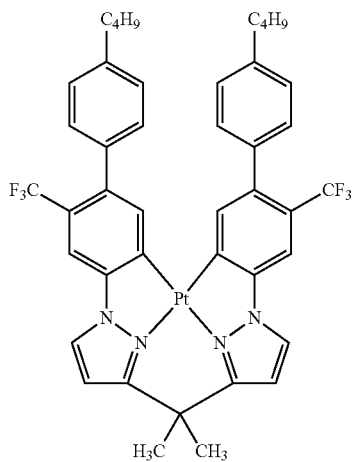
44
45
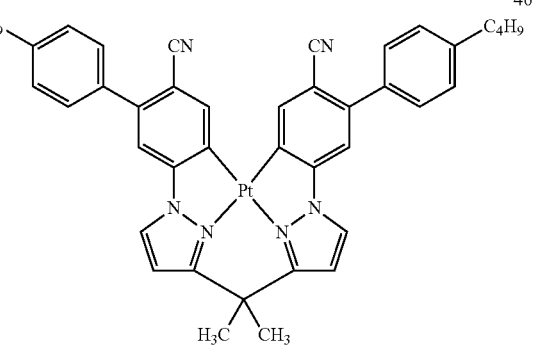
46

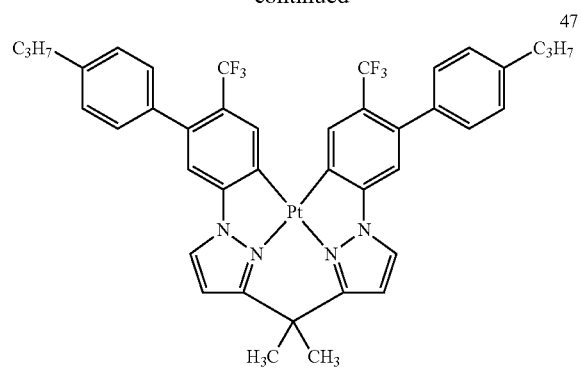
47
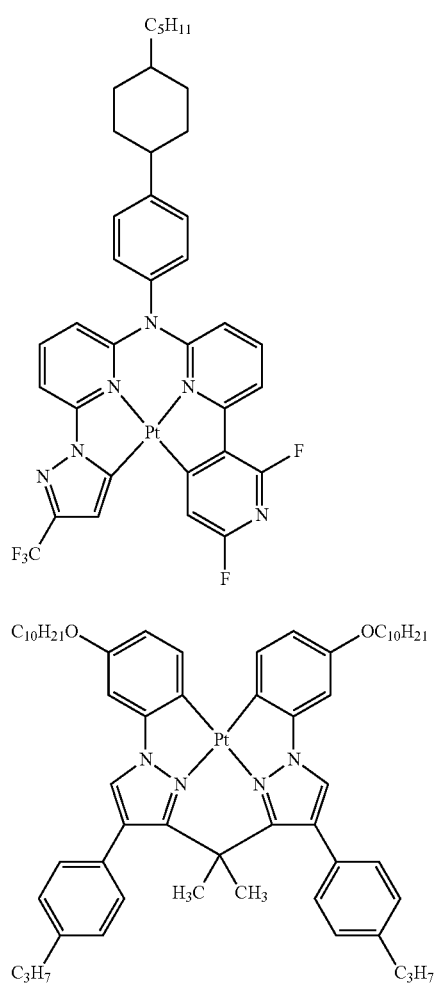
48
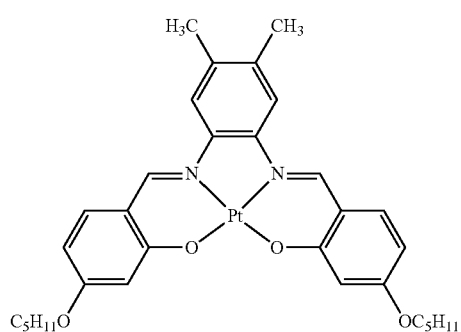
50
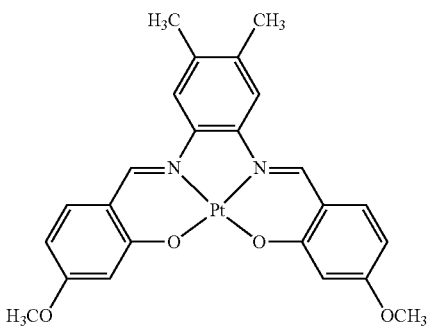
51
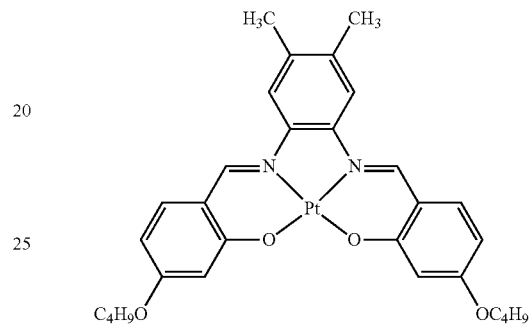
52
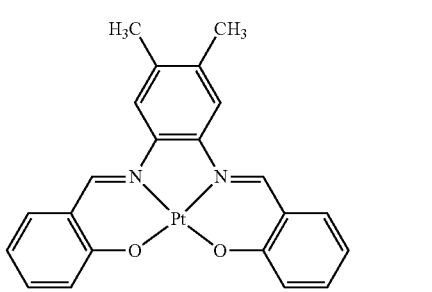
53
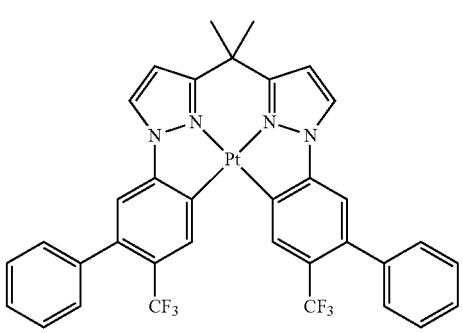
54
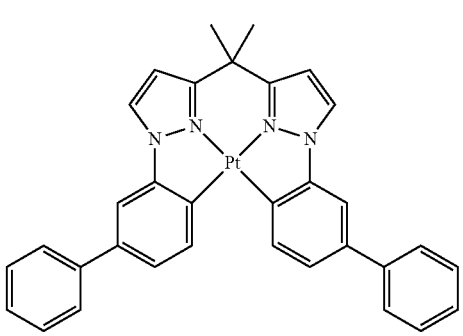
55

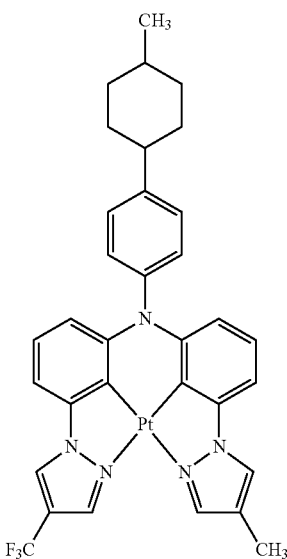

The platinum complex expressed by General Formula C-1 can be synthesized by various methods such as the method described in line 53 of the left-hand column to line 7 of the right-hand column on page 789, the method described in lines 18 to 38 of the left-hand column on page 790, or the method described in lines 19 to 30 of the right-hand column on page 790 in *Journal of Organic Chemistry* 53, 786, (1988), G. R. Newkome et al., or by a combination of these [methods], as well as by the method described in lines 26 to 35 of page 2752 in *Chemische Berichte [Chemical Reports]* 113, 2749 (1980), H. Lexy et al.

For example, [the platinum complex] can be obtained by treating a ligand or a dissociate thereof and a metal compound in the presence or absence of a solvent (such as a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent, or water) and in the presence or absence of a base (various inorganic or organic bases such as sodium methoxide, t-butoxy potassium, triethylamine, and potassium carbonate) at room temperature or below or under heating (in addition to normal heating, a method involving heating by microwaves is also effective).

Pyrene Derivatives

Any conventionally known pyrene derivative can be used as the pyrene derivative, but it is preferable to use a compound expressed by General Formula P-1 (hereinafter also referred to as "compound P-1") below:

[Seventeenth Chemical Formula]

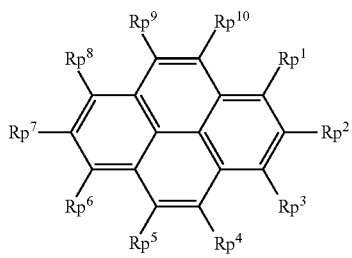

(P-1)

In the formula, $R_P^1$ to $R_P^{10}$ represent each independently a hydrogen atom, an aromatic hydrocarbon group that may have a substituent, an alkyl group that may have a substituent, a silyl group that may have a substituent, a heterocyclic group that may have a substituent, an alkylamino group that may have a substituent, or an arylamino group that may have a substituent, and at least one of $R_P^1$ to $R_P^{10}$ is a group other than a hydrogen atom.

<$R_P^1$ to $R_P^{10}$>

(Type of Substituents $R_P^1$ to $R_P^{10}$)

$R_P^1$ to $R_P^{10}$ represent each independently a hydrogen atom, an aromatic hydrocarbon group which may have a substituent, an alkyl group which may have a substituent, a silyl group which may have a substituent, a heterocyclic group which may have a substituent, an alkylamino group which may have a substituent, or an arylamino group which may have a substituent. These may be bonded to each other and condensed into a ring.

At least one of $R_P^1$ to $R_P^{10}$ is a group other than a hydrogen atom.

If two or more of $R_P^1$ to $R_P^{10}$ are a group other than a hydrogen atom, such a plurality of groups other than a hydrogen atom may be the same or different. It is preferable for these to be the same in terms of ease of synthesis, but it is preferable for these to be different in terms of allowing tuning of the emission wavelength.

Furthermore, in terms of obtaining a high luminous efficiency, the groups other than a hydrogen atom in $R_P^1$ to $R_P^{10}$ are preferably an aromatic hydrocarbon group which may have a substituent or a silyl group which may have a substituent, with an aromatic hydrocarbon group which may have a substituent being especially preferable. Moreover, in terms of obtaining emission with a narrow half-value width, the groups other than a hydrogen atom in $R_P^1$ to $R_P^{10}$ are preferably an alkyl group which may have a substituent, an arylamino group which may have substituent, or a heterocyclic group which may have a substituent, and in terms of obtaining a longer emission wavelength, the groups other than a hydrogen atom in $R_P^1$, $R_P^3$ to $R_P^6$, and $R_P^8$ to $R_P^{10}$ are preferably an aromatic hydrocarbon group which may have a substituent or a heterocyclic group which may have a substituent.

The aromatic hydrocarbon groups represented by $R_P^1$ to $R_P^{10}$ are preferably with a carbon number of 6 to 16, and these are not limited at all to being monocyclic groups and may instead be condensed polycyclic hydrocarbon groups. Concrete examples of aromatic hydrocarbon groups include a phenyl group, a biphenyl group, a phenanthryl group, a naphthyl group, an anthryl group, and a fluorenyl group.

The alkyl groups represented by $R_P^1$ to $R_P^{10}$ are preferably with a carbon number of 1 to 10, and concrete examples include an i-propyl group, a t-butyl group, and a cyclohexyl group.

The silyl groups are preferably with a carbon number of 3 to 20, and concrete examples include a trimethylsilyl group, a dimethylphenylsilyl group, a dimethylbutylsilyl group, a triisopropylsilyl group, and a methyldibutylsilyl group.

The heterocyclic groups represented by $R_P^1$ to $R_P^{10}$ are preferably with a carbon number of 3 to 10, and concrete examples include a pyridyl group, a thienyl group, an oxazole group, an oxadiazole group, a benzothienyl group, a dibenzofuryl group, a dibenzothienyl group, a pyrazyl group, a pyrimidyl group, a pyrazoyl group, an imidazoyl group, and a phenylcarbazoyl group.

The alkylamino groups represented by $R_P^1$ to $R_P^{10}$ are preferably with a carbon number of 1 to 10, and concrete examples include a dimethylamino group, a diethylamino group, a dipropylamino group, and a dibutylamino group.

The arylamino groups represented by $R_P^1$ to $R_P^{10}$ are preferably with a carbon number of 6 to 30, and concrete examples include a diphenylamino group, a carbazoyl group, and a phenylnaphthylamino group.

Examples of the substituent that these groups may have include an aryl group, an arylamino group, an alkyl group, a perfluoroalkyl group, a halide group, a carboxyl group, a cyano group, an alkoxyl group, an aryloxy group, a carbonyl group, an oxycarbonyl group, a carboxylic acid group, and a heterocyclic group. Preferable examples include a $C_6$ to $C_{16}$ aryl group, a $C_{12}$ to $C_{30}$ arylamino group, a $C_1$ to $C_{12}$ alkyl group, a $C_1$ to $C_{12}$ perfluoroalkyl group, a fluoride group, a $C_1$ to $C_{10}$ oxycarbonyl group, a cyano group, a $C_1$ to $C_{10}$ alkoxy group, a $C_6$ to $C_{16}$ aryloxy group, a $C_2$ to $C_{16}$ carbonyl group, and a $C_5$ to $C_{20}$ heterocyclic group.

Of these substituents, examples of $C_6$ to $C_{16}$ aryl groups include a phenyl group, a naphthyl group, and a phenanthryl group.

Examples of $C_{12}$ to $C_{30}$ arylamino groups include a diphenylamino group, a carbazoyl group, and a phenylcarbazoyl group.

Examples of $C_1$ to $C_{12}$ alkyl groups include a methyl group, an ethyl group, a butyl group, an i-propyl group, a neopentyol group, and a t-butyl group.

An example of a $C_1$ to $C_{12}$ perfluoroalkyl group is a trifluoromethyl group.

Examples of a $C_1$ to $C_{10}$ oxycarbonyl group include a methoxycarbonyl group and an ethoxycarbonyl group.

Examples of a $C_1$ to $C_{10}$ alkoxy group include a methoxy group and an ethoxy group.

An example of a $C_6$ to $C_{16}$ aryloxy group is a phenyloxy group.

Examples of a $C_2$ to $C_{16}$ carbonyl group include an acetyl group and a phenylcarbonyl group.

Examples of a $C_3$ to $C_{20}$ heterocyclic group include a pyridyl group, a thienyl group, an oxazole group, an oxadiazole group, a benzothienyl group, a dibenzofuryl group, a dibenzothienyl group, a pyrazyl group, a pyrimidyl group, a pyrazoyl group, and an imidazoyl group.

Of the aforementioned $R_P^1$ to $R_P^{10}$ [groups] and the substituents which $R_P^1$ to $R_P^{10}$ may have, electron-donating groups such as an arylamino group or an alkoxy group and heterocyclic groups such as a thienyl group or a benzothienyl group contribute to increasing the emission wavelength of the compound P-1. Therefore, by selecting [one of] these substituents as $R_P^1$ to $R_P^{10}$ or the substituents which $R_P^1$ to $R_P^{10}$ may have, it is also possible to obtain a product that will emit green light.

Note that, of the compounds P-1, compounds expressed by General Formulas P-1a, P-1b, P-1c, P-1d, and P-1e below are especially preferable. In General Formulas P-1a, P-1b, P-1c, P-1d, and P-1e, $R_P^1$ to $R_P^{10}$ are defined the same as the $R_P^1$ to $R_P^{10}$ in General Formula P-1. In addition, $R_P^1$ and $R_P^1$, and $R_P^6$ and $R_P^7$ in General Formula P-1c, $R_P^1$ and $R_P^{10}$, and $R_P^5$ and $R_P^6$ in General Formula P-1d, and $R_P^9$ and $R_P^{10}$, and $R_P^4$ and $R_P^5$ in General Formula P-1e bond to each other to form a ring. The rings formed here are preferably five- or six-membered rings.

[Eighteenth Chemical Formula]

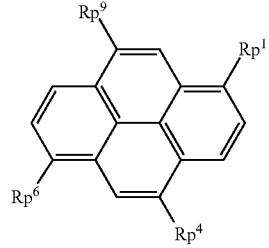

General Formula P-1a

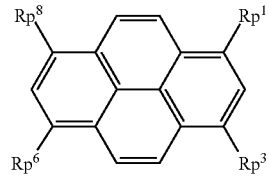

General Formula P-1b

[Nineteenth Chemical Formula]

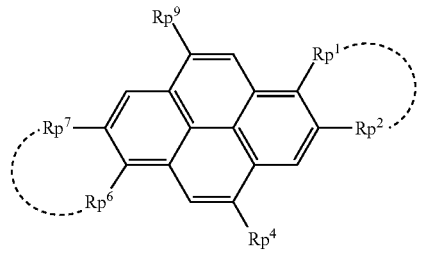

General Formula P-1c

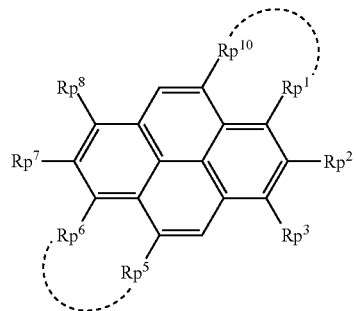

General Formula P-1d

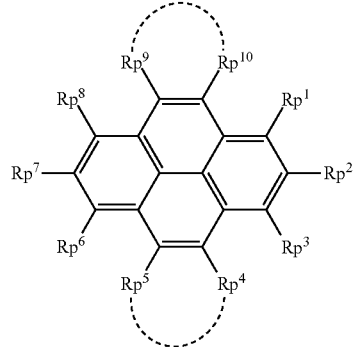

General Formula P-1e

Concrete examples of pyrene derivatives that can be used in the present invention are shown below, but the present invention is not limited to or by these:
[Twentieth Chemical Formula]
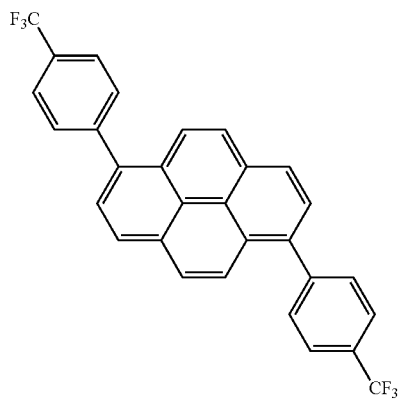
57
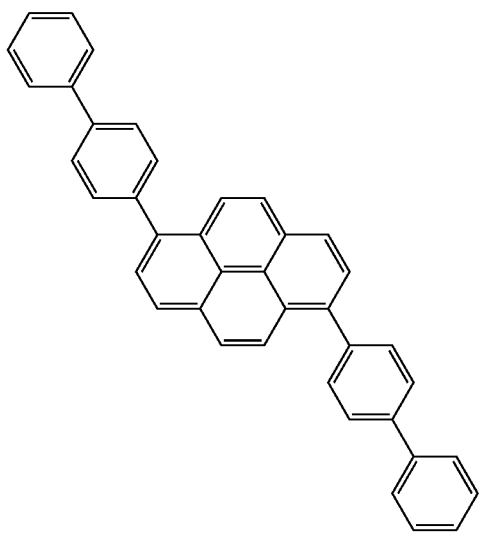
58
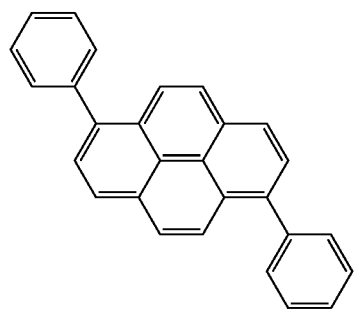
59
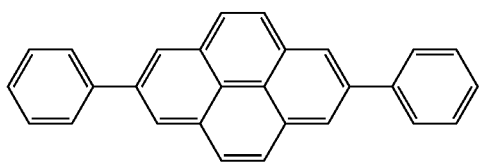
60
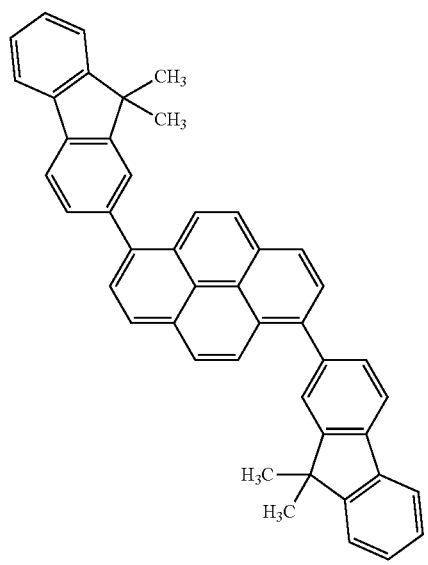
61
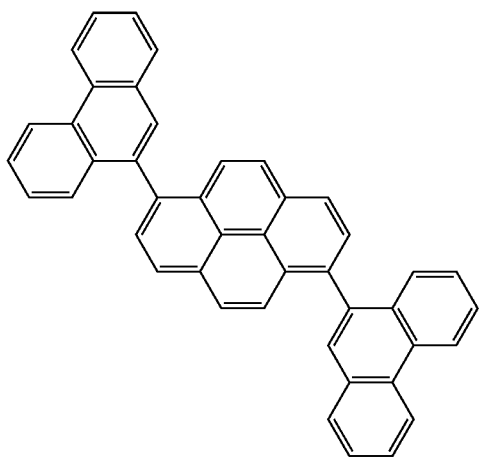
62

-continued
63
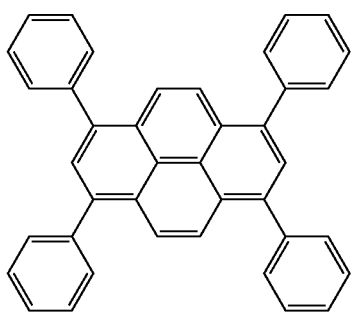
64
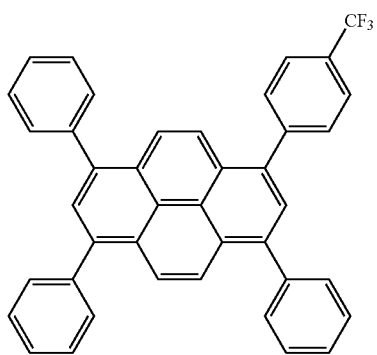
65
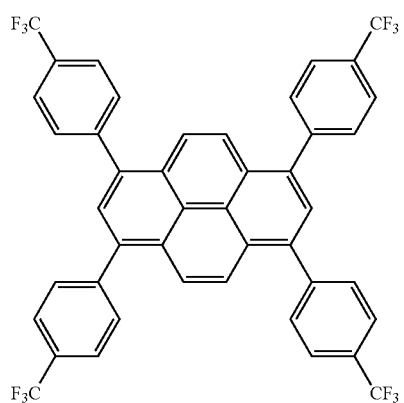
66
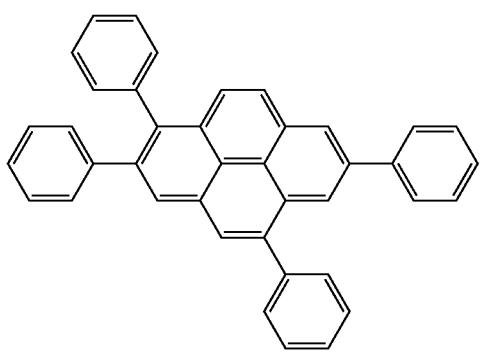
67
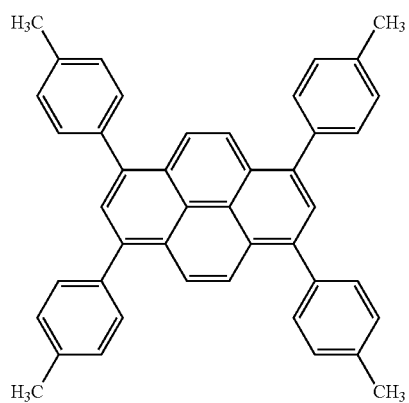
68
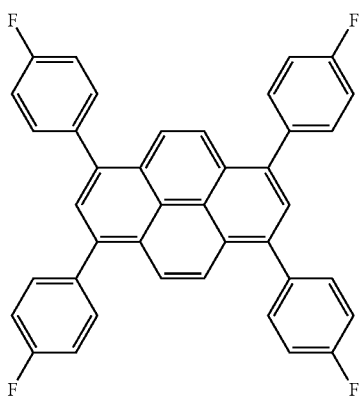

-continued
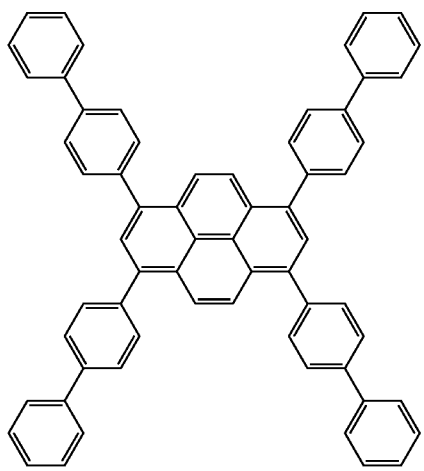
69
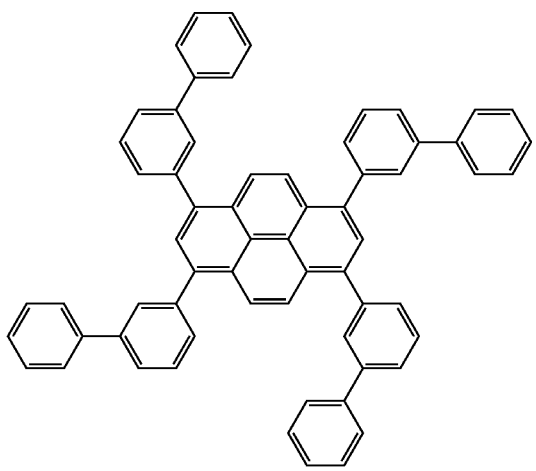
70
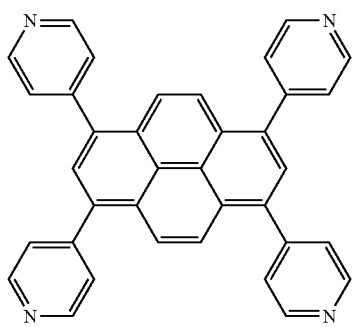
[Twenty-First Chemical Formula]
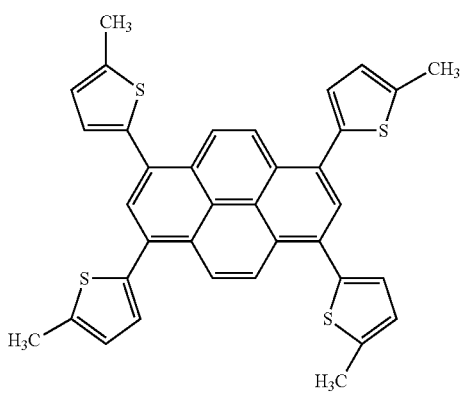
72
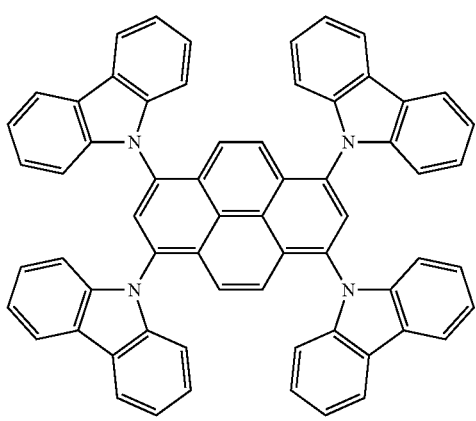
73

-continued
74
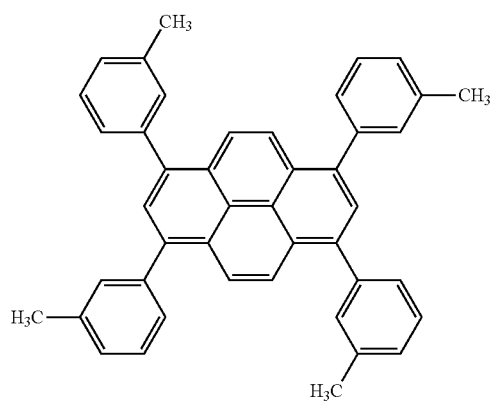
75
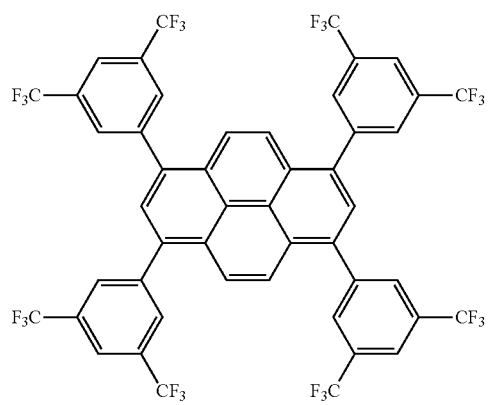
76
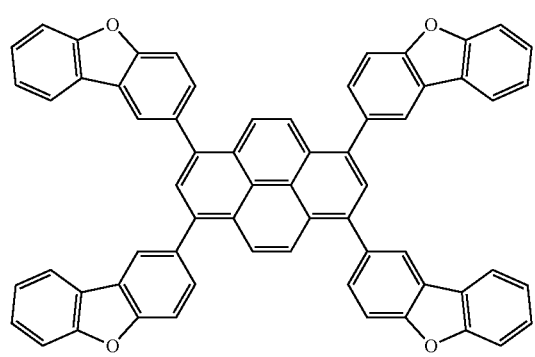
77
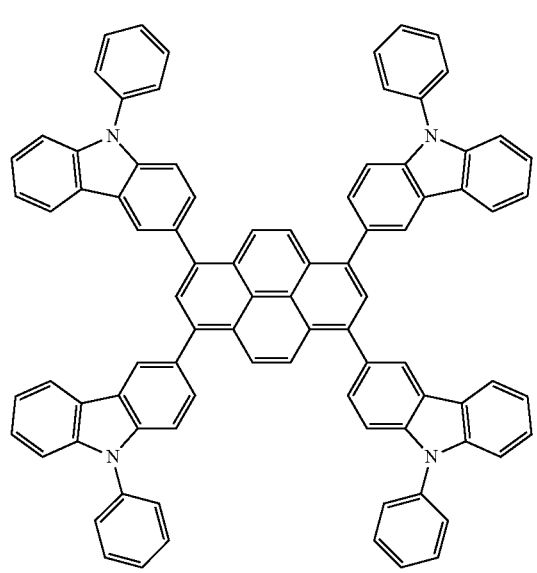
78
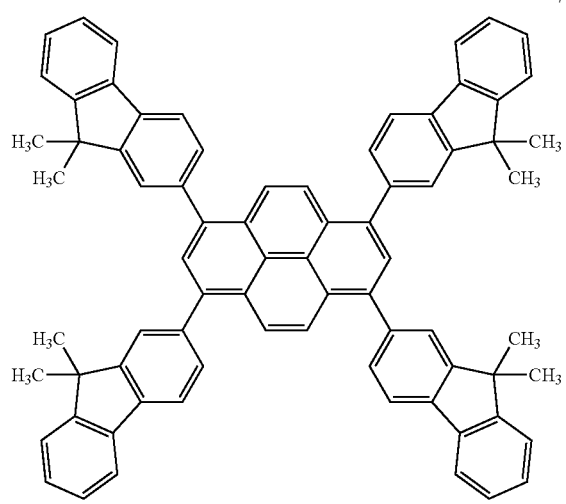
79
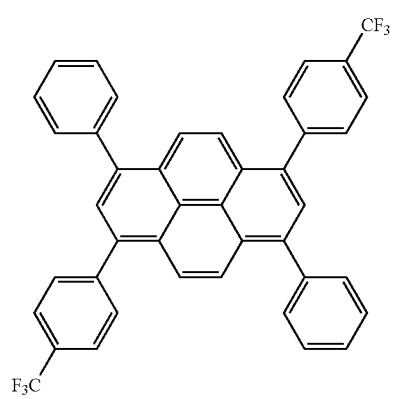

-continued
80
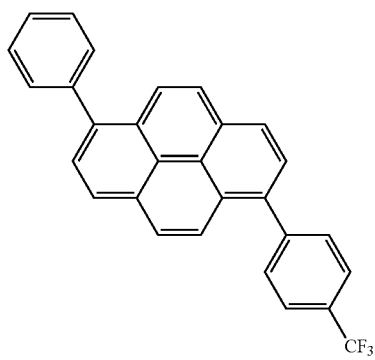
81
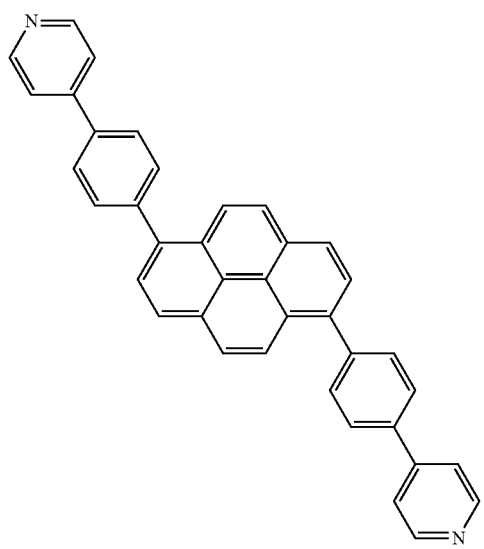
82
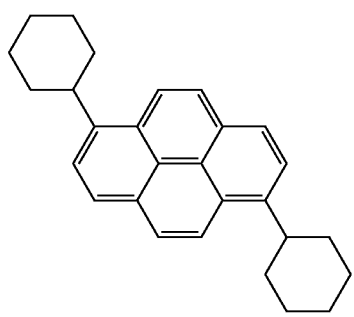
83
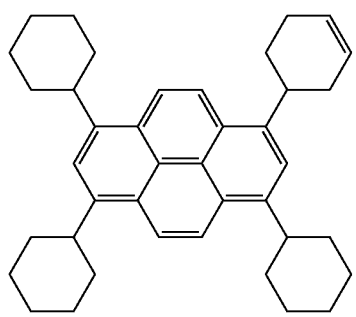
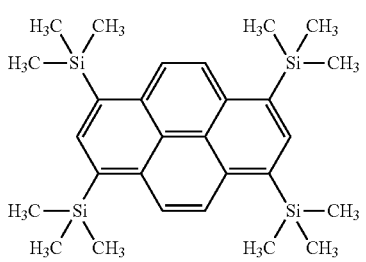
[Twenty-Second Chemical Formula]
85
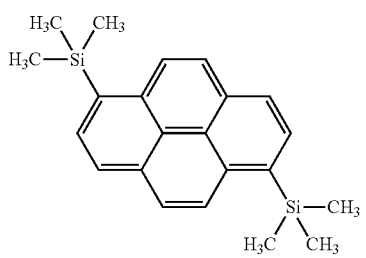
84
86
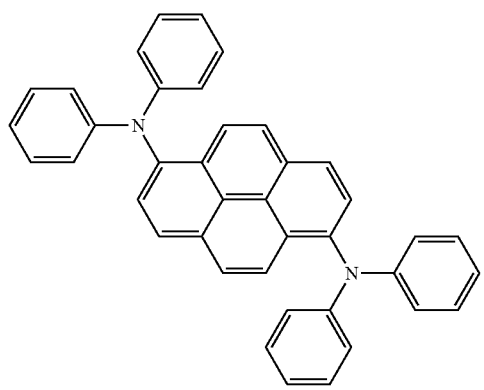

-continued
87
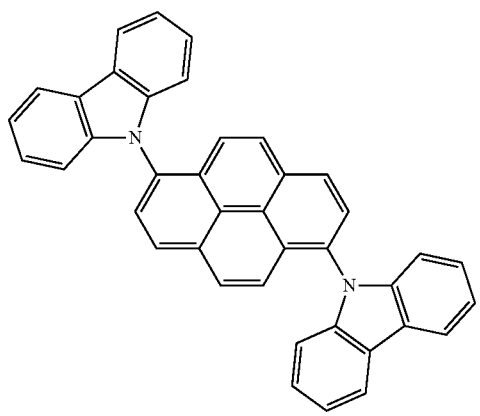
88
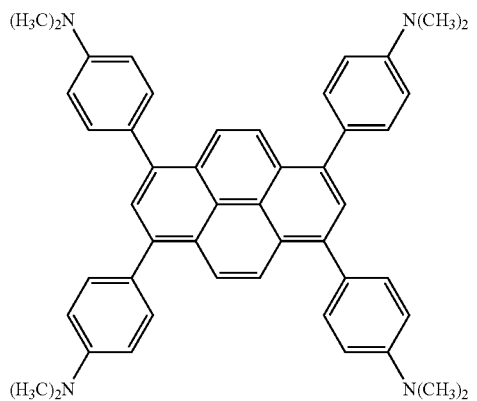
89
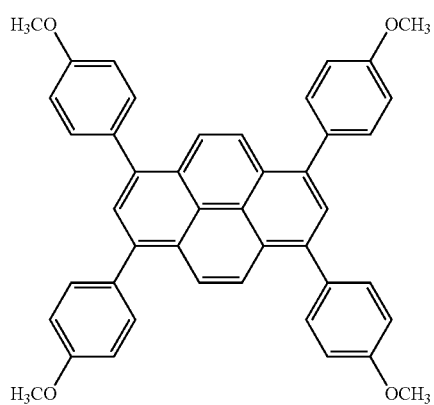
90
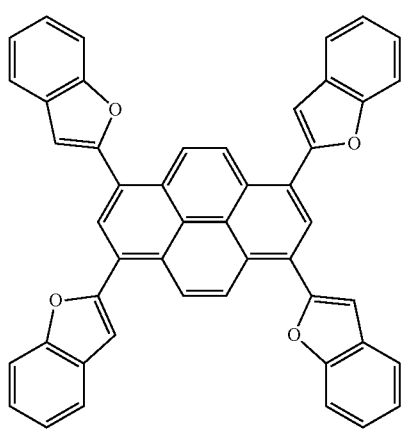
91
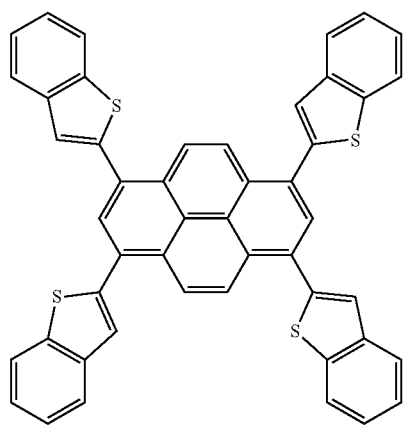
92
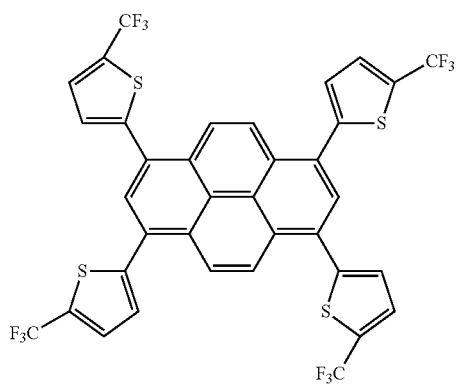
93
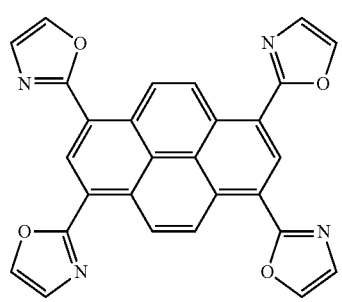
94
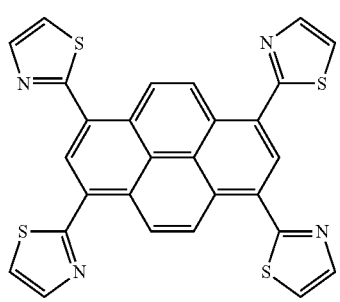

95
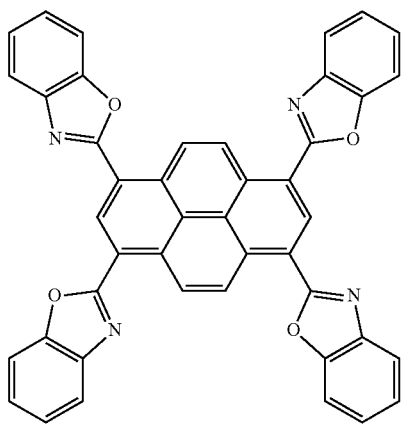
96
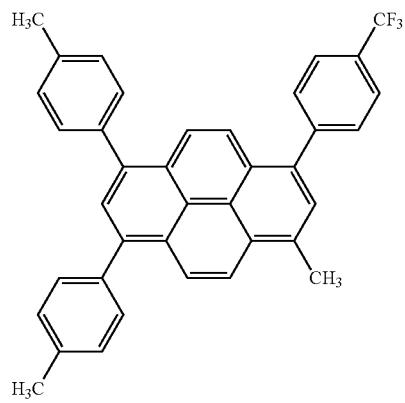
97
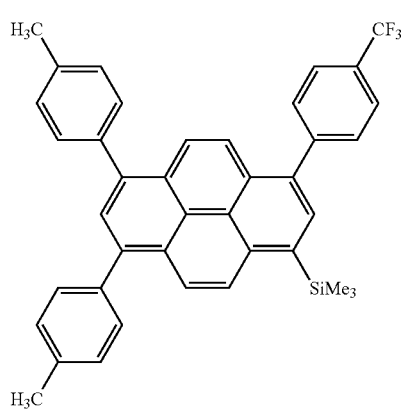
98
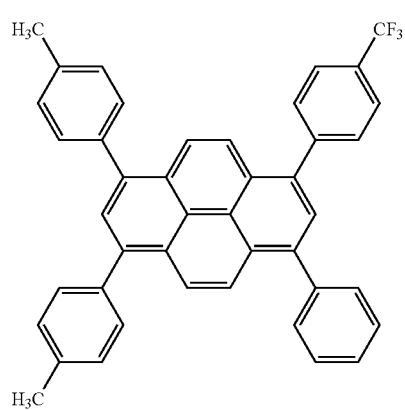
99
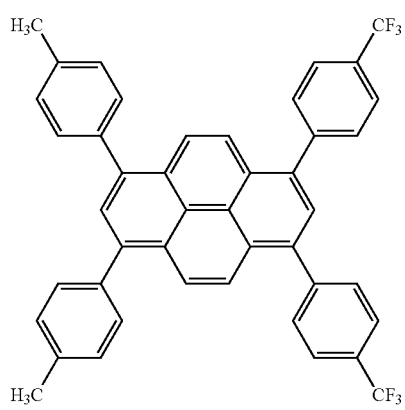
100
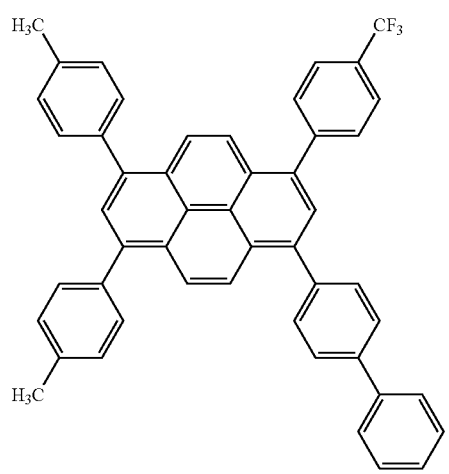

[Twenty-Third Chemical Formula]
-continued
101
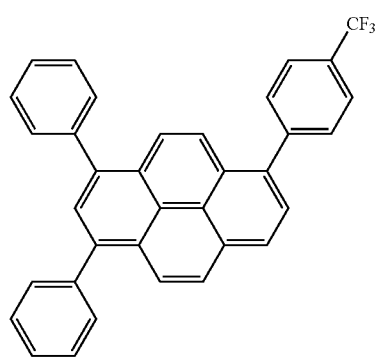
102
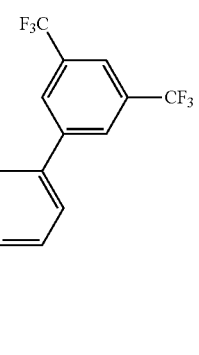
103
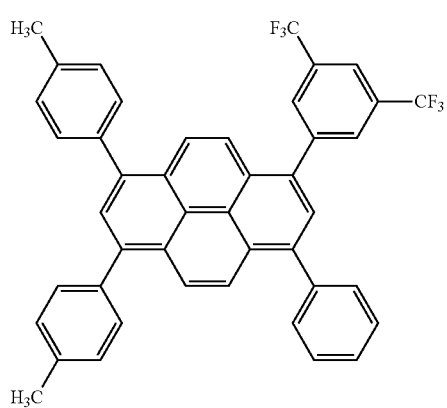
104
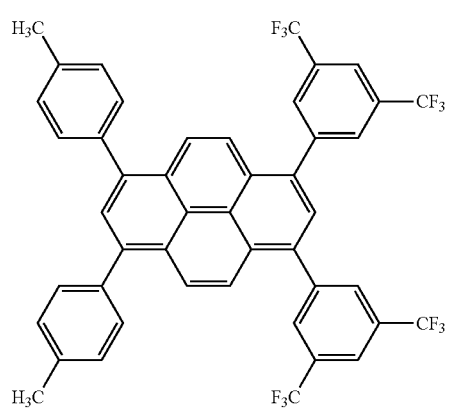
105
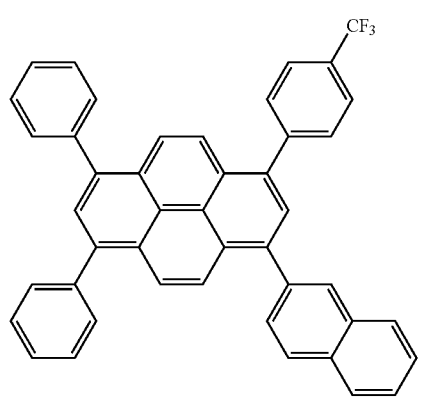
106
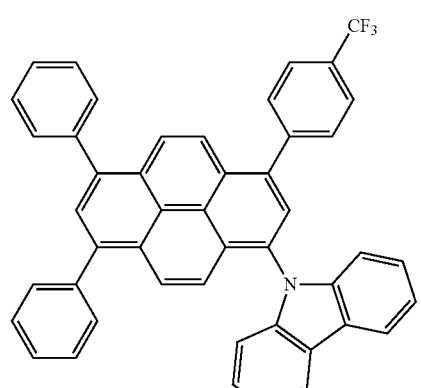
107
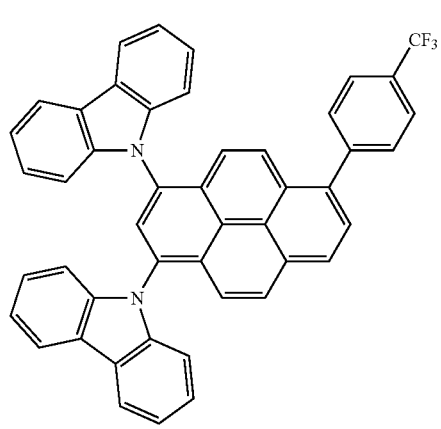
108
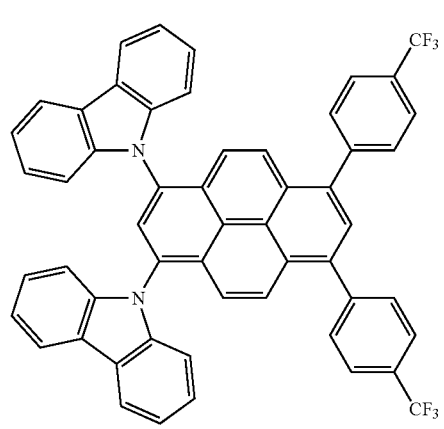

-continued
109
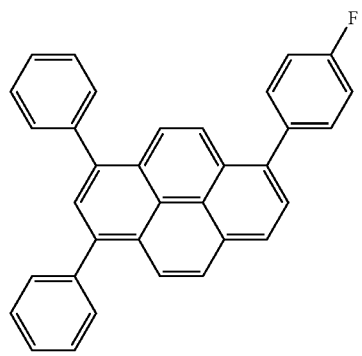
110
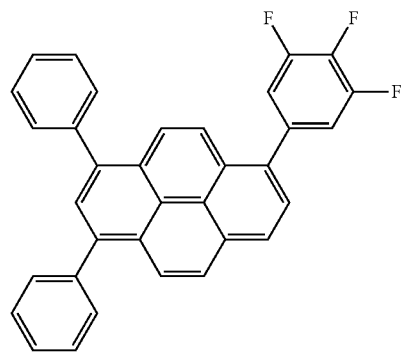
111
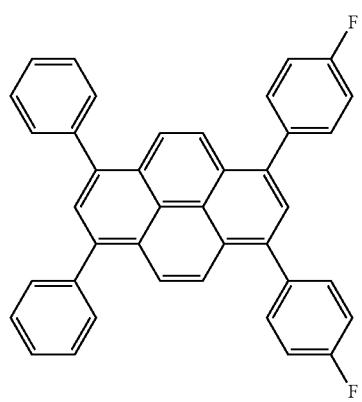
112
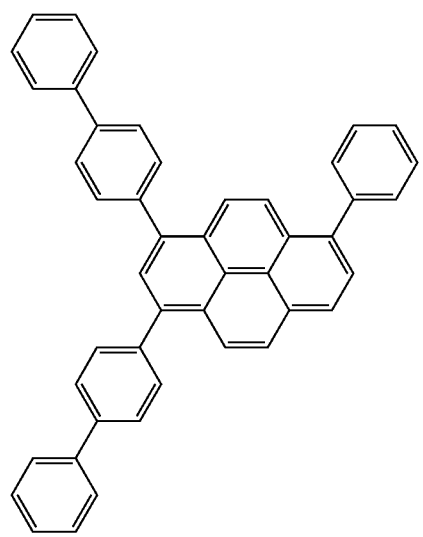
113
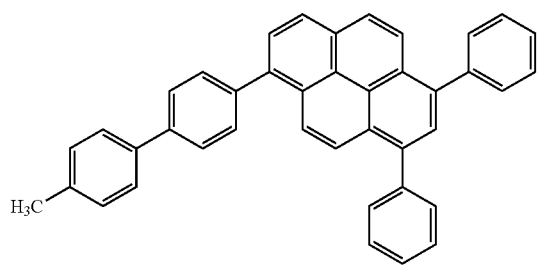
114
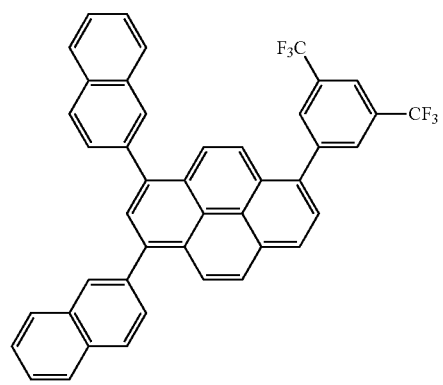
115
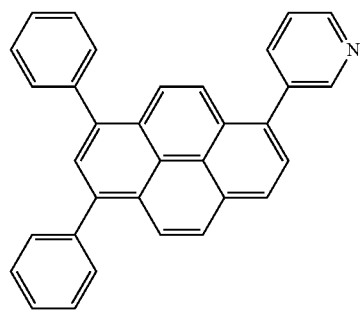
116
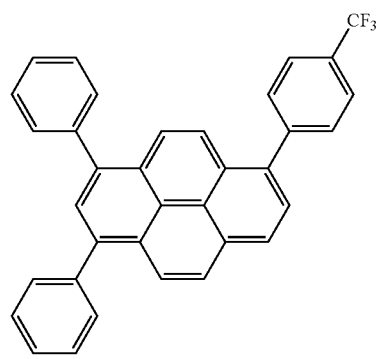

-continued
117
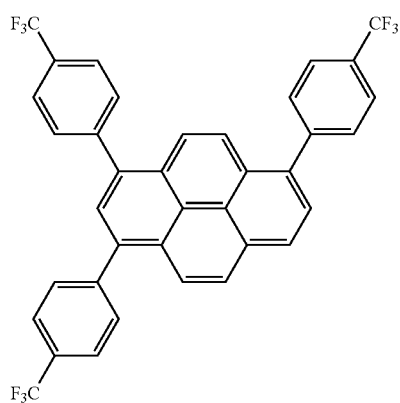
118
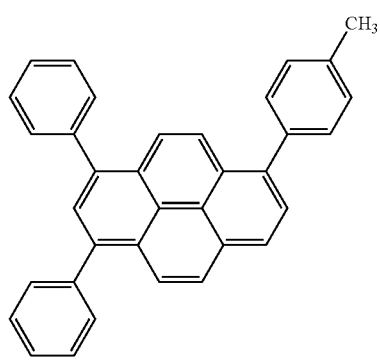
119
[Twenty-Fourth Chemical Formula]
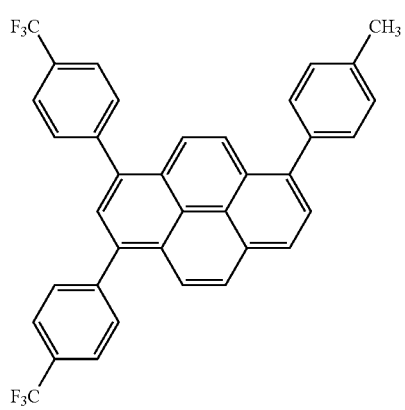
120
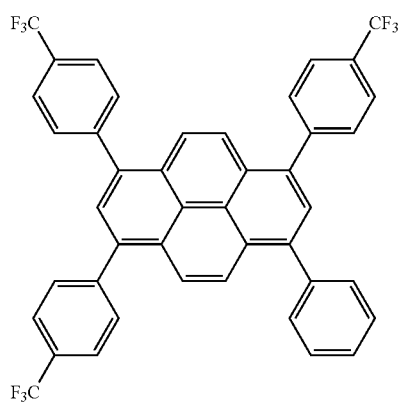
121
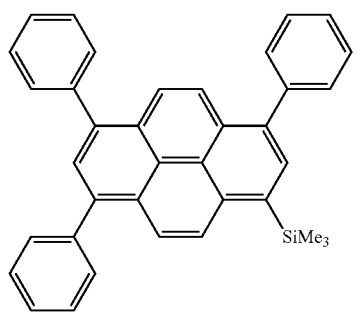

-continued
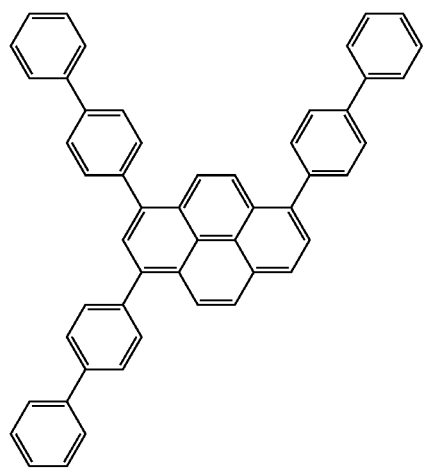
122
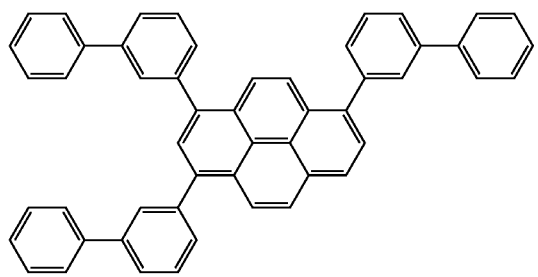
123
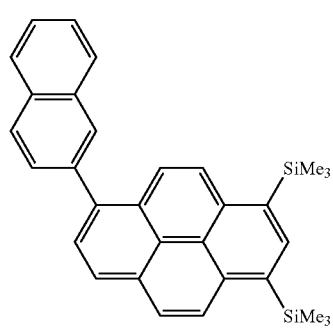
124
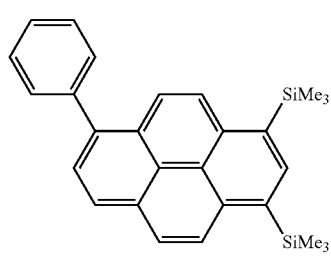
125
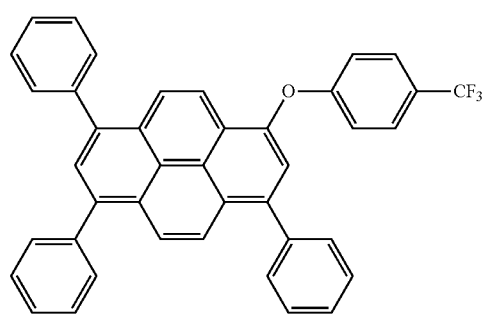
126
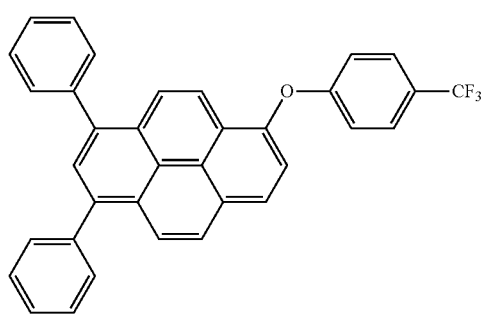
127

128 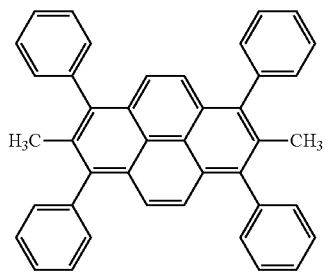
129 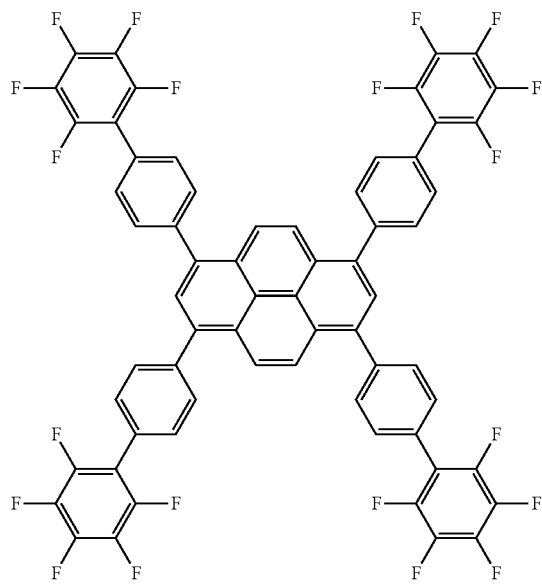
130 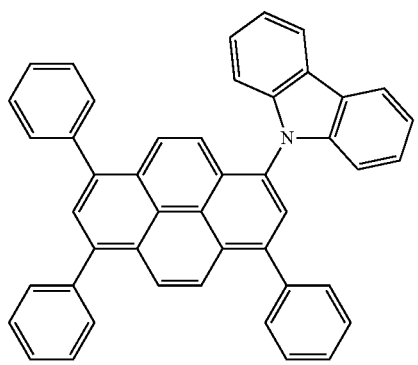
[Twenty-Fifth Chemical Formula]
131 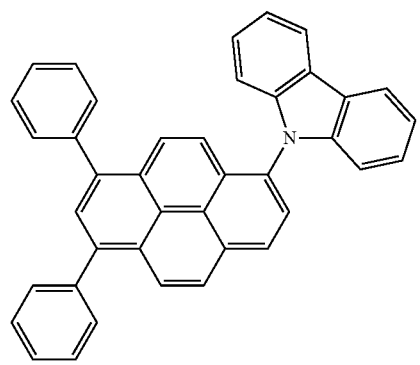
132 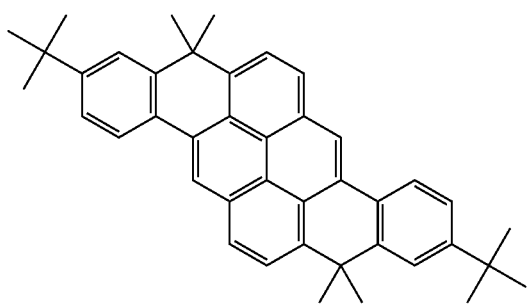
133 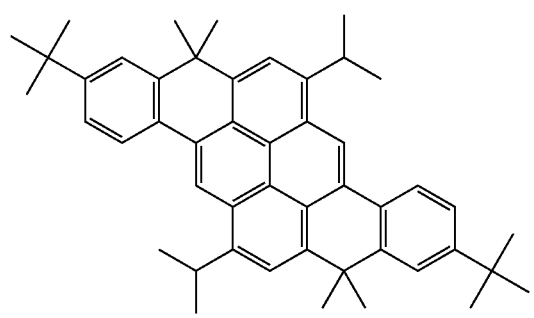
134 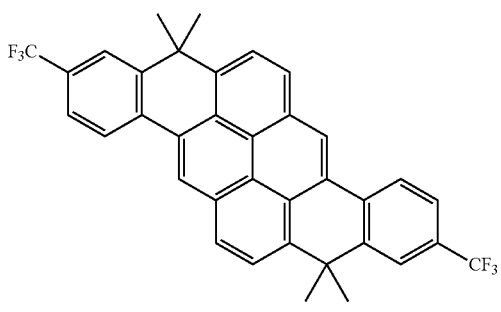
135 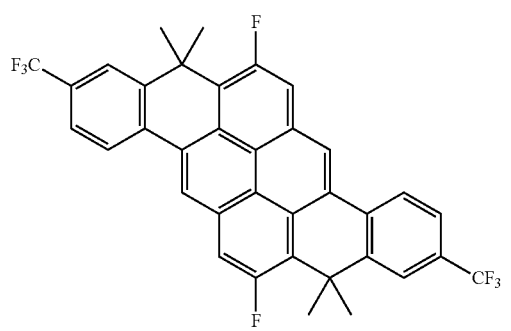

-continued
136
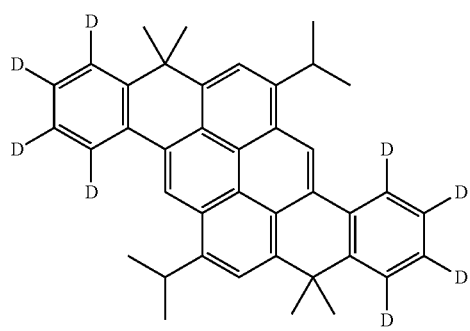
137
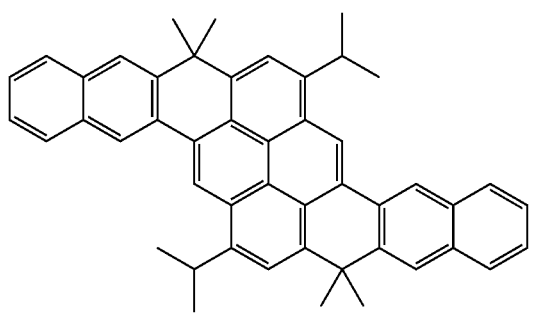
138
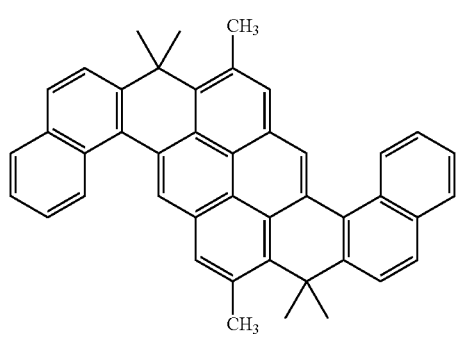
139
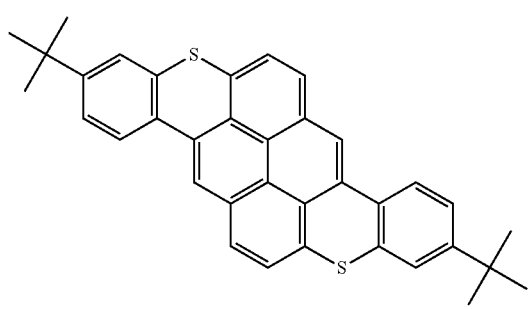
140
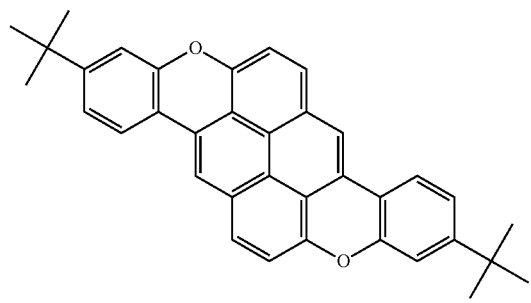
141
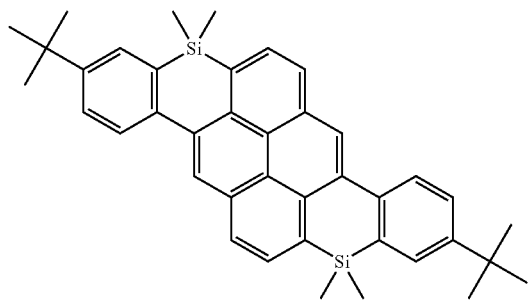
142
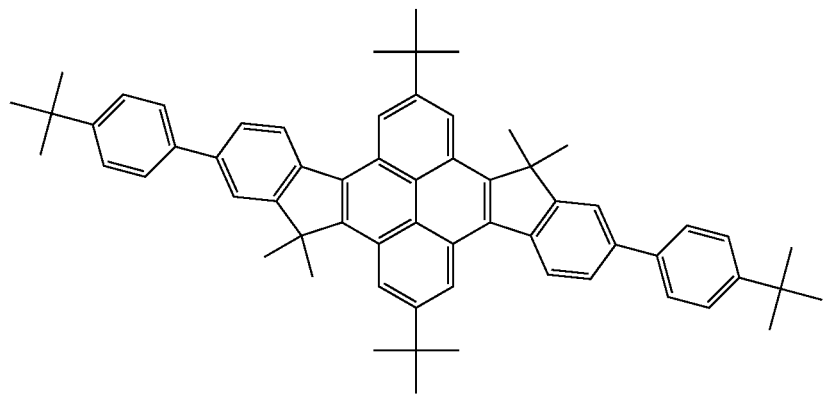

-continued
143
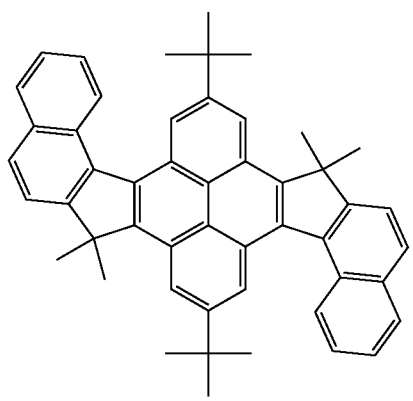
144
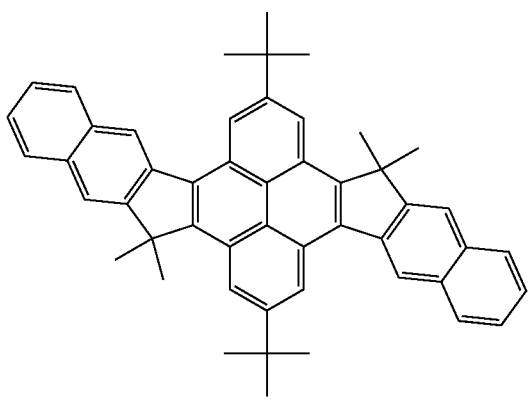
145
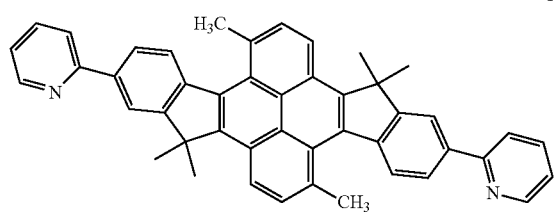
146
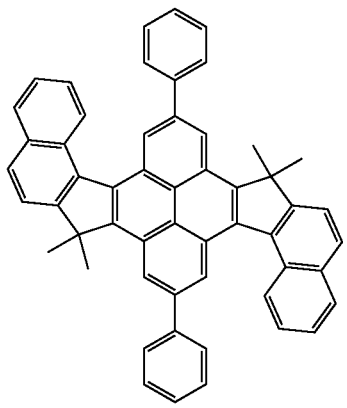
147
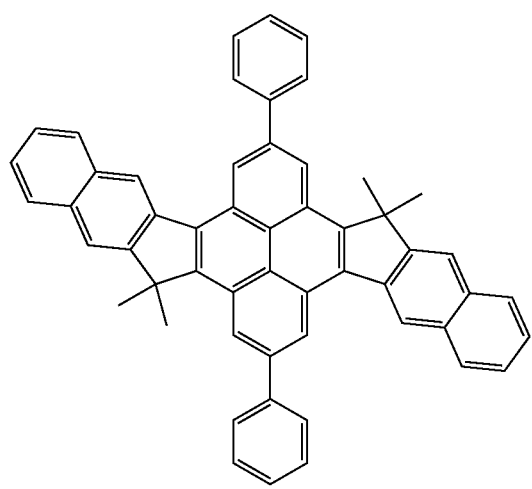
148
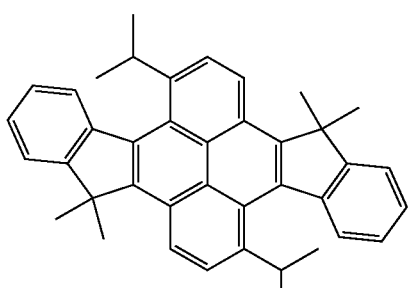

-continued
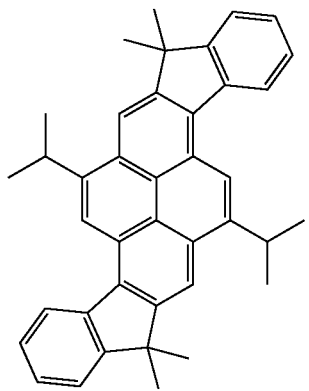
[Twenty-Sixth Chemical Formula]
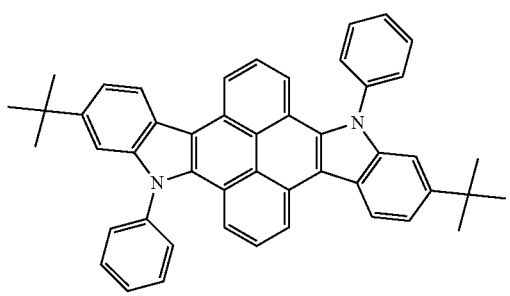
149
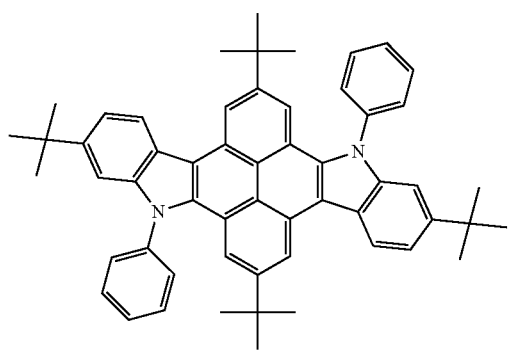
150 151
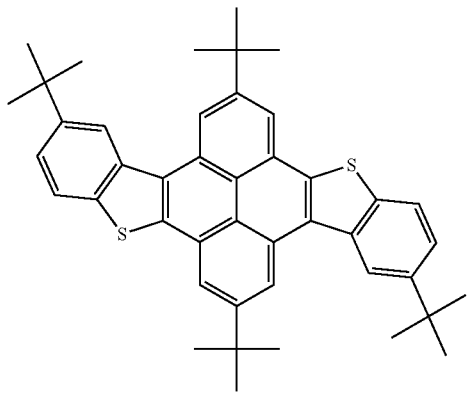
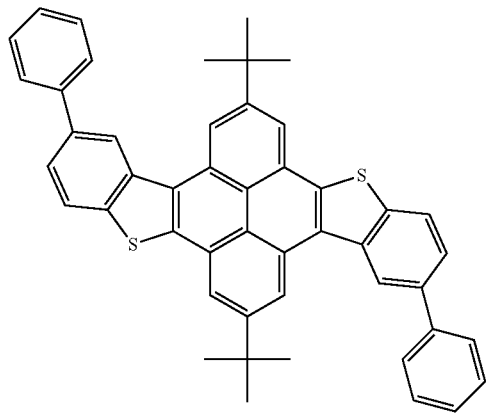
152 153
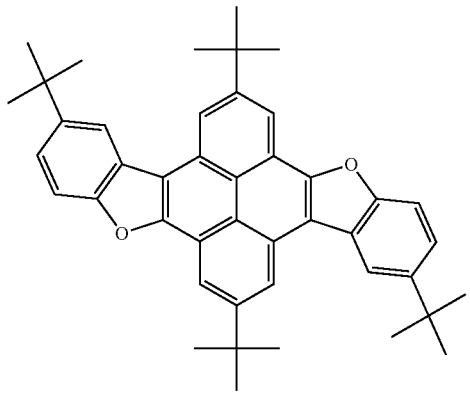
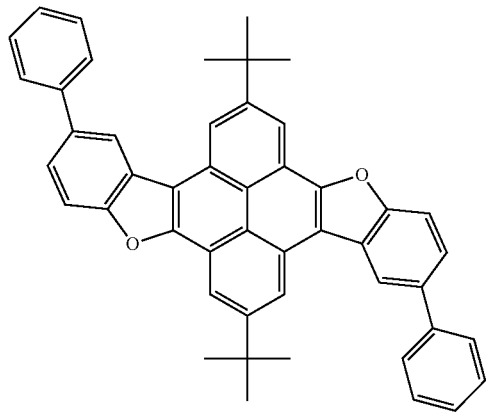
154 155

-continued
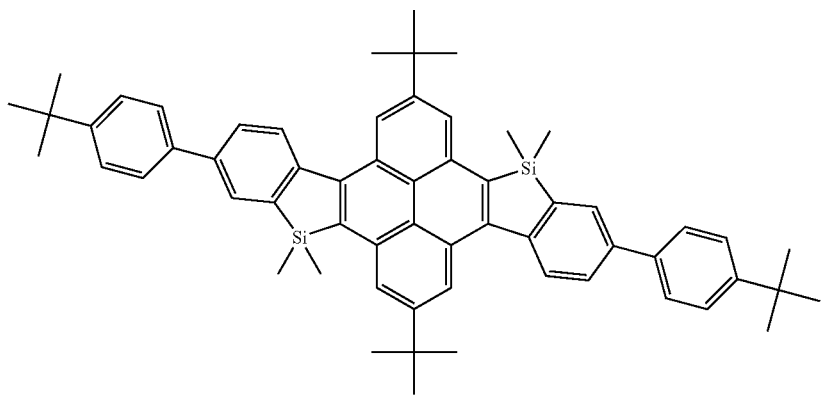
156
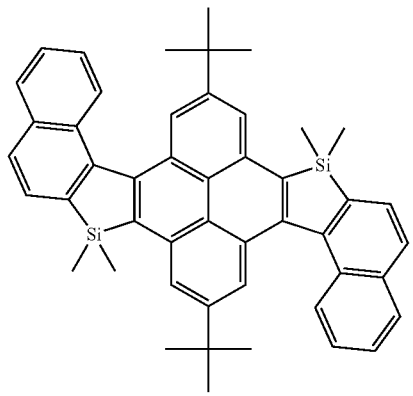
157
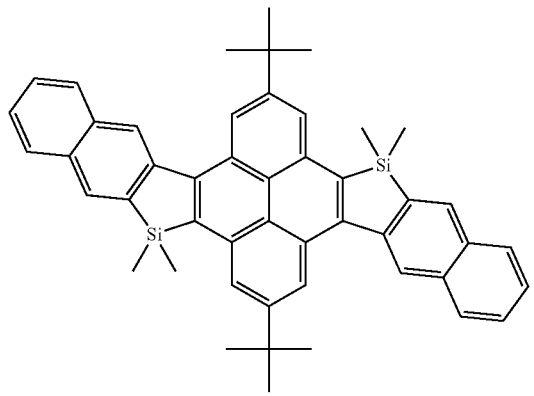
158
[Twenty-Seventh Chemical Formula]
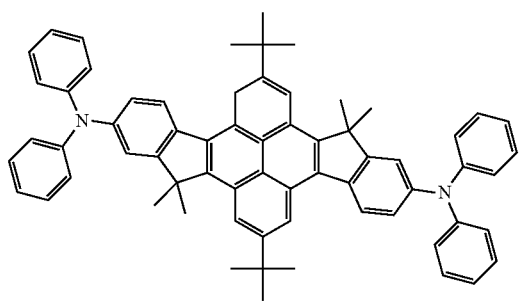
159
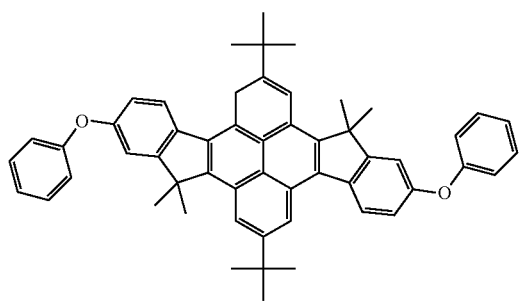
160
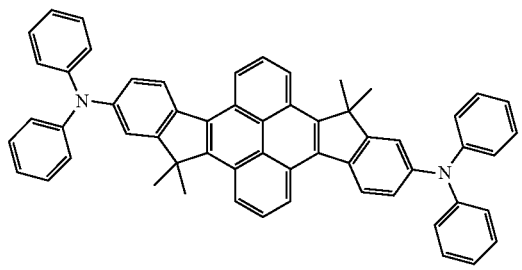
161
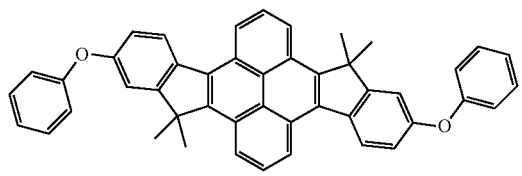
162

-continued
163
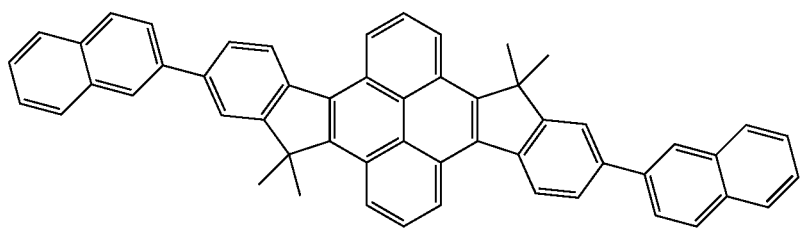
164
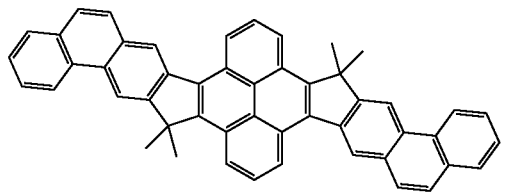
165
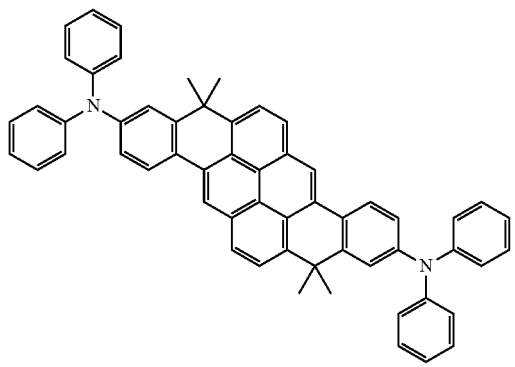
166
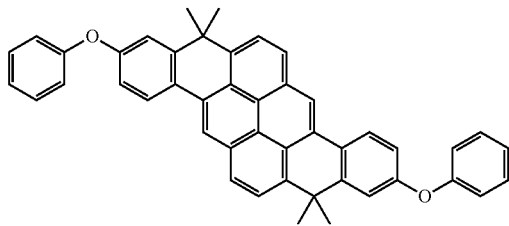
167
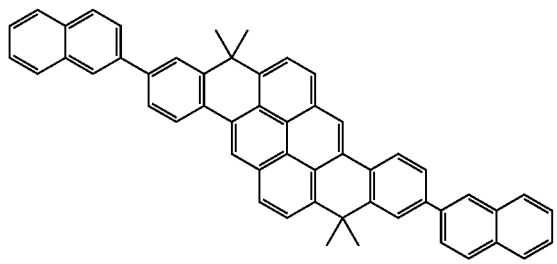
168
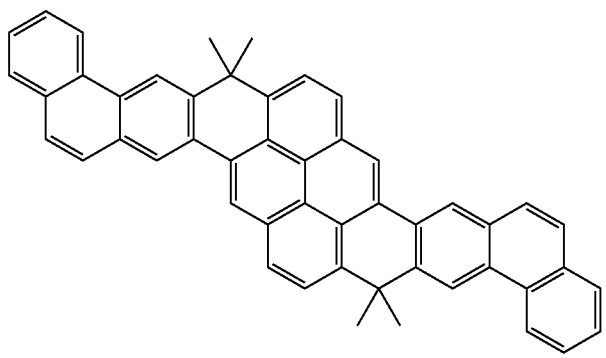

[Twenty-Eighth Chemical Formula]
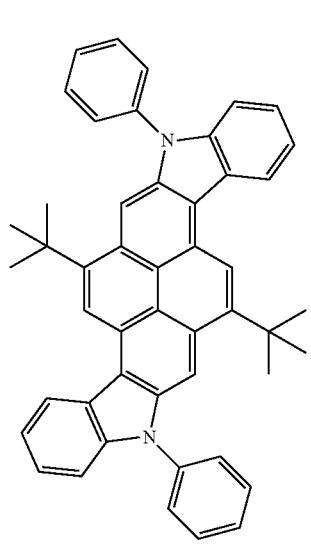
169
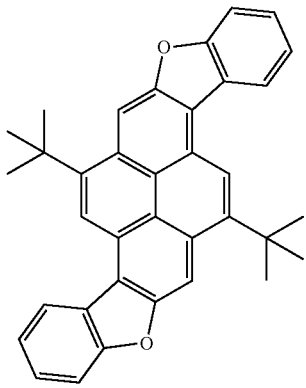
170
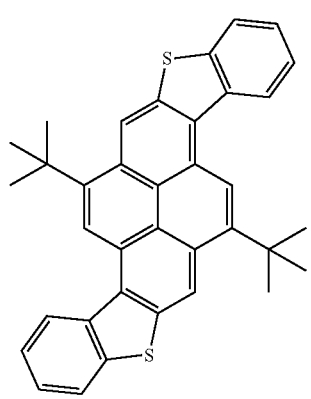
171
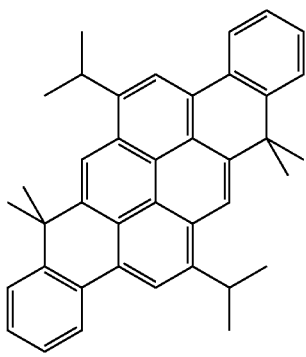
172
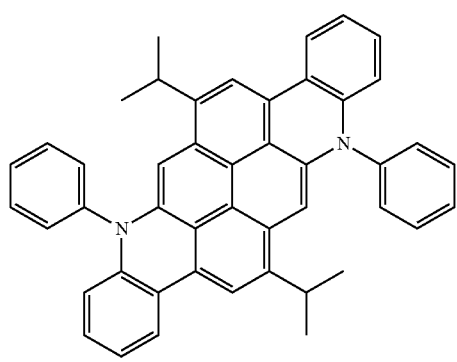
173
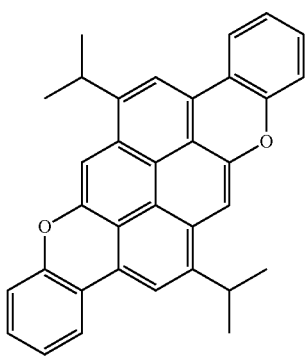
174

175 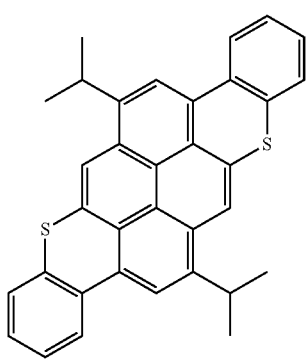
176 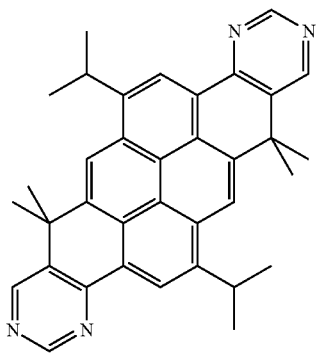
[Twenty-Ninth Chemical Formula]
177 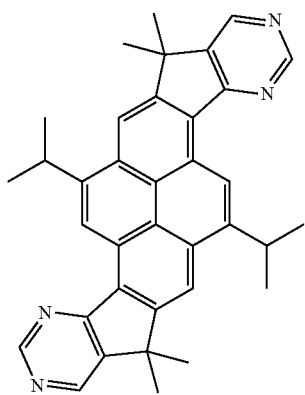
178 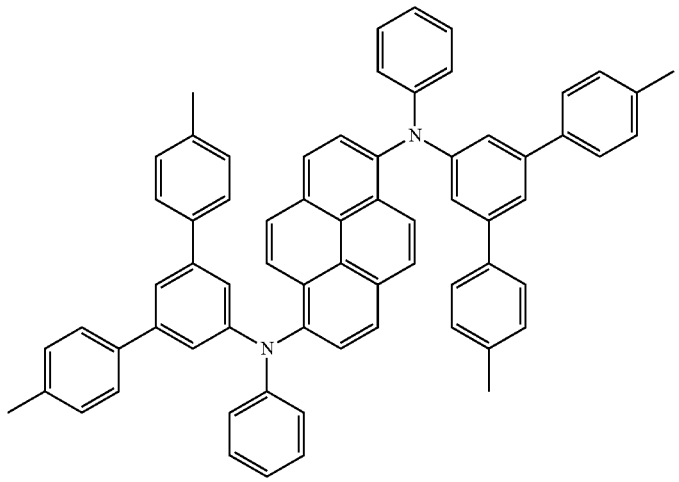
179 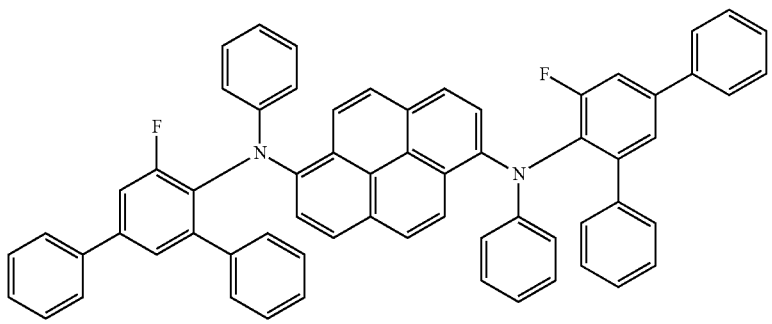

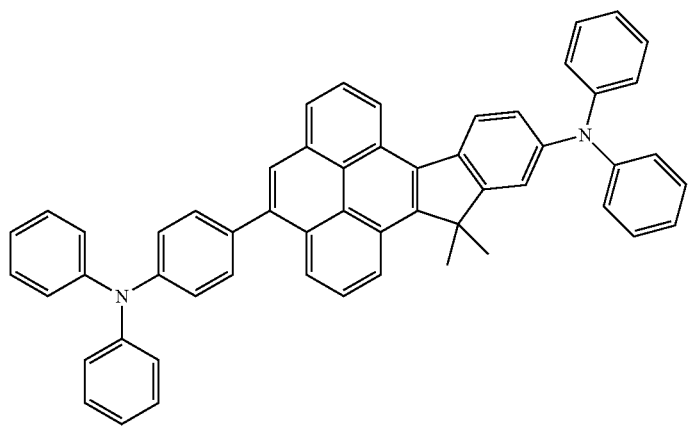
The pyrene derivatives expressed by General Formulas P-1a to P-1e can be synthesized by the following scheme:
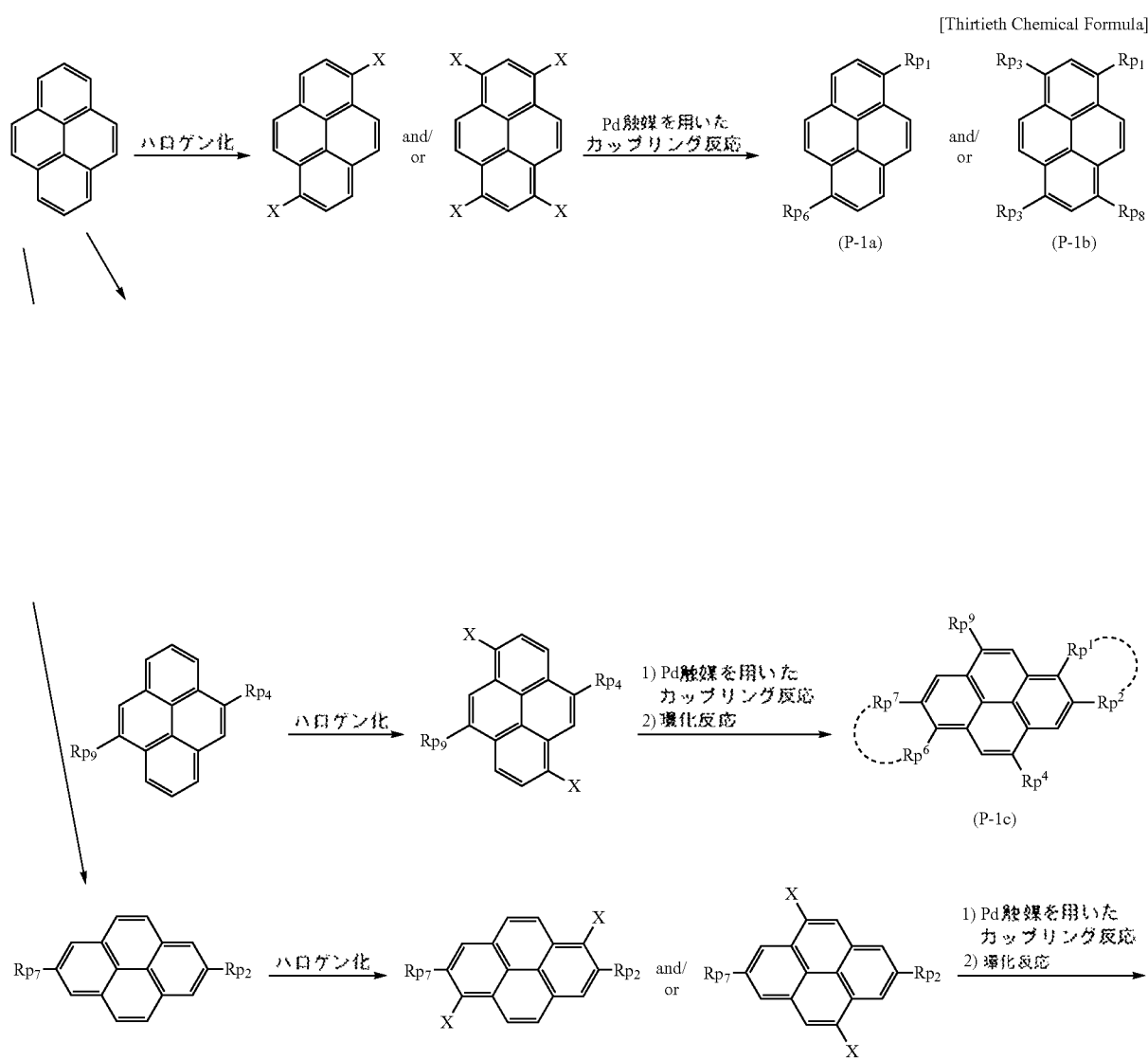

-continued

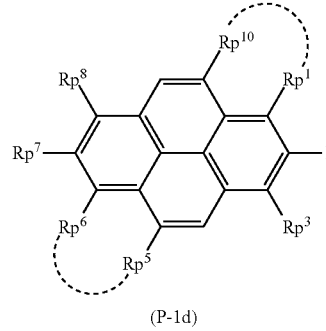

(P-1d)

and/or

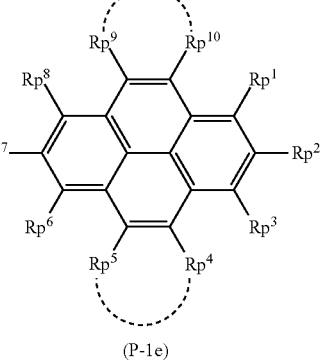

(P-1e)

[Key for the text in the chemical formula (from top to bottom and from left to right):

halogenation
halogenation
Halogenation
1) coupling reaction using Pd catalyst
2) cyclization reaction]

coupling reaction using Pd catalyst
1) coupling reaction using Pd catalyst
2) cyclization reaction In the scheme described above, $R_P^1$ to $R_P^{10}$ are defined the same as the $R_P^1$ to $R_P^{10}$ in General Formula P-1. X represents a halogen atom.

Perylene Derivatives

Any conventionally known perylene derivative can be used as the perylene derivative, but it is preferable to use a compound expressed by General Formula PE-1 below:

[Thirty-First Chemical Formula]

General Formula PE-1

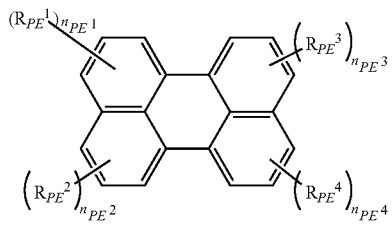

In the formula, $R_{PE}^1$ to $R_{PE}^4$ represent each independently an alkyl group, an aryl group, a heterocyclic group, an amino group, a silyl group, an ester group, an amido group, an alkoxy group, an aryloxy group, a heteroaryloxy group, an alkylthio group, or an arylthio group, and these may further have a substituent. Moreover, these may bond to each other to form a ring.

$n_{PE}^1$ to $n_{PE}^4$ represent each independently an integer from 0 to 3. When $n_{PE}^1$ to $n_{PE}^4$ are 2 or greater, the plurality of $R_{PE}^1$ to $R_{PE}^4$ [groups] may bond to each other to form a ring.

Furthermore, hydrogen atoms in the formula may be deuterium atoms.

$R_{PE}^1$ to $R_{PE}^4$ are preferably an alkyl group, an aryl group, a heterocyclic group, an amino group, a silyl group, an alkoxy group, an aryloxy group, a heteroaryloxy group, an alkylthio group, or an arylthio group and more preferably an alkyl group, an aryl group, a heterocyclic group, an amino group, or a silyl group. These groups may have a substituent, and examples of the substituent include the groups listed as the aforementioned Substituent Group A. If there are a plurality of substituents, these substituents may be linked to each other to form a ring.

$n_{PE}^1$ to $n_{PE}^4$ are preferably from 0 to 2, and 0 or 1 is more preferable.

The compound expressed by General Formula PE-1 is preferably a compound expressed by any of General Formulas PE-1a to PE-1f below.

In General Formulas PE-1a to PE-1 f, the $R_{pe}$ [groups] represent each independently an alkyl group, an aryl group, a heterocyclic group, an amino group, a silyl group, an ester group, an amido group, an alkoxy group, an aryloxy group, a heteroaryloxy group, an alkylthio group, or an arylthio group. These may further have a substituent. In addition, the $R_{pe}$ [groups] in General Formulas PE-1d to PE-1f may form each independently a five- or six-membered ring, and this ring may further have a substituent.

Moreover, hydrogen atoms in General Formulas PE-1a to PE-1f may be deuterium atoms.

$R_{pe}$ is preferably an alkyl group (methyl group, propyl group, butyl group, etc.), an aryl group (phenyl group, naphthyl group, etc.), a heterocyclic group (pyridyl group, etc.), an amino group, a silyl group, or an amide group.

Examples of the substituent which $R_{pe}$ and the ring formed by $R_{pe}$ may have include an alkyl group (methyl group, butyl group, etc.) and an aryl group (phenyl group, etc.).

[Thirty-Second Chemical Formula]

General Formula PE-1a

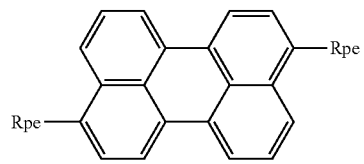

General Formula PE-1b

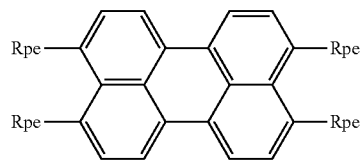

General Formula PE-1c
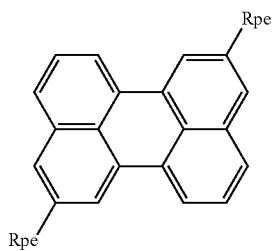
General Formula PE-1d
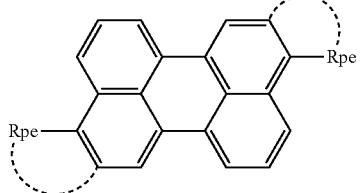
General Formula PE-1e
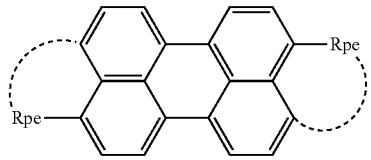
General Formula PE-1f
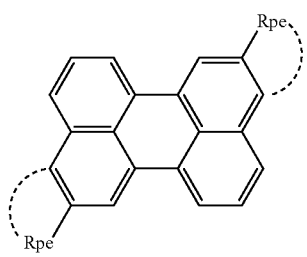
Concrete examples of the perylene derivatives that can be used in the present invention are shown below, but the present invention is not limited to or by these:

[Thirty-Third Chemical Formula]
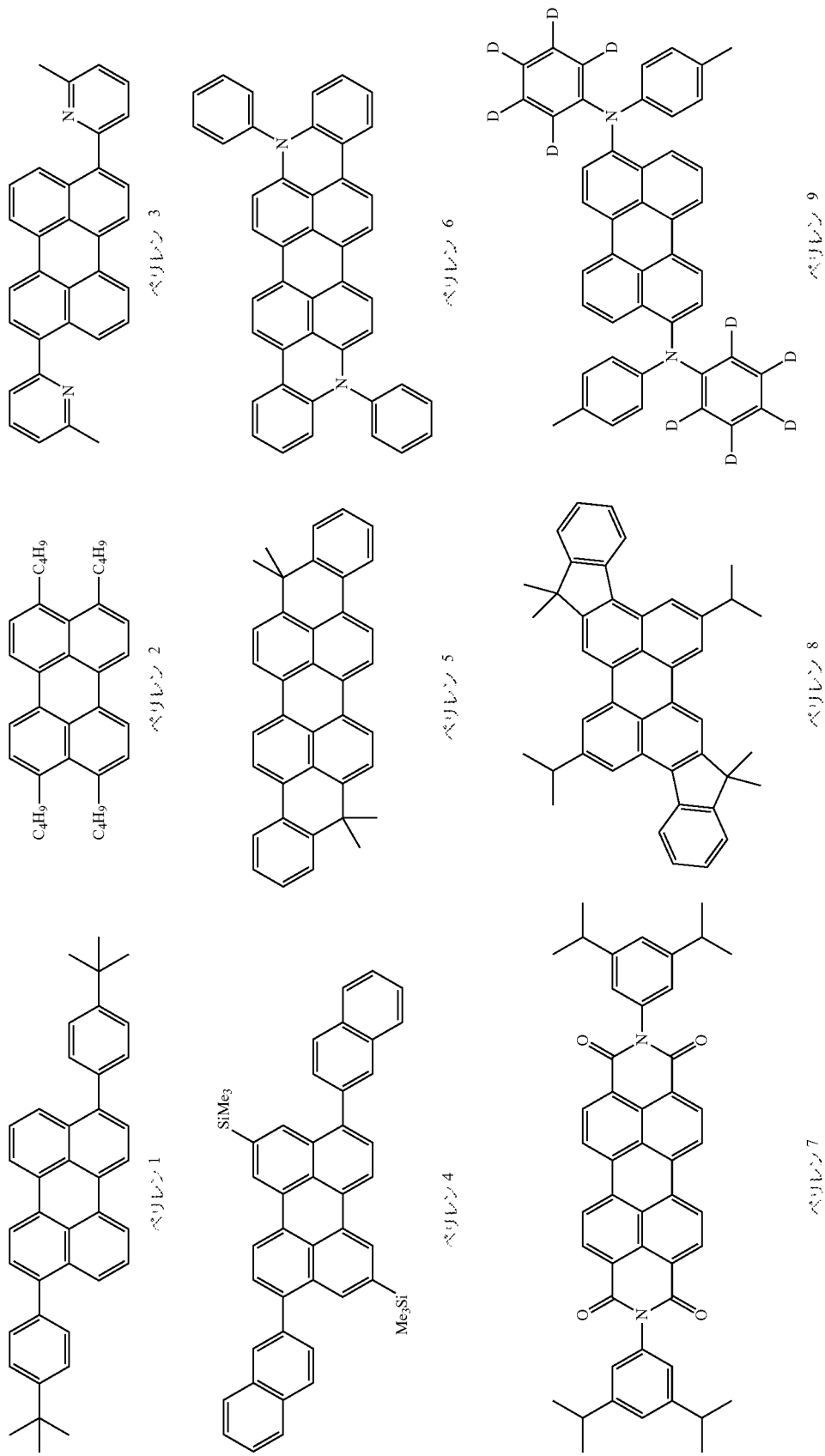
[Key for the text in the chemical formula (from top to bottom and from left to right):
perylene 1  perylene 2  perylene 3
perylene 4  perylene 5  perylene 6
perylene 7  perylene 8  perylene 9]

The perylene derivatives expressed by General Formula PE-1 can be synthesized by the following scheme:

[Thirty-Fourth Chemical Formula]
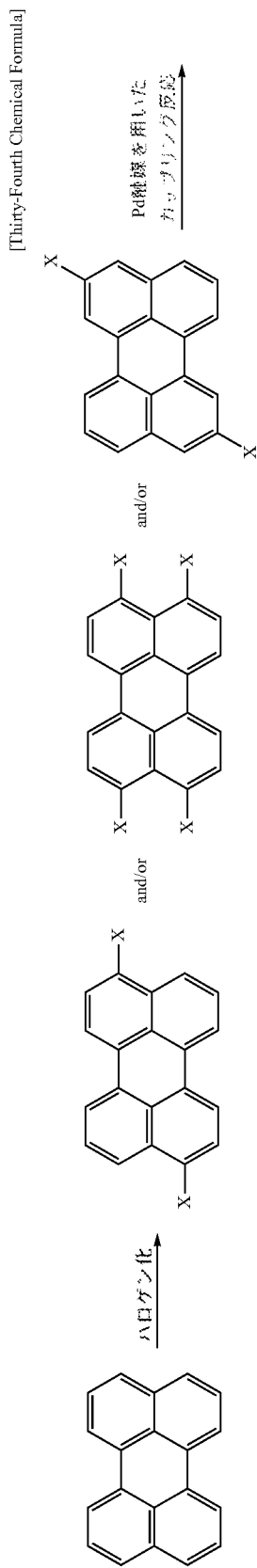
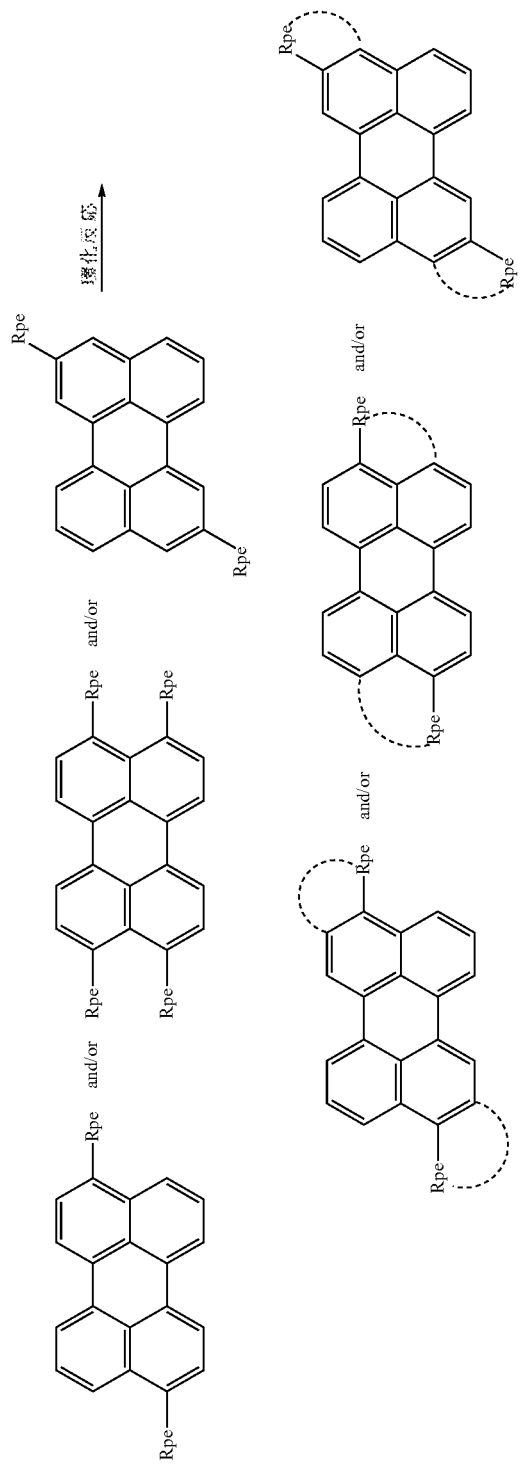
[Key for the text in the chemical formula (from top to bottom and from left to right):
halogenation
coupling reaction using Pd catalyst
cyclization reaction]

In the scheme described above, the $R_{pe}$ [groups] are defined the same as the $R_{PE}^1$ to $R_{PE}^4$ [groups] in General Formula PE-1. X represents a halogen atom.

π-Conjugated Compounds Expressed by General Formula R-1

The π-conjugated compounds expressed by General Formula R-1 will now be described. These compounds are charge transporting amine-based π-conjugated compounds that do not exhibit a distinct melting point, have a glass transition point of 60° C. or higher, and have a molecular weight in the range of 400 to 2500, and the ratio (L/D) of the length (L) and diameter (D) of the smallest diameter cylinder inscribed by the π-conjugated compound is 2.5 or more.

[Thirty-Fifth Chemical Formula]

General Formula R-1

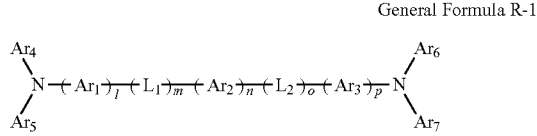

(Here, $Ar_1$ to $Ar_3$ represent each independently a divalent $C_6$ to $C_{30}$ aromatic hydrocarbon group, $Ar_4$ to $Ar_7$ represent each independently a $C_6$ to $C_{30}$ aromatic hydrocarbon group, the two aromatic hydrocarbon groups that make up $Ar_4$ and $Ar_5$ may bond via a direct bond or via a substituent to form a condensed heterocycle with the nitrogen atoms which $Ar_4$ and $Ar_5$ replace, and the two aromatic hydrocarbon groups that make up $Ar_6$ and $Ar_7$ may bond via a direct bond or via a substituent to form a condensed heterocycle with the nitrogen atoms which $Ar_6$ and $Ar_7$ replace. $L_1$ and $L_2$ represent each independently a vinylene group or an acetylene group. l, m, n, o, and p represent each independently an integer from 0 to 6, but one of l, n, and p is not 0.)

Preferable examples of the π-conjugated compounds expressed by General Formula R-1 are the π-conjugated compounds expressed by General Formula R-2 or R-3 below:

[Thirty-Sixth Chemical Formula]

General Formula R-2

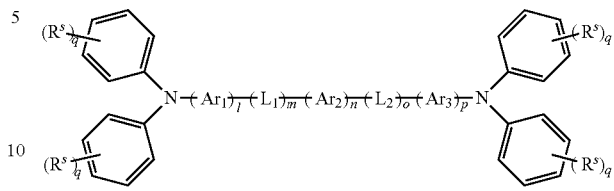

(Here, $Ar_1$ to $Ar_3$, $L_1$, $L_2$, and l to p mean the same as in General Formula R-1. The $R^s$ [groups] represent each independently a substituent. The q [groups] represent each independently an integer from 0 to 5.)

[Thirty-Seventh Chemical Formula]

General Formula R-3

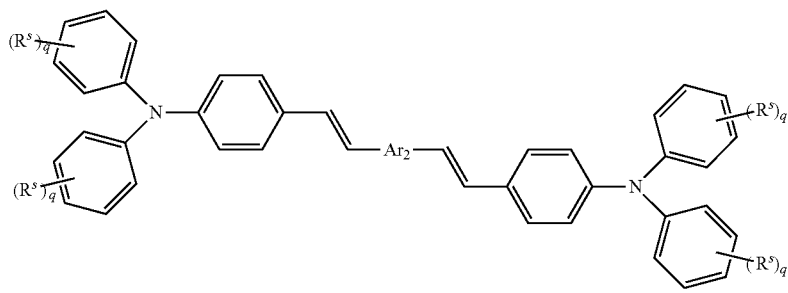

(Here, $Ar_2$ means the same as in General Formula R-1. The $R^s$ [groups] represent each independently a substituent. The q [groups] represent each independently an integer from 0 to 5.)

The π-conjugated compounds expressed by General Formula R-1 above are charge transporting amine-based π-conjugated compounds that do not exhibit a distinct melting point, have a glass transition point of 60° C. or higher, and have a molecular weight in the range of 400 to 2500. Furthermore, the ratio (L/D) of the length (L) and diameter (D) of the smallest diameter cylinder inscribed by this π-conjugated compound is 2.5 or more. Here, L/D is a numerical value that defines the length of the molecule of the π-conjugated compound; the larger the value, the longer [the molecule]. The orientation control has a greater effect with a slender molecule. Therefore, L/D is preferably within a range of 3 to 10. Moreover, the amine-based π-conjugated compound is preferably a compound having an amino group or an N-heterocyclic group at the end of the compound skeleton (the aromatic ring-containing skeleton). The compounds expressed by General Formula R-1 include compounds expressed by General Formula R-2 and General Formula R-3.

The aforementioned amino group is preferably an aromatic amino group represented by $-N(Ar)_2$ (where Ar is an aromatic group). In addition, the N-heterocyclic group is a cyclic amino group and is preferably an N-heterocyclic group such as an N-carbazolyl group, an N-phenoxazinyl group, or an N-phenothiazinyl group bonded at a nitrogen atom at the end of the compound skeleton.

In General Formula R-1, $Ar_1$ to $Ar_3$ represent each independently a divalent $C_6$ to $C_{30}$ aromatic hydrocarbon group, $Ar_4$ to $Ar_7$ represent each independently a $C_6$ to $C_{30}$ aromatic hydrocarbon group, and $Ar_4$ and $Ar_5$, and $Ar_6$ and $Ar_7$ are such that the two aromatic hydrocarbon groups constituting $Ar_4$ and $Ar_5$, and $Ar_6$ and $Ar_7$ may bond via a direct bond or via a substituent to form a condensed heterocycle with the N replaced by $Ar_4$ and $Ar_5$, and $Ar_6$ and $Ar_7$. Furthermore, —$NAr_6Ar_7$ or —$NAr_6$ and $Ar_7$ may form a cyclic amino group. The condensed heterocycle here shall be understood to be a structure in which there is a heterocycle including an N in the center, and there is an aromatic hydrocarbon group condensed on both sides of this. In concrete terms, an N-carbazolyl group is an example, but a tricyclic compound is not the only option, and it may be tetracyclic or higher and may have a substituent.

$L_1$ and $L_2$ represent each independently a vinylene group or an acetylene group.

l, m, n, o, and p represent each independently an integer from 0 to 6, but one of l, n, and p is not 0. The total of l, m, n, o, and p is preferably within a range of 2 to 10, and this is related to the aforementioned L/D [ratio]. Moreover, if l, m, n, o, or p is an integer greater than 6, the molecular weight of the π-conjugated compound will be [too] high, and this will make it more difficult to form a film by vapor deposition. Therefore, it is preferable for l, m, n, o, and p to be integers from 0 to 3 and for one of l, n, and p to be an integer that is not 0.

The aforementioned π-conjugated compound is preferably such that the ratio (L/D) of the diameter (D) and length (L) of the smallest diameter cylinder inscribed by the molecule of the π-conjugated compound is 2.5 or more. When L/D increases, the molecular weight of the π-conjugated compound is larger, which is undesirable because it is more difficult to form a film by vapor deposition. [This ratio is] preferably at least 2.5 and no more than 10.0 and especially preferably at least 2.5 and no more than 5.0.

Of the compounds expressed by General Formula R-1, preferable compounds are compounds expressed by General Formula R-2 and General Formula R-3.

In General Formula R-2, $Ar_1$ to $Ar_3$, $L_1$, $L_2$, and 1 to p have the same meanings as $Ar_1$ to $Ar_3$, $L_1$, $L_2$, and l to p in General Formula R-1. In addition, $Ar_2$ in General Formula R-3 means the same as $Ar_2$ in General Formula R-1.

In General Formulas R-2 and R-3, the $R^s$ [groups] represent each independently a substituent, and the groups listed as the aforementioned Substituent Group A can be used as needed as this substituent. The substituent represented by $R^s$ is preferably an alkyl group.

The q [groups] represent each independently an integer from 0 to 5, preferably an integer from 0 to 3, and more preferably 0 or 1.

In General Formula R-1, $Ar_1$ to $Ar_3$ are [each] a divalent hydrocarbon-based aromatic group produced by taking two hydrogens from a $C_6$ to $C_{30}$ hydrocarbon-based aromatic compound, and $Ar_4$ to $Ar_7$ are [each] a monovalent hydrocarbon-based aromatic group produced by taking one hydrogen from a $C_6$ to $C_{30}$ hydrocarbon-based aromatic compound. Examples of such hydrocarbon-based aromatic compounds include benzene, biphenyl, and terphenyl, as well as naphthalene, anthracene, tetracene, phenanthrene, chrysene, coronene, fluorene, and other such condensed ring structures. Examples of aromatic hydrocarbon compounds that give the aforementioned hydrocarbon-based aromatic group are shown below, but this list is not intended to be exhaustive. The following examples are examples in which there is no substituent, but as long as the carbon number is within the range given above, there may be a substituent such as an alkyl group:

[Thirty-Eighth Chemical Formula]

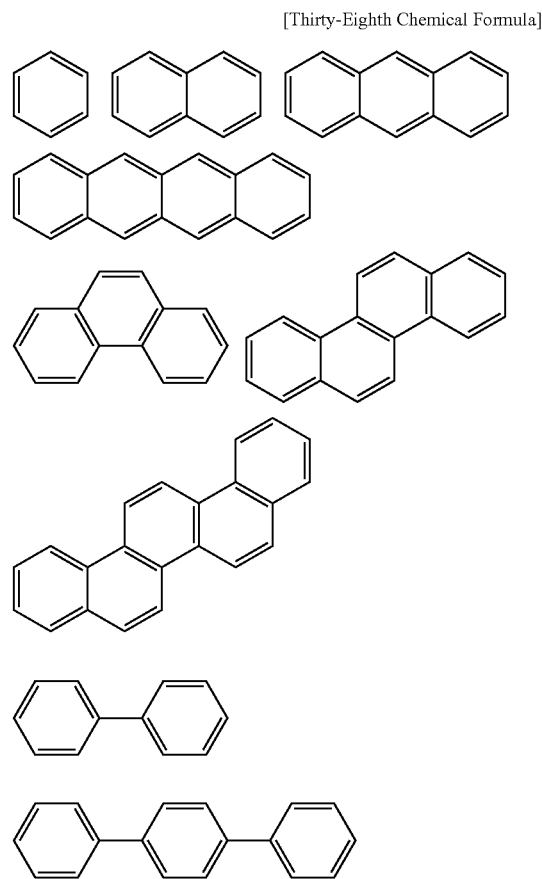

The aforementioned π-conjugated compound does not exhibit a distinct melting point and has a glass transition point of 60° C. or higher. The Tg is preferably 60 to 300° C. It is undesirable for the Tg to exceed this temperature because this will entail a considerable burden on the equipment in order to control the substrate temperature during vapor deposition film formation, or sublimation of the π-conjugated compound formed on the substrate will occur. Furthermore, the molecular weight of this π-conjugated compound is within the range of 400 to 2500 and preferably within the range of 400 to 1000. Forming a film by vapor deposition will be difficult if this molecular weight is exceeded.

Concrete examples of the π-conjugated compound expressed by General Formula R-1 are given below, but these are not limiting in nature.

[Thirty-Ninth Chemical Formula]
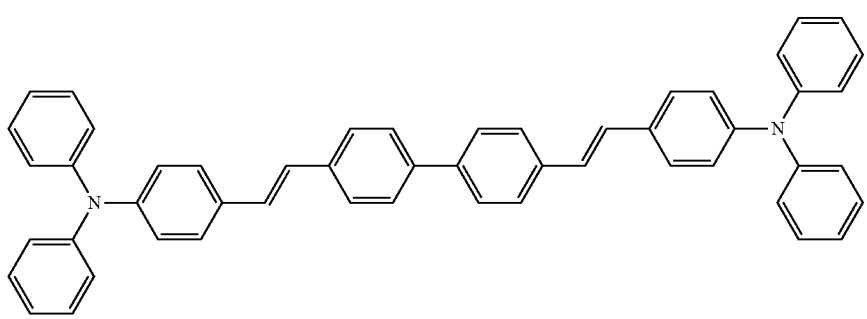
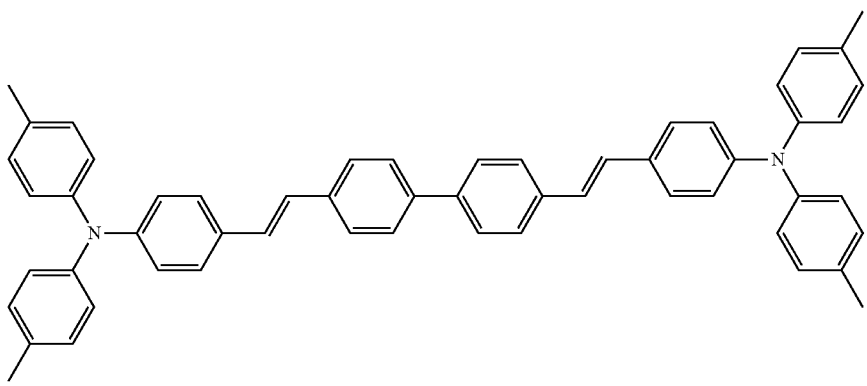
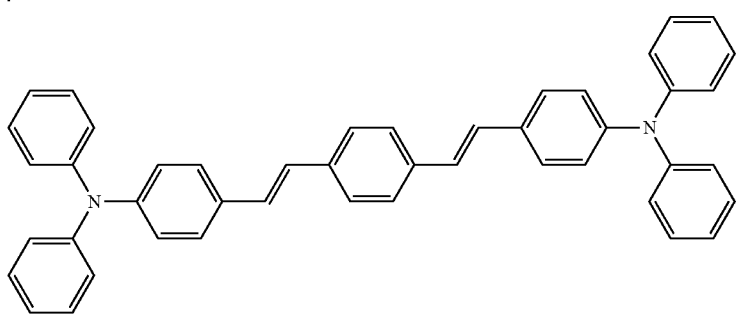
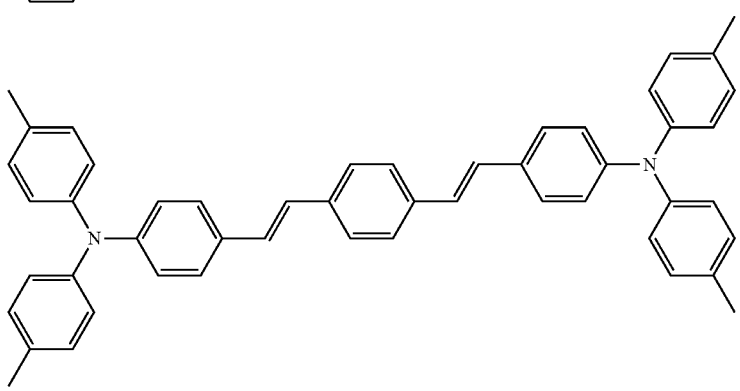
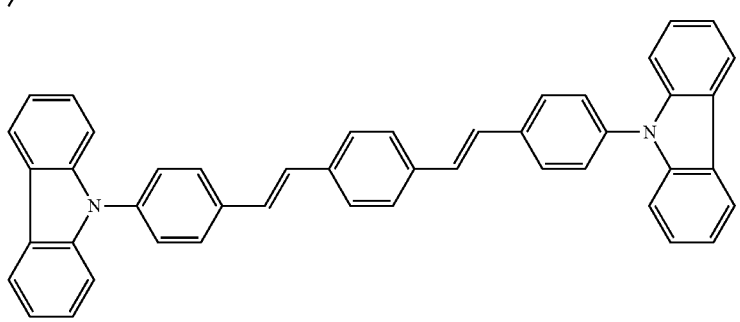

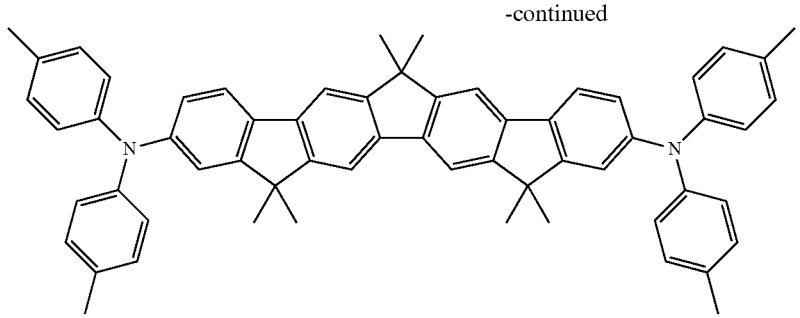

The pyrene derivatives expressed by General Formulas P-1a to P-1d above and the π-conjugated compounds expressed by General Formula R-1 above are preferable as the fluorescent material in the present invention, the π-conjugated compounds expressed by General Formula R-1 above and pyrene derivatives with high symmetry, such as compounds 128, 129, and 133 to 179 given above, are more preferable, and the π-conjugated compounds listed in the concrete examples given above are especially preferable. The aforementioned π-conjugated compounds and the aforementioned pyrene derivatives can realize a high degree of orientation (S).

There are no particular restrictions on the thickness of the light-emitting layer, but in general, it is preferably from 2 to 500 nm, and from the standpoint of external quantum efficiency, it is more preferably from 3 to 200 nm and even more preferably from 5 to 100 nm.

The light-emitting layer in the element of the present invention may be constituted solely from a light-emitting material or may also be made up of a mixed layer of a host material and a light-emitting material. There may be just one type of light-emitting material, or two or more types may be used. The host material is preferably a charge transport material. There may be just one type of host material, or two or more types may be used, examples of which include a mixed configuration of an electron transporting host material and a hole transporting host material.

Furthermore, a material which does not have a charge transporting property and does not emit light may also be included in the light-emitting layer.

Moreover, the light-emitting layer may be a single layer or a multilayer of two or more layers, and each of the light-emitting layers may also emit light of a different color.

In addition, in the light-emitting layer, it is also preferable for a host material or the like other than the light-emitting material to be a planar material.

The amount of the light-emitting material contained in the light-emitting layer of the present invention is preferably 0.1 to 30 wt %, more preferably 1 to 25 wt %, and especially preferably 5 to 20 wt %.

<Host Material>

The aforementioned light-emitting layer preferably further contains a host material. The host material may be a hole transporting host material or an electron transporting host material, but a hole transporting host material can be used [sic].

The following compounds may be contained as the host material to be used in the present invention. Examples include pyrrole, indole, carbazole (such as CBP(4,4'-di(9-carbazoyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin-based compounds, polysilane-based compounds, poly(N-vinylcarbazole), aniline-based copolymers, conductive macromolecular oligomers such as thiophene oligomers and polythiophene, organosilanes, carbon films, pyridine, pyrimidine, triazine, imidazole, pyrazole, triazole, oxazole, oxadiazole [sic][9], fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic acid anhydrides such as naphthalene and perylene, phthalocyanine, and a variety of metal complexes typified by metal complexes of an 8-quinolinol derivative, metal phthalocyanine, and metal complexes having benzoxazole or benzothiazole as a ligand, and derivatives of these (which may have a substituent or a condensed ring), as well as aromatic hydrocarbon compounds such as triphenylene derivatives.

[9] Translator's note: "imidazole," "pyrazole," "triazole," "oxazole," and "oxadiazole" are repeated in this list in the original.

The host material in the present invention is preferably a planar host material from the standpoint of the orientation of the light-emitting material, more preferably a triphenylene derivative or a carbazole compound such as those described later, and even more preferably a triphenylene derivative.

In the light-emitting layer of the present invention, from the standpoints of color purity, luminous efficiency, and drive durability, it is preferable for the lowest excited triplet energy ($T_1$ energy) of the aforementioned host material to be higher than the $T_1$ energy of the aforementioned light-emitting material.

Furthermore, there are no particular restrictions on the amount of the host material contained in the light-emitting layer of the present invention, but from the standpoints of luminous efficiency and drive voltage, it is preferably at least 15 wt % and no more than 95 wt % with respect to the total weight of the compounds which form the light-emitting layer.

In the present invention, it is preferable to include at least one compound expressed by General Formula 4-1 or 4-2, which are carbazole compounds, as a host material.

The compound expressed by General Formula 4-1 or 4-2 is preferably contained in the light-emitting layer in an amount of 30 to 99 wt %, more preferably 40 to 97 wt %, and especially preferably 50 to 95 wt %. Moreover, if a compound expressed by General Formula 4-1 or 4-2 is used in a plurality of organic layers, then it is preferably contained within the aforementioned range in each of those layers.

A compound expressed by General Formula 4-1 or 4-2 may be contained as a single type in any of the organic layers, or a combination of a plurality of compounds expressed by General Formula 4-1 or 4-2 may be contained in the desired ratio.

The aforementioned host material is preferably a compound expressed by General Formula 4-1 or 4-2 below:

[Fortieth Chemical Formula]

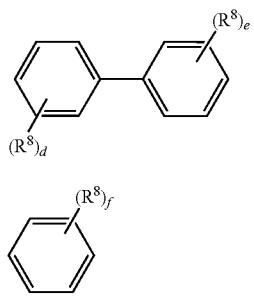

(4-1)

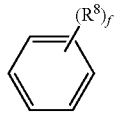

(4-2)

(In General Formulas 4-1 and 4-2, d and e represent integers from 0 to 3, and at least one of these is 1 or greater. f represents an integer from 1 to 4. $R^8$ represents a substituent, and if there are a plurality of $R^8$ [groups], the $R^8$ [groups] may be the same as or different from each other. In addition, at least one of the $R^8$ [groups] represents a carbazole group expressed by General Formula 5 below:)

[Forty-First Chemical Formula]

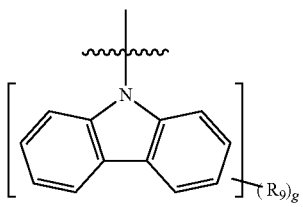

(5)

(In General Formula 5, $R_9$ [groups] represent each independently a substituent. g represents an integer from 0 to 8.)

The $R^8$ [groups] represent each independently a substituent, and in concrete terms, they are a halogen atom, an alkoxy group, a cyano group, a nitro group, an alkyl group, an aryl group, a heterocyclic group, or a substituent expressed by General Formula 5. If $R^8$ does not represent [a carbazole group expressed by] General Formula 5, it is preferably a $C_{10}$ or lower alkyl group or a substituted or unsubstituted $C_{10}$ or lower aryl group, with a $C_6$ or lower alkyl group being more preferable.

The $R_9$ [groups] represent each independently a substituent, and in concrete terms, they are a halogen atom, an alkoxy group, a cyano group, a nitro group, an alkyl group, an aryl group, or a heterocyclic group, preferably a $C_{10}$ or lower alkyl group or a $C_{10}$ or lower substituted or unsubstituted aryl group, and more preferably a $C_6$ or lower alkyl group.

g is an integer from 0 to 8, and from a standpoint of not excessively blocking the carbazole skeleton that handles charge transport, 0 to 4 is preferable. Furthermore, from the standpoint of ease of synthesis, if the carbazole has a substituent, it preferably has a substituent that is in symmetry with respect to the nitrogen atom.

In General Formula 4-1, from the standpoint of maintaining charge transport performance, the sum of d and e is preferably 2 or greater. Moreover, $R^8$ is preferably substituted in the meta [position] with respect to the other benzene ring. The reason for this is that with the ortho substitution, the bond is easily broken because of the high steric hindrance of the adjacent substituents, so durability suffers. In addition, with para substitution, the molecular shape approaches a rigid rod shape, making it more likely that element degradation will occur under high temperature conditions because crystallization is more apt to occur. In concrete terms, the compound preferably is expressed by the following structure:

[Forty-Second Chemical Formula]

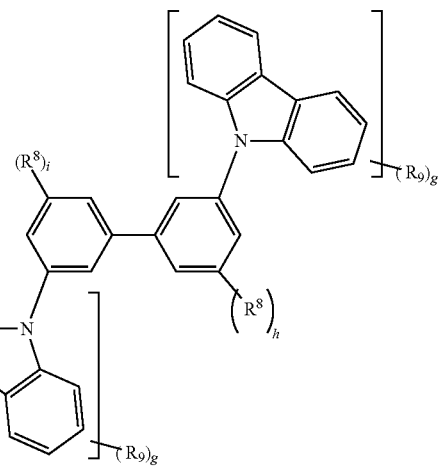

In the formula described above, $R^8$ has the same meaning as $R^8$ in General Formula 4-1, and h and i are each independently 0 or 1 and preferably 0.

The $R_9$ [groups] represent each independently a substituent. g is an integer from 0 to 8.

The preferred ranges for $R_9$ and g are the same as those in General Formula 5 above.

In General Formula 4-2, from the standpoint of maintaining charge transport performance, f is preferably 2 or greater. If f is 2 or 3, the $R^8$ [groups] are preferably substituted in the meta [position] to each other, for the same reason. In concrete terms, the compound is preferably expressed by the following structure:

[Forty-Third Chemical Formula]

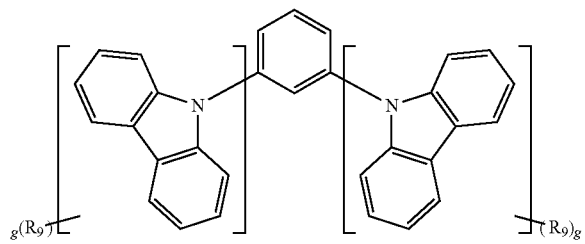

The $R_9$ [groups] in the formula described above represent each independently a substituent. g is an integer from 0 to 8.

The preferred ranges of $R_9$ and g are the same as those in General Formula 5 above.

If there is a hydrogen atom in General Formulas 4-1 and 4-2, isotopes of hydrogen (such as a deuterium atom) are also included. In this case, all of the hydrogen atoms in the compound may be replaced with hydrogen isotopes, or the compound may be a mixture in which just some of the hydrogens are hydrogen isotopes. Preferably, $R_9$ in General Formula 5 is replaced by deuterium, and the following structure is an especially preferable example:

[Forty-Fourth Chemical Formula]

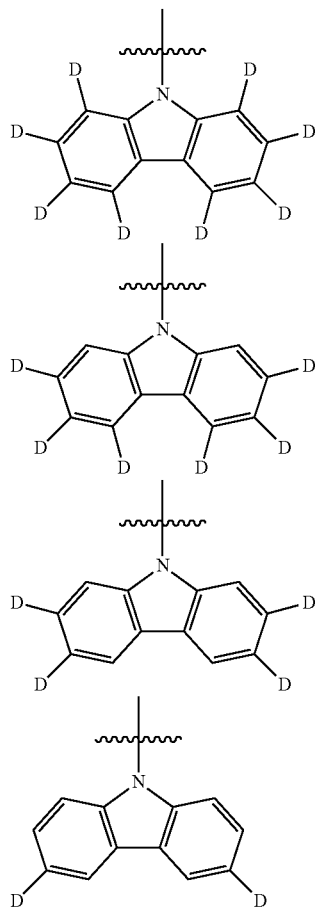

Atoms further constituting a substituent also encompass isotopes thereof.

Compounds expressed by General Formulas 4-1 and 4-2 can be synthesized by combining various publicly known synthesis methods. Most commonly, for a carbazole compound, an example involves synthesis by dehydroaromatization following Aza-Cope rearrangement of a condensate of a cyclohexane derivative and aryl hydrazine (*Seimitsu Yuuki Gousei* [Precision Organic Synthesis], by L. F. Tieze and Th. Eicher, translated by Takano and Ogasawara, p. 339 (published by Nankodo)). Furthermore, regarding a coupling reaction of an aryl halide compound and the obtained carbazole compound using a palladium catalyst, examples include methods described in *Tetrahedron Letters*, vol. 39, p. 617 (1998), ibid., vol. 39, p. 2367 (1998), ibid., vol. 40, p. 6393 (1999). There are no particular restrictions on the reaction temperature or duration, and the conditions given in the aforementioned documents can be applied. Moreover, for some compounds such as mCP, commercially available ones can be used favorably.

The compounds expressed by General Formulas 4-1 and 4-2 in the present invention are preferably formed as a thin layer in a vacuum vapor deposition process, but a wet process such as solution coating can also be favorably used. From the standpoints of solubility and vapor deposition suitability, the molecular weight of the compound is preferably 2000 or lower, more preferably 1200 or lower, and especially preferably 800 or lower. In addition, from the standpoint of vapor deposition suitability, it is preferably 250 or higher and especially preferably 300 or higher because if the molecular weight is too low, the vapor pressure will be low, there will be no change from the vapor phase to the solid phase, and it will be difficult to form an organic layer.

General Formulas 4-1 and 4-2 are preferably compounds with the structures shown below or in which one or more of the hydrogen atoms have been replaced by deuterium atoms.

[Forty-Fifth Chemical Formula]

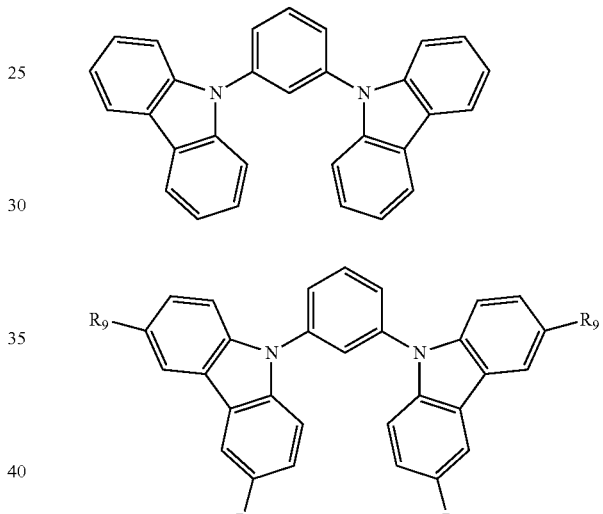

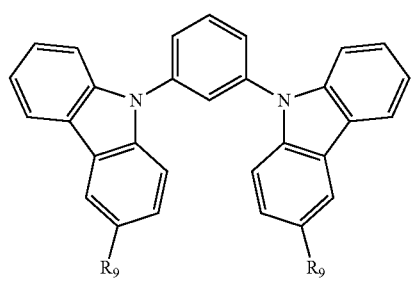

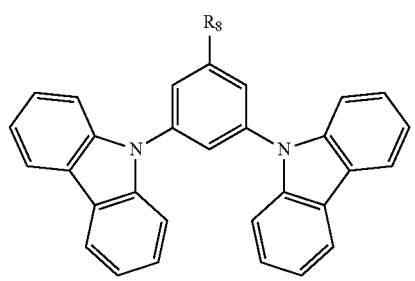

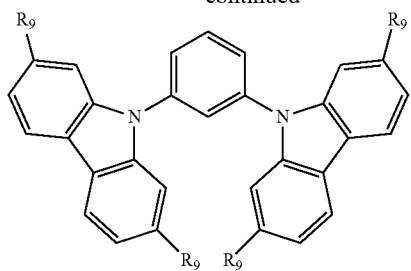
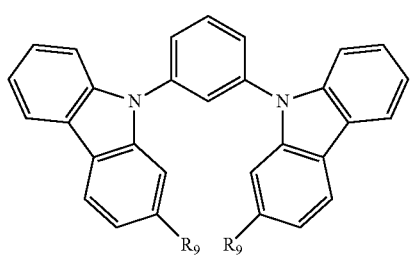
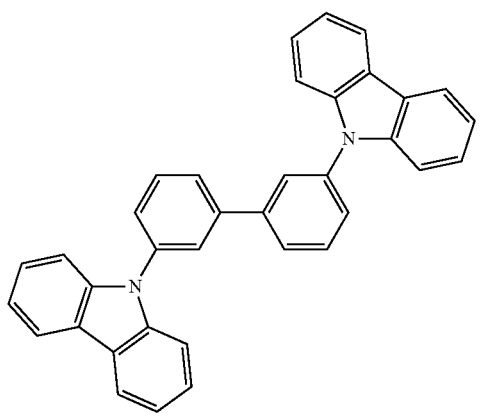
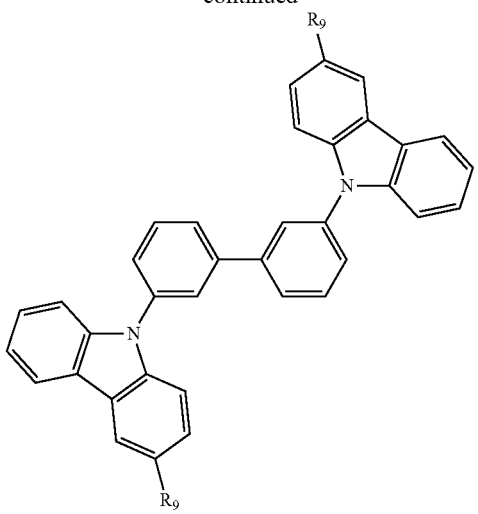
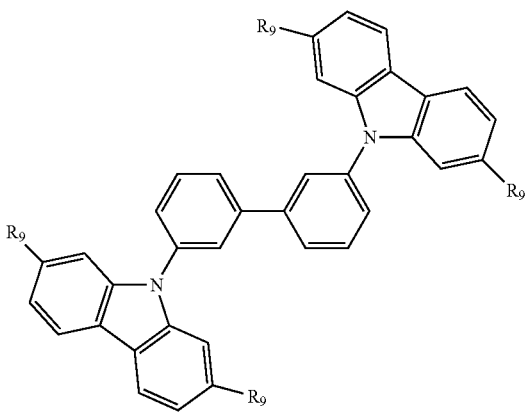
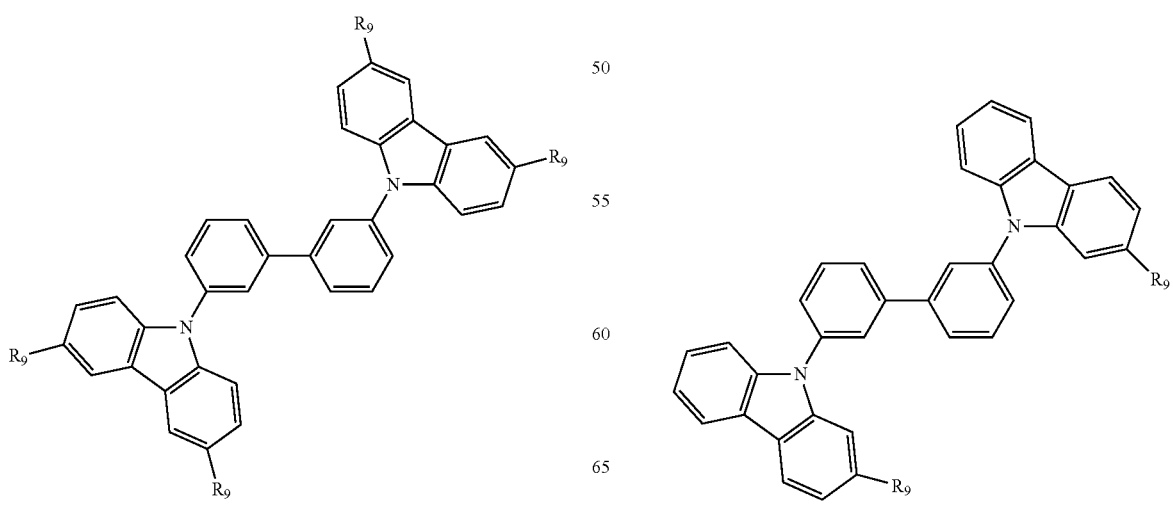

-continued
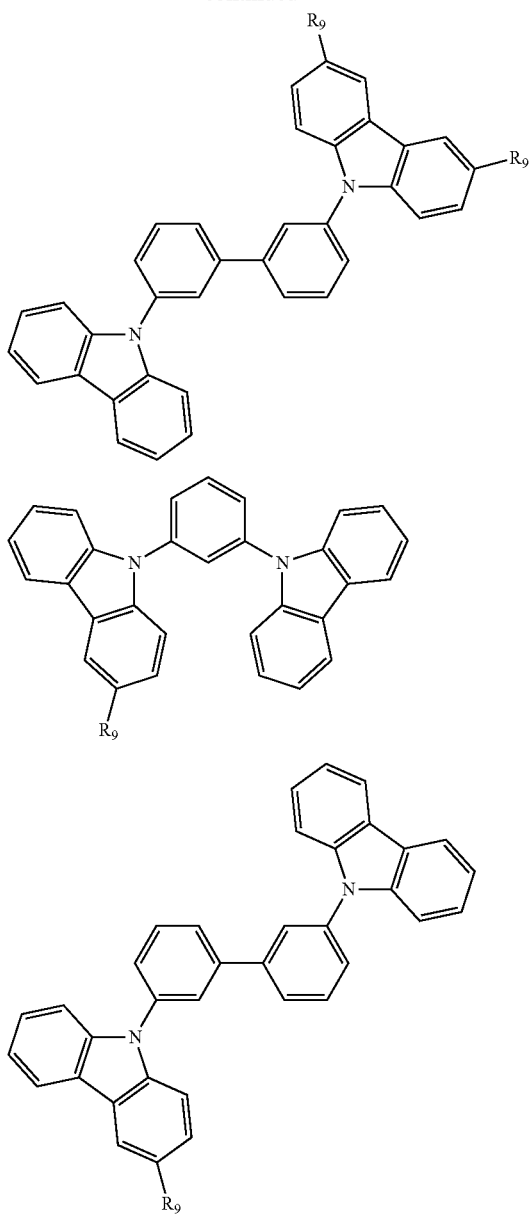
$R_8$ and $R_9$ in the above formula represent each independently a substituent.
Concrete examples of the compounds expressed by General Formulas 4-1 and 4-2 in the present invention are given below, but the present invention is not limited to or by these:
[Forty-Sixth Chemical Formula]
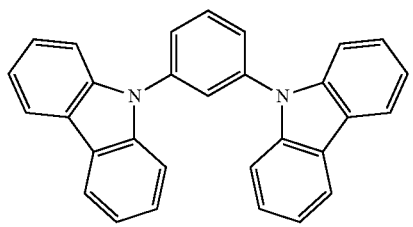
-continued
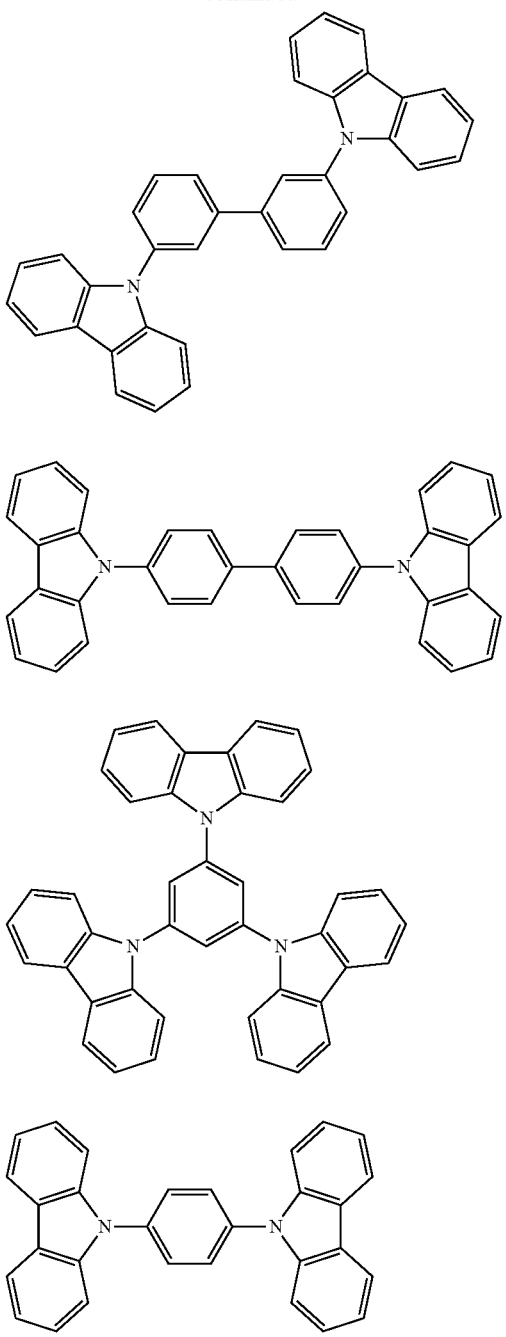
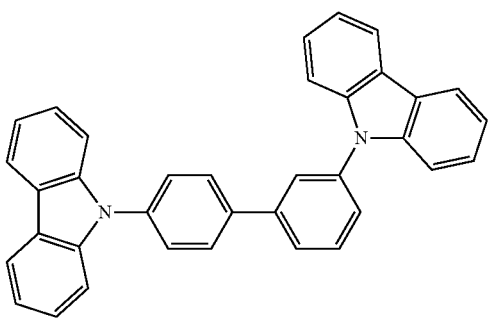

113
-continued
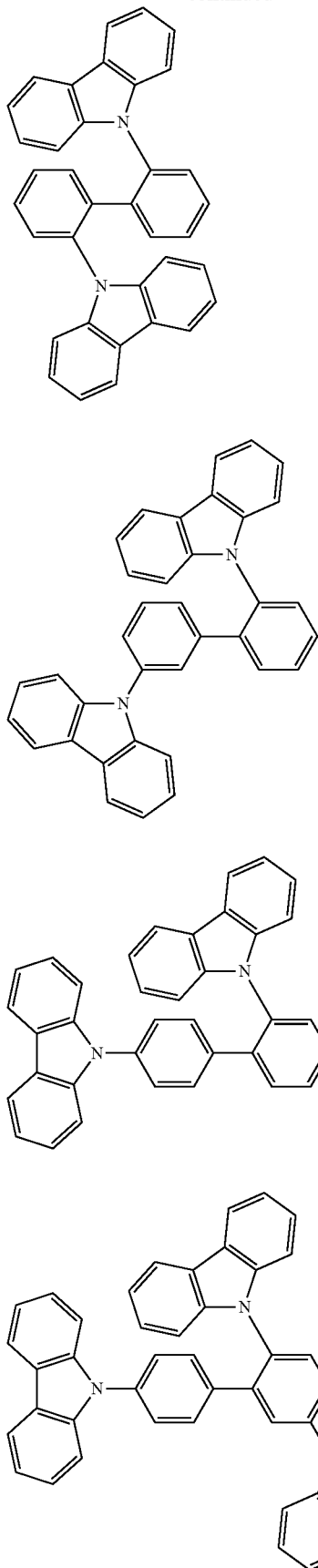
114
-continued
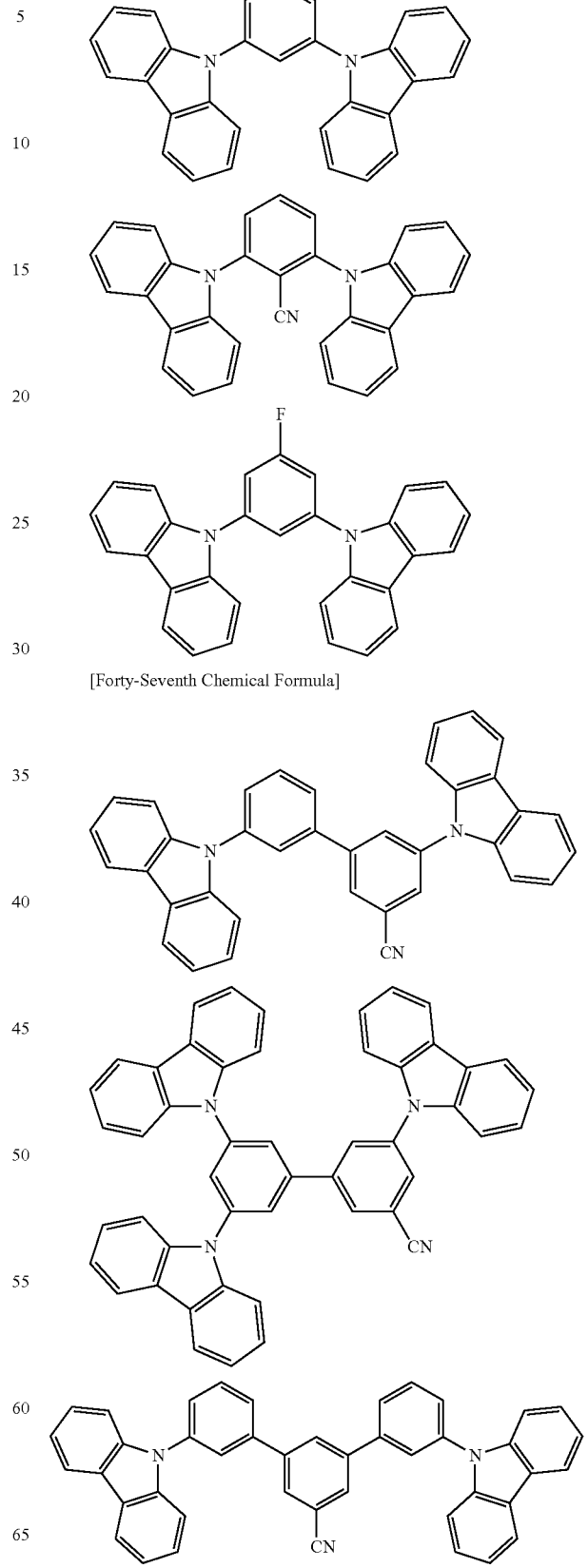
[Forty-Seventh Chemical Formula]

[Forty-Eighth Chemical Formula]
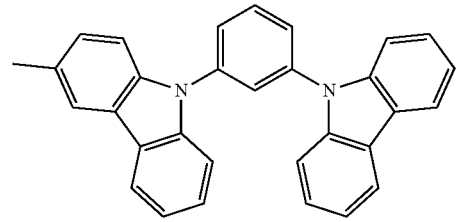
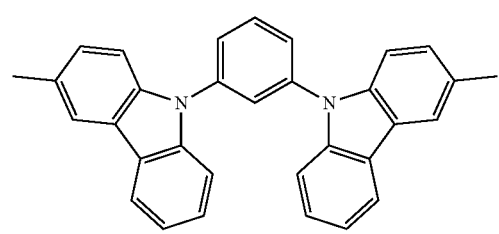
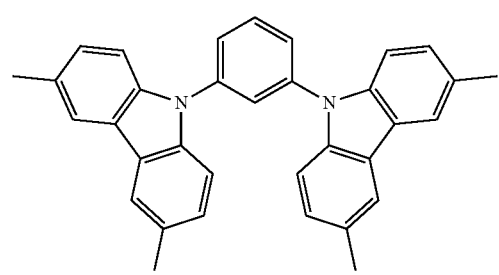
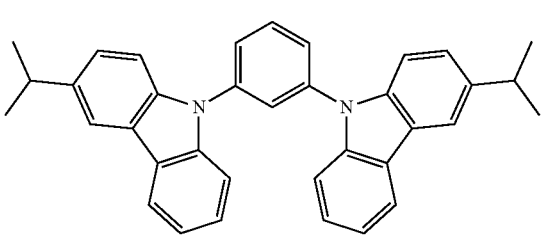
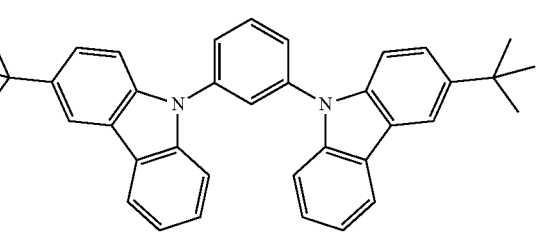
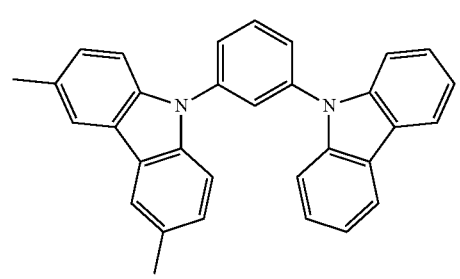
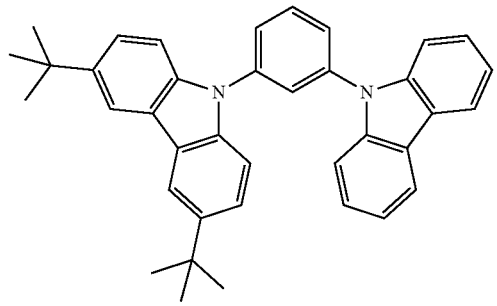
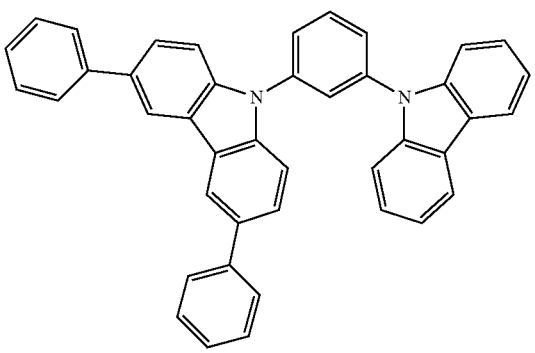
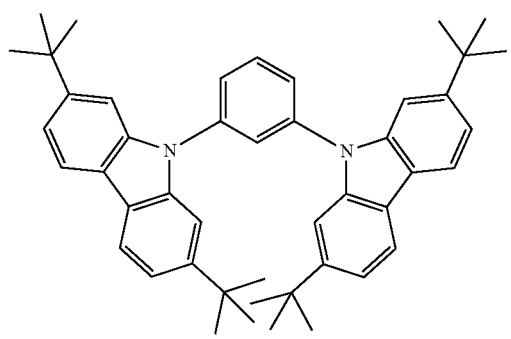
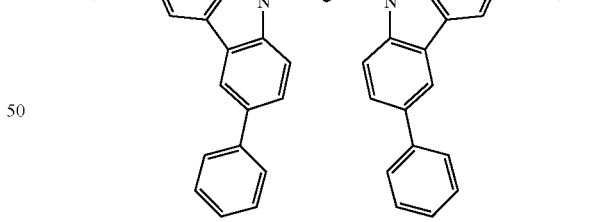
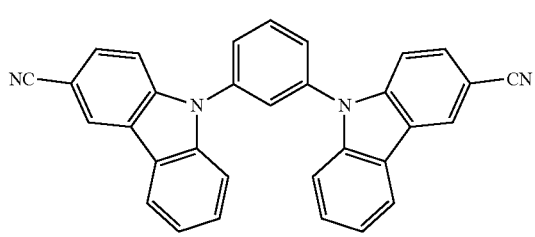

117
-continued
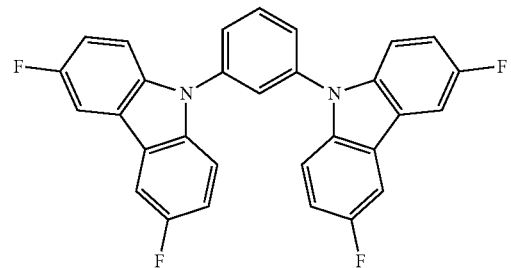
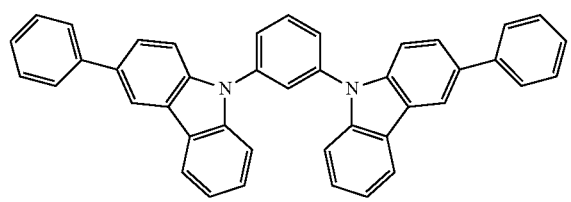
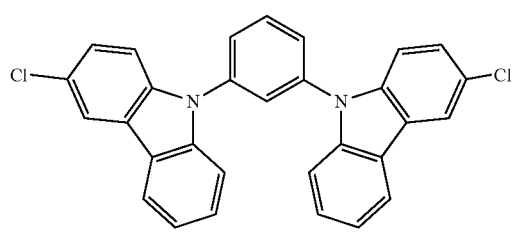
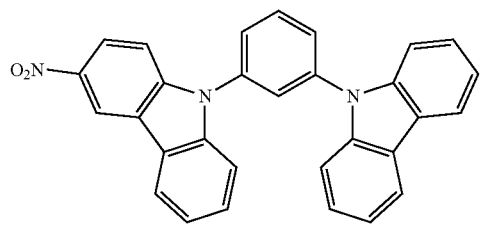
[Forty-Ninth Chemical Formula]
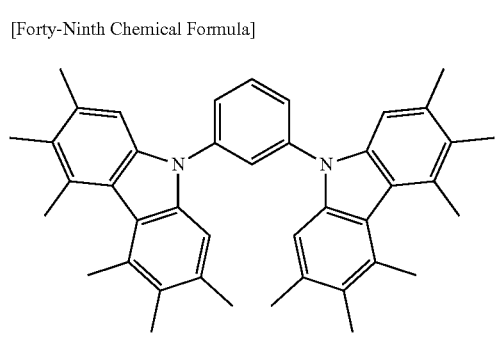
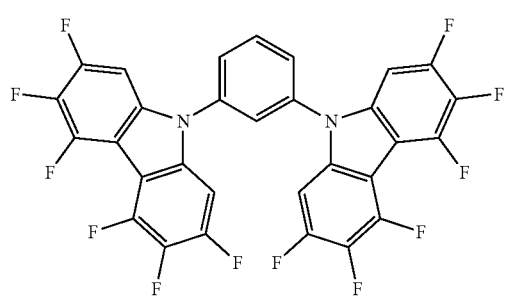
118
-continued
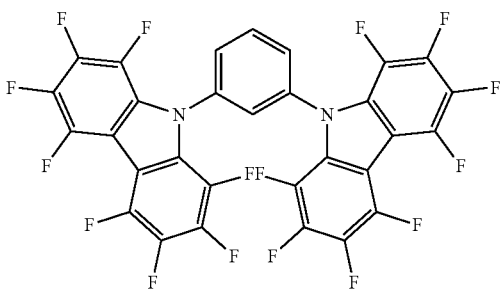
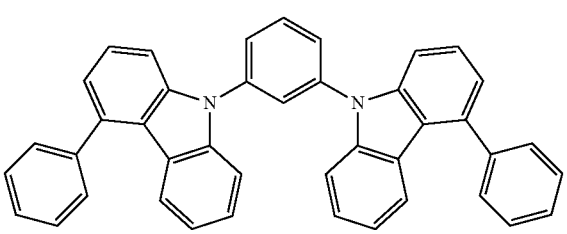
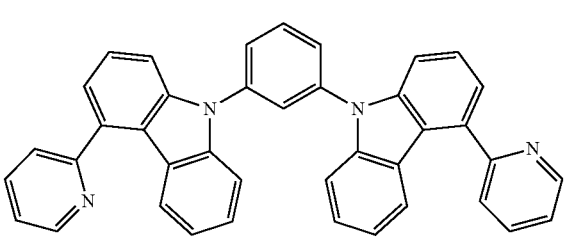
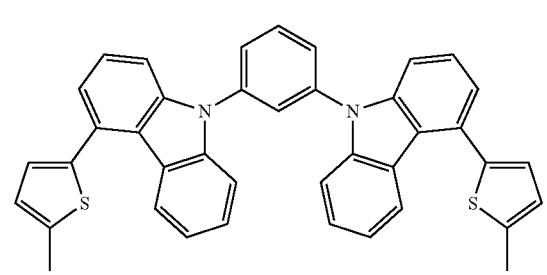
[Fiftieth Chemical Formula]
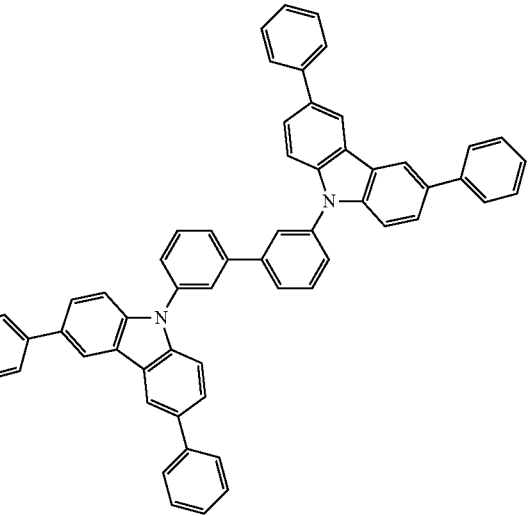

119
-continued
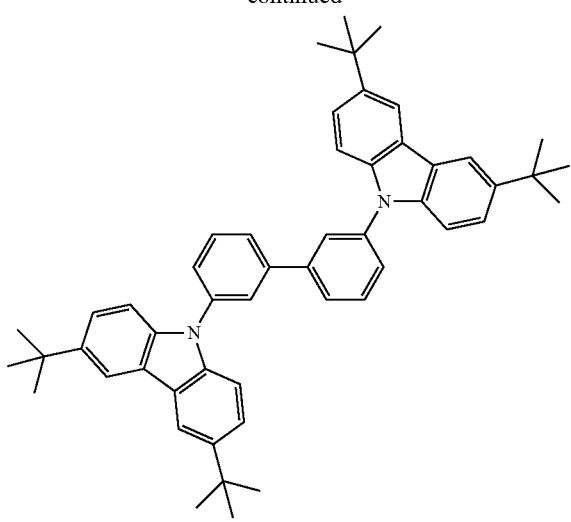
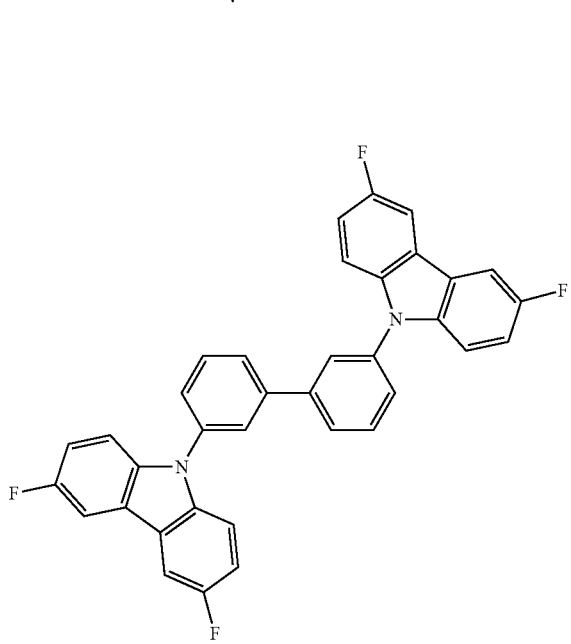
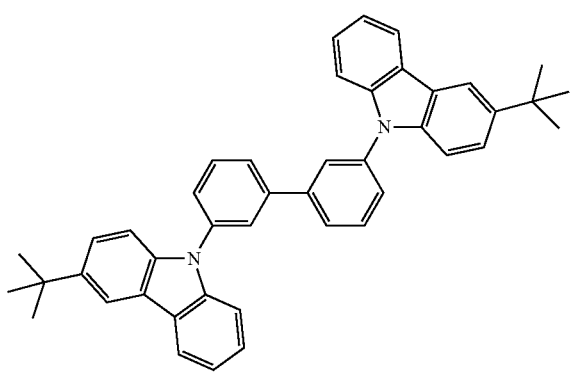
120
-continued
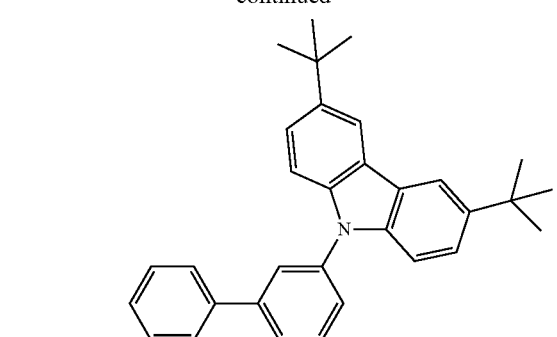
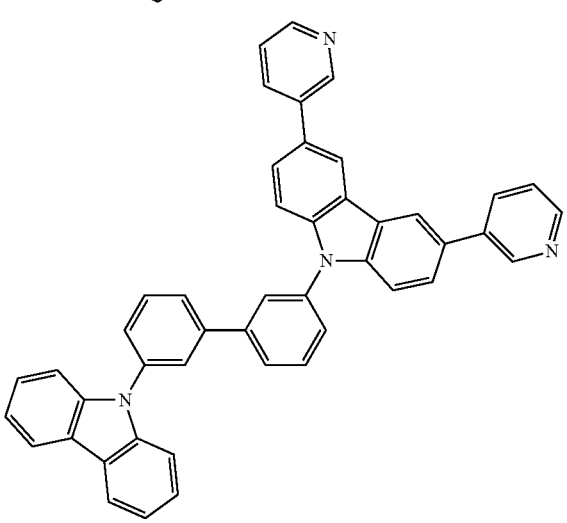
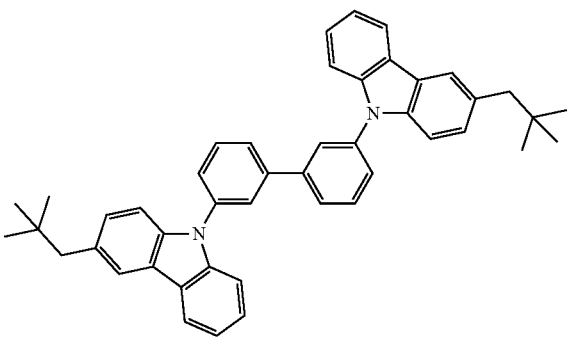
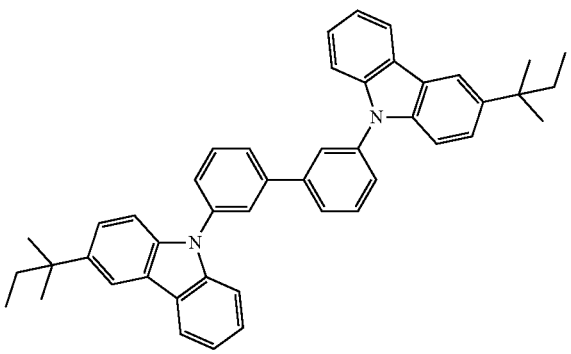

121
-continued
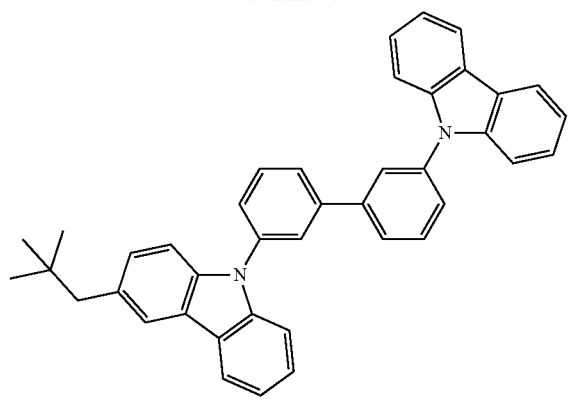
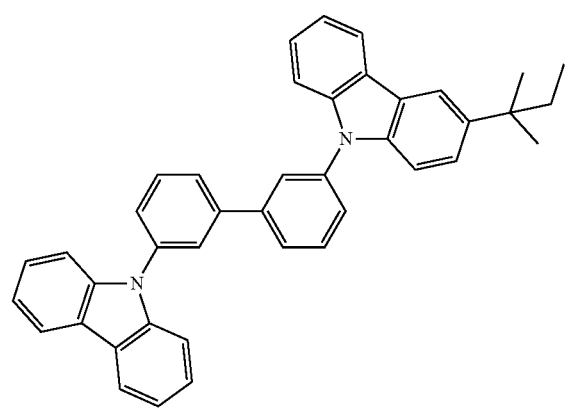
[Fifty-First Chemical Formula]
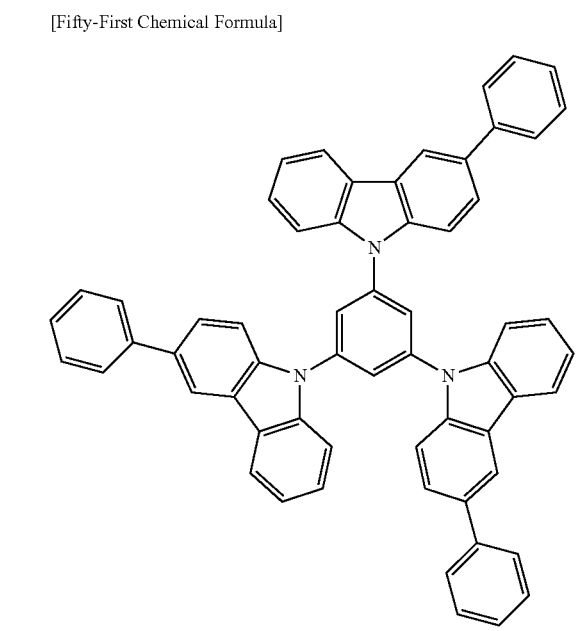
122
-continued
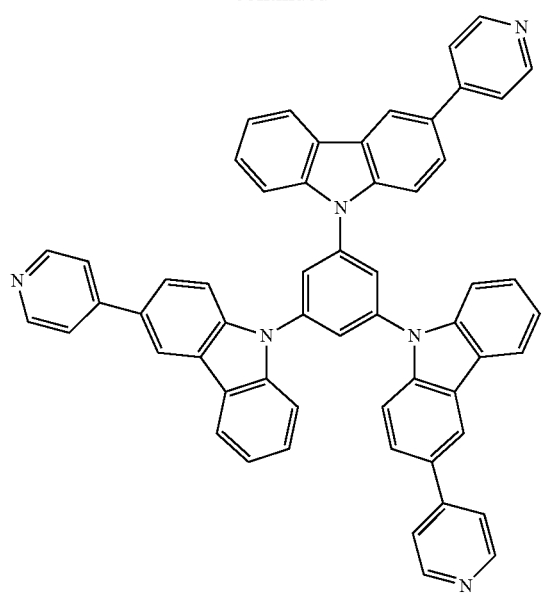
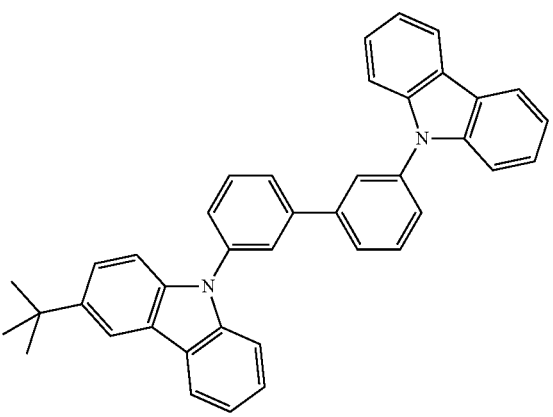
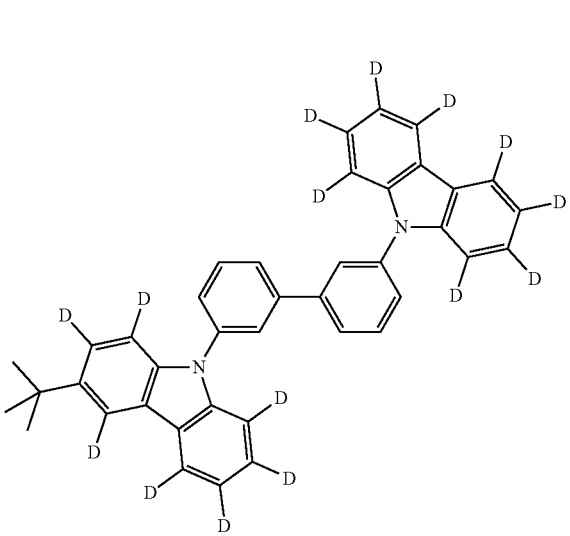

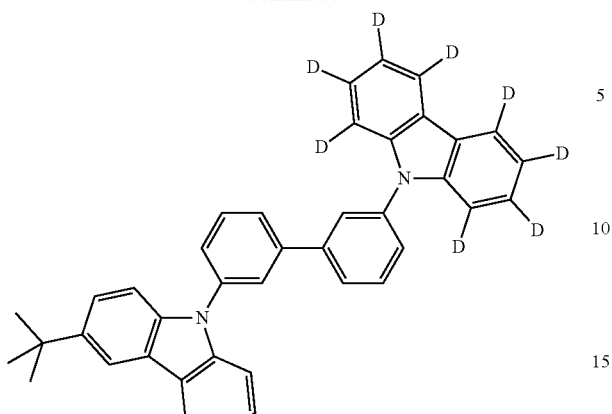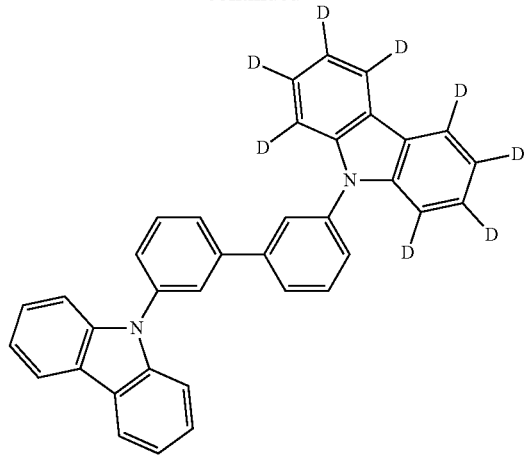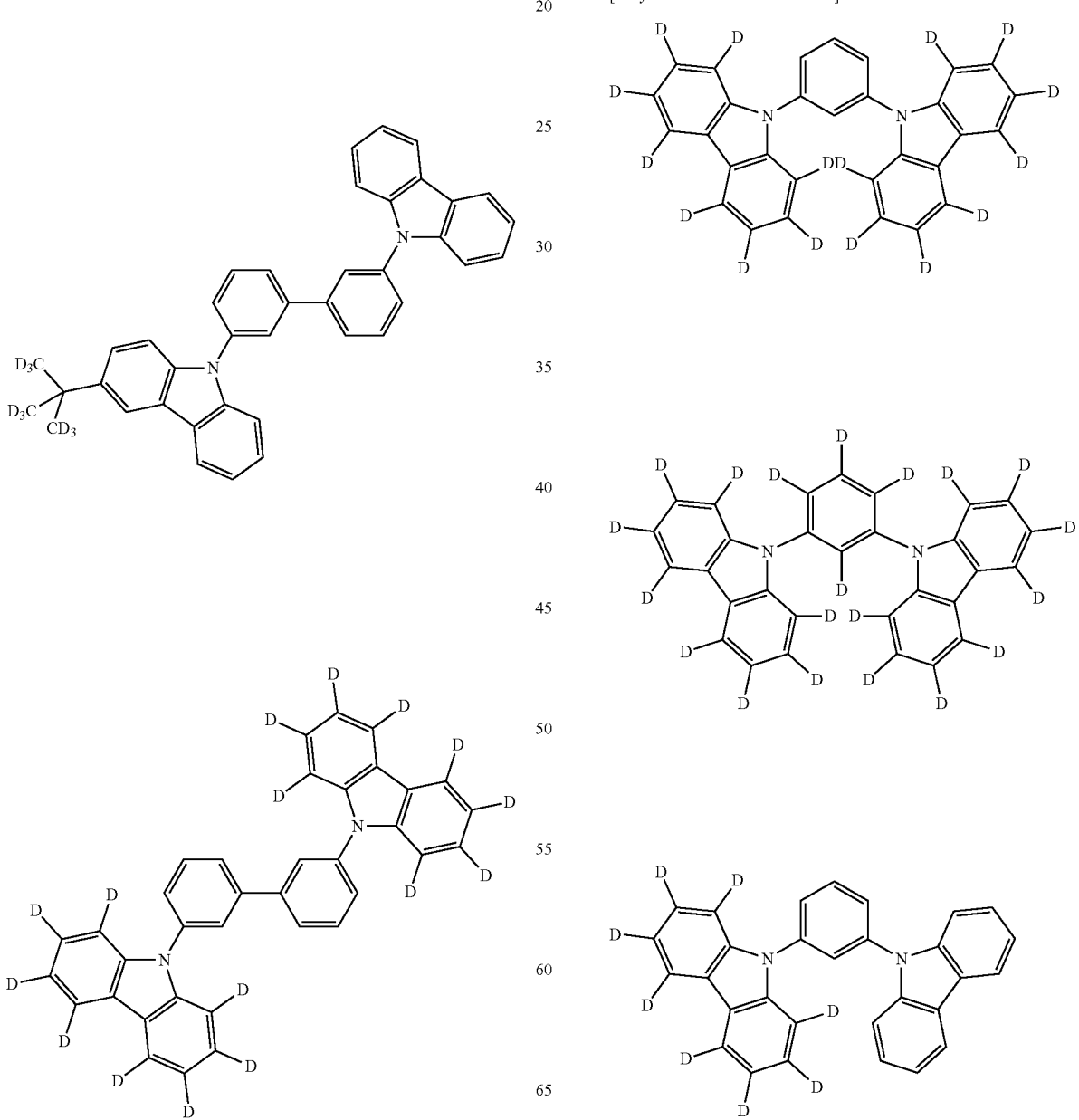
[Fifty-Second Chemical Formula]

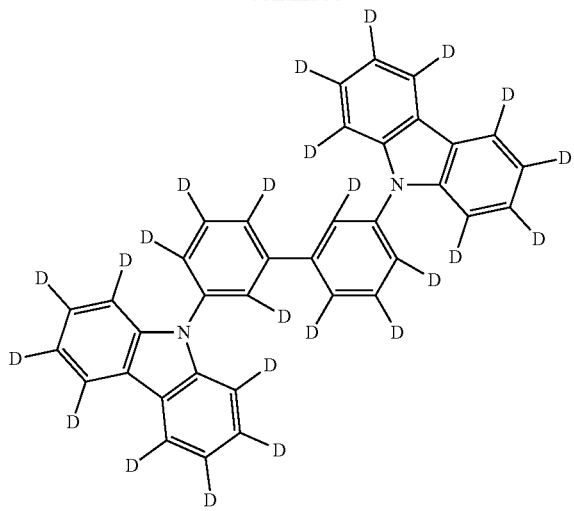

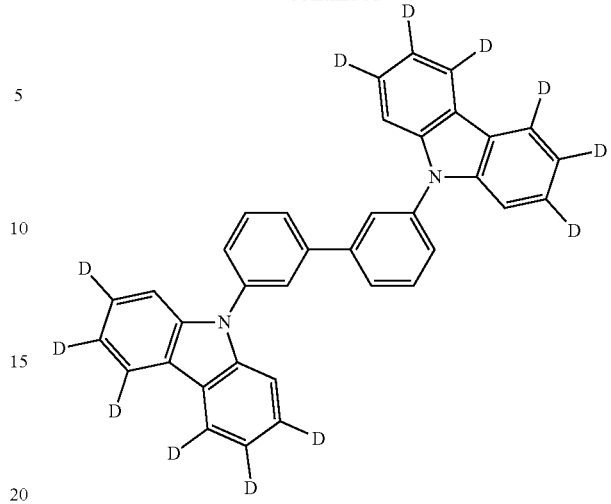

Furthermore, a triphenylene derivative is also favorable as the host material, and a triphenylene derivative expressed by General Formula Tp-1 below (hereinafter sometimes referred to simply as a "triphenylene derivative") is preferable.

Because the triphenylene derivative expressed by General Formula Tp-1 is composed solely of carbon and hydrogen atoms, it has excellent chemical stability, some benefits of which are better drive durability and lower probability that changes will occur during high luminance drive.

The molecular weight of the triphenylene derivative expressed by General Formula Tp-1 is preferably within a range of 400 to 1200, more preferably 400 to 1000, and even more preferably 400 to 800. It is preferable for the molecular weight to be at least 400 because a good-quality amorphous thin film can be formed, and if the molecular weight is 1200 or lower, this is preferable in terms of solubility in solvents, sublimation [performance], and vapor deposition suitability.

There are no limitations on the applications of the triphenylene derivative expressed by General Formula Tp-1, and it may be contained not only in the light-emitting layer, but also in any of the organic layers.

[Fifty-Third Chemical Formula]

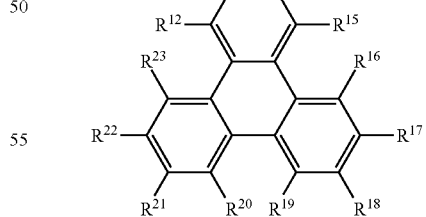

(Tp-1)

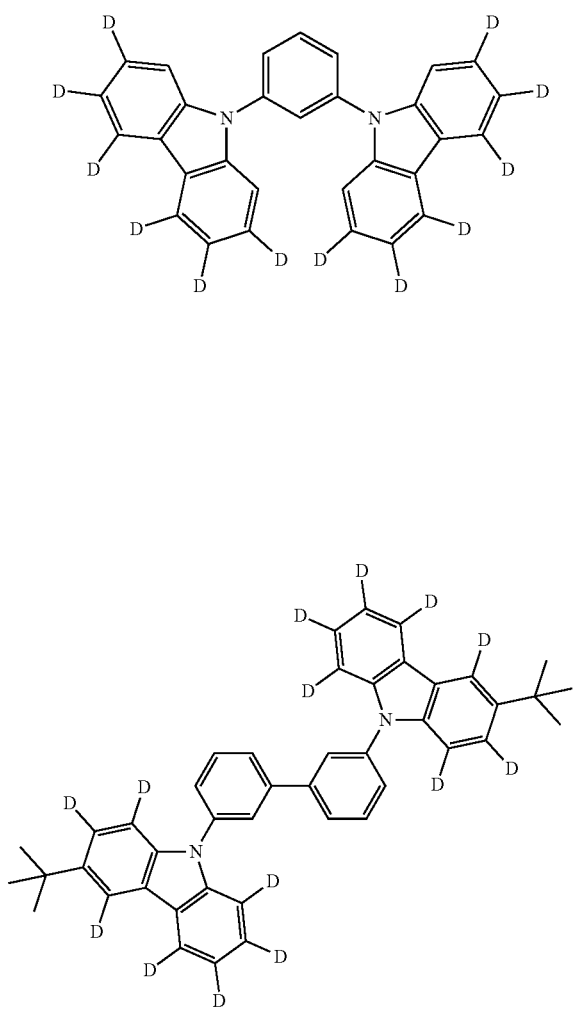

(In General Formula Tp-1, $R^{12}$ to $R^{23}$ represent each independently a hydrogen atom; an alkyl group; a cyano group; a phenyl group, a fluorenyl group, a naphthyl group, or a triphenylenyl group that may be substituted with an alkyl group, a phenyl group, a fluorenyl group, a naphthyl group, or a triphenylenyl group; or a group that is a combination of these. However, $R^{12}$ to $R^{23}$ will never be all hydrogen atoms.)

Examples of the alkyl group represented by $R^{12}$ to $R^{23}$ include substituted or unsubstituted groups such as a methyl group, an ethyl group, an isopropyl group, an n-butyl group, a tert-butyl group, an n-octyl group, an n-decyl group, an n-hexadecyl group, a cyclopropyl group, a cyclopentyl group, and a cyclohexyl group, with a methyl group, an ethyl group, an isopropyl group, a tert-butyl group, or a cyclohexyl group being preferable, and a methyl group, an ethyl group, or a tert-butyl group being more preferable.

$R^{12}$ to $R^{23}$ are more preferably a $C_1$ to $C_4$ alkyl group; or a phenyl group, a fluorenyl group, a naphthyl group, or a triphenylenyl group that may be substituted with a $C_1$ to $C_4$ alkyl group, a phenyl group, a fluorenyl group, a naphthyl group, or a triphenylenyl group (these may be further substituted with an alkyl group, a phenyl group, a fluorenyl group, a naphthyl group, or a triphenylenyl group).

It is especially preferable to use a benzene ring which may be substituted with a phenyl group, a fluorenyl group, a naphthyl group, or a triphenylenyl group (these may be further substituted with an alkyl group, a phenyl group, a fluorenyl group, a naphthyl group, or a triphenylenyl group).

The total number of aryl rings in General Formula Tp-1 is preferably 2 to 8 and more preferably 3 to 5. Within this range, a good-quality amorphous thin-film can be formed, there will be good solubility in solvents, and sublimation performance and vapor deposition suitability will also be good.

$R^{12}$ to $R^{23}$ preferably have each independently a total carbon number of 20 to 50, and a total carbon number of 20 to 36 is more preferable. Within this range, a good-quality amorphous thin film can be formed, and solubility in solvents, sublimation [performance], and vapor deposition suitability will be favorable.

In one mode of the present invention, the triphenylene derivative expressed by General Formula Tp-1 above is preferably a triphenylene derivative expressed by General Formula Tp-2 below:

[Fifty-Fourth Chemical Formula]

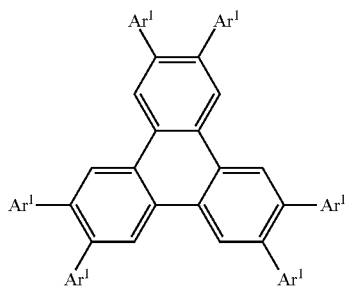

(Tp-2)

(In General Formula Tp-2, the plurality of $Ar^1$ [groups] are the same, and are [each] a phenyl group, a fluorenyl group, a naphthyl group, or a triphenylenyl group that may be substituted with a cyano group, an alkyl group, a phenyl group, a fluorenyl group, a naphthyl group, or a triphenylenyl group, or a group that is a combination of these.)

The alkyl group or the phenyl group, fluorenyl group, naphthyl group, or triphenylenyl group that may be substituted with an alkyl group, a phenyl group, a fluorenyl group, a naphthyl group, or a triphenylenyl group represented by $Ar^1$ is defined the same as what was listed for $R^{12}$ to $R^{23}$, and preferred options are also the same.

In another mode of the present invention, the triphenylene derivative expressed by General Formula Tp-1 above is preferably a triphenylene derivative expressed by General Formula Tp-3 below:

[Fifty-Fifth Chemical Formula]

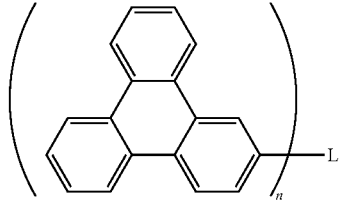

General Formula Tp-3

In General Formula Tp-3, L represents a phenyl group, a fluorenyl group, a naphthyl group, or a triphenylenyl group that may be substituted with a cyano group, an alkyl group, a phenyl group, a fluorenyl group, a naphthyl group, or a triphenylenyl group, or an n-valent linking group that is a combination of these. n represents an integer from 1 to 6.)

The alkyl group, phenyl group, fluorenyl group, naphthyl group, or triphenylenyl group forming an n-valent linking group represented by L is defined the same as what was listed for $R^{12}$ to $R^{23}$.

L is preferably a benzene ring or a fluorene ring that may be substituted with an alkyl group or a benzene ring, or an n-valent linking group that is a combination of these.

Preferred concrete examples of L are given below, but [the present invention] is not limited to or by these. Note that the asterisks in the concrete examples indicate bonding with a triphenylene ring.

[Fifty-Sixth Chemical Formula]

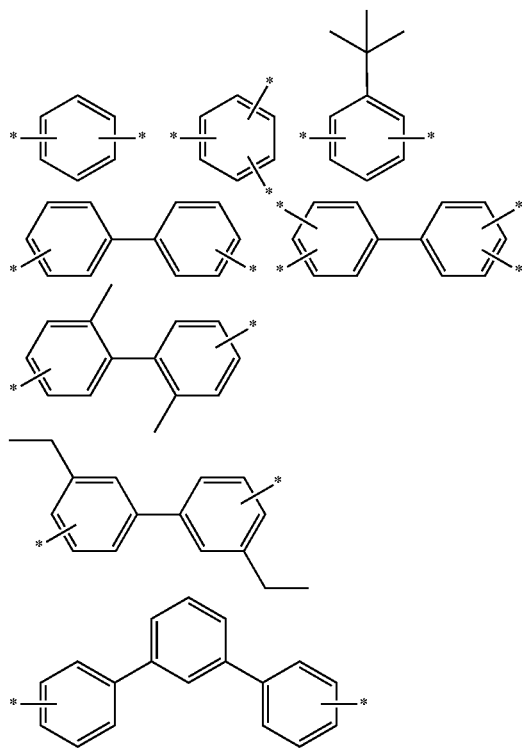

-continued

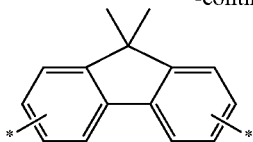

n is preferably from 1 to 5 and more preferably from 1 to 4.

In another mode of the present invention, the triphenylene derivative expressed by General Formula Tp-1 above is preferably a triphenylene derivative expressed by General Formula Tp-4 below:

[Fifty-Seventh Chemical Formula]

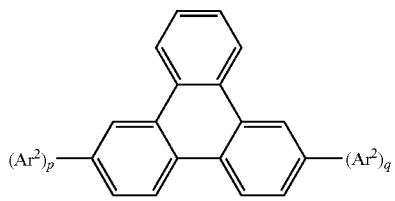

(Tp-4)

(In General Formula Tp-4, if there are a plurality of $Ar^2$ [groups], they are the same, and [each] $Ar^2$ represents a cyano group, an alkyl group, a phenyl group, a naphthyl group, a triphenylenyl group, or a group that is a combination of these. p and q represent each independently 0 or 1, but p and q will never both be 0. When p and q represent 0 [sic][10], $Ar^2$ represents a hydrogen atom.)

[10] Translator's note: These sentences don't seem to make sense. If p and q will never both be 0, they are not really independent, and the last sentence implies that p and q may both be 0.

$Ar^2$ is preferably a group that is a combination of a $C_1$ to $C_4$ alkyl group, a phenyl group, a naphthyl group, and a triphenylenyl group, and more preferably a group that is a combination of a methyl group, a t-butyl group, a phenyl group, and a triphenylenyl group.

It is especially preferable for $Ar^2$ to be a benzene ring substituted at the meta position with a $C_1$ to $C_4$ alkyl group, a phenyl group, a naphthyl group, a triphenylenyl group, or a group that is a combination of these.

When the triphenylene derivative according to the present invention is used as the host material of the light-emitting layer of an organoelectroluminescent element or as a charge transport material of a layer adjacent to the light-emitting layer, if there is a large energy gap from the light-emitting material in a thin film state (when the light-emitting material is a phosphorescent material, the lowest excited triplet ($T_1$) energy in a thin film state), this will prevent the emission from being quenched and is advantageous in terms of improving efficiency. On the other hand, from the standpoint of the chemical stability of the compound, it is preferable for the energy gap and the $T_1$ energy not to be too large. The $T_1$ energy in a film state of the triphenylene derivative expressed by General Formula Tp-1 is preferably at least 52 kcal/mol and no more than 80 kcal/mol, more preferably at least 55 kcal/mol and no more than 68 kcal/mol, and even more preferably at least 58 kcal/mol and no more than 63 kcal/mol. When a phosphorescent material is used as a light-emitting material, in particular, it is preferable for the $T_1$ energy to be within the aforementioned range.

The $T_1$ energy can be found from the short wavelength end in measurement of the phosphorescence emission spectrum of a thin film of the material. For example, the material is formed into a film in a thickness of approximately 50 nm on a washed quartz glass substrate by a vacuum vapor deposition method, and an F-7000 Hitachi fluorescence spectrophotometer (Hitachi High-Technologies) is used to measure the phosphorescence emission spectrum of a thin film at liquid nitrogen temperature. The $T_1$ energy can be found by converting the rising wavelength on the short wavelength side of the emission spectrum thus obtained into energy units.

Concrete examples of the triphenylene derivative according to the present invention are shown below, but the present invention is not limited to or by these:

[Fifty-Eighth Chemical Formula]

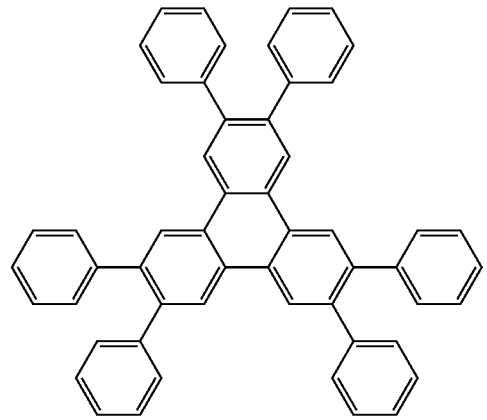

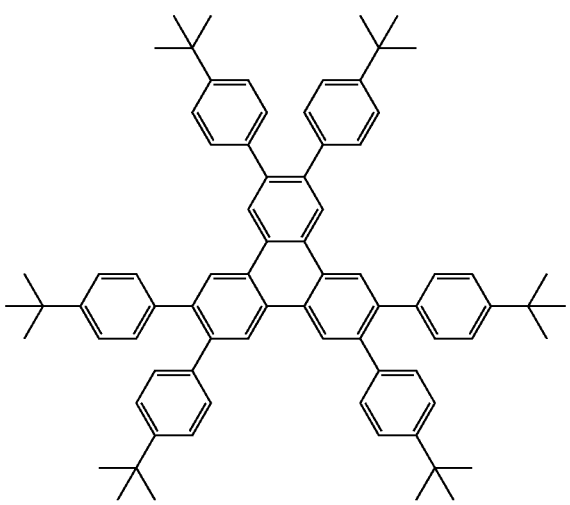

131
-continued
132
-continued
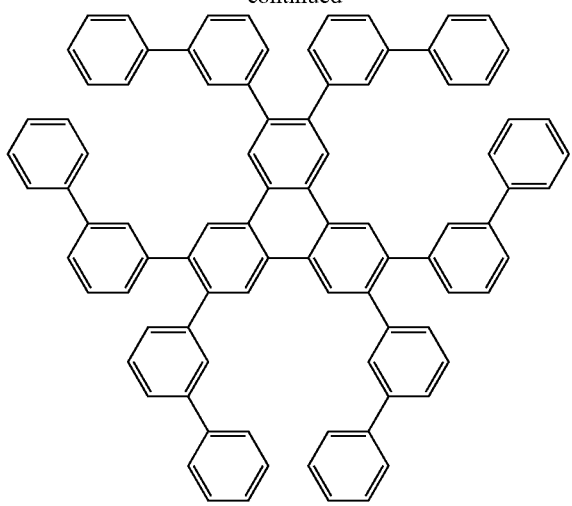
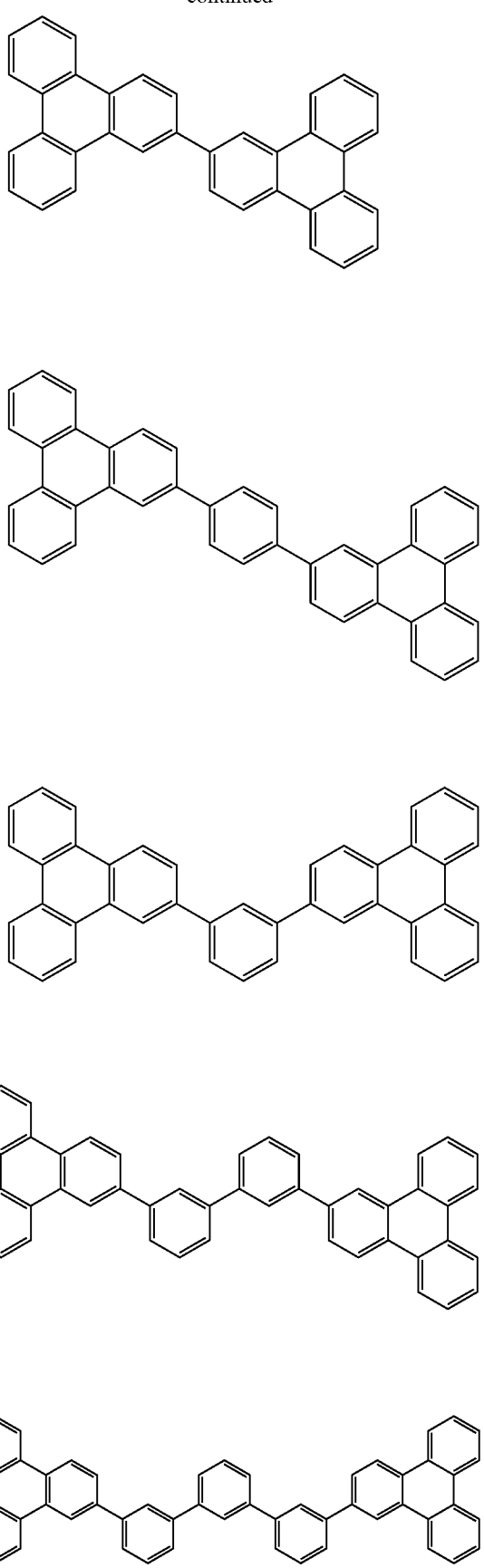

133
-continued
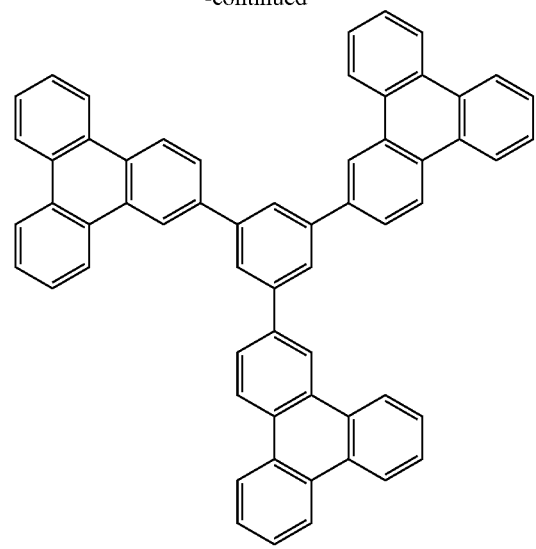
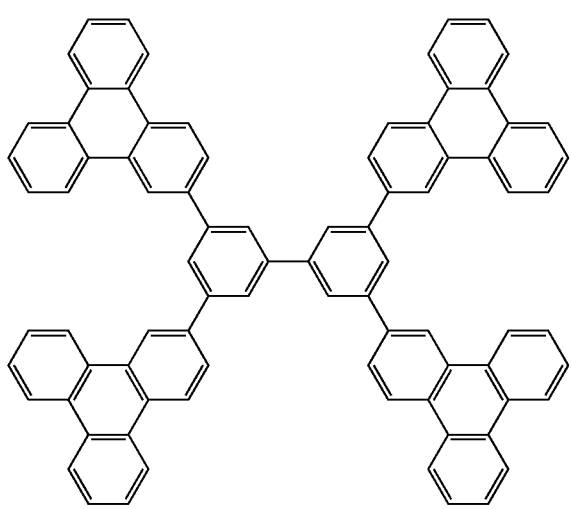
[Fifty-Ninth Chemical Formula]
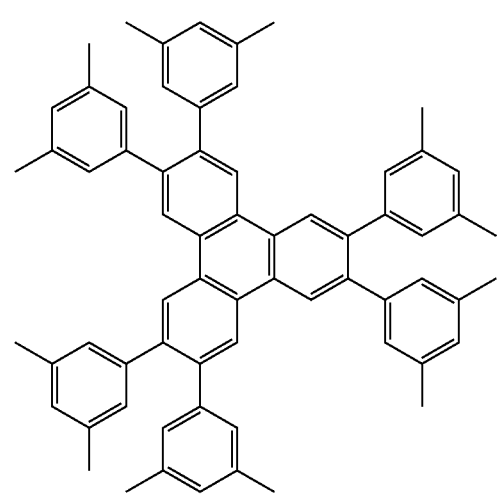
134
-continued
[Sixtieth Chemical Formula]
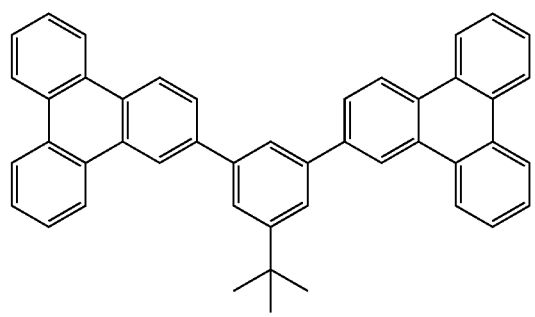
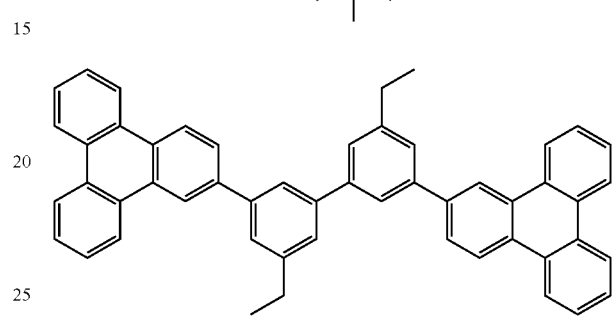
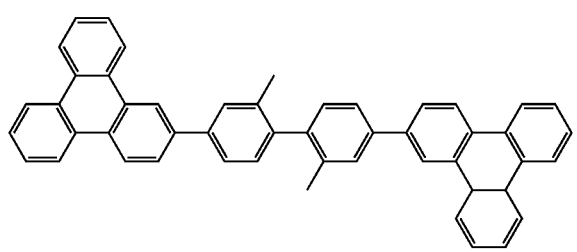
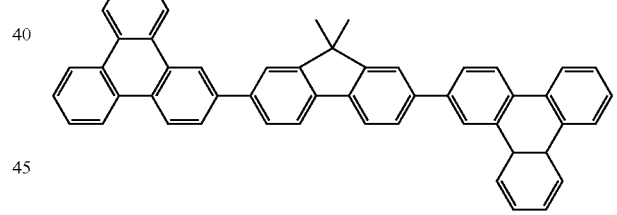
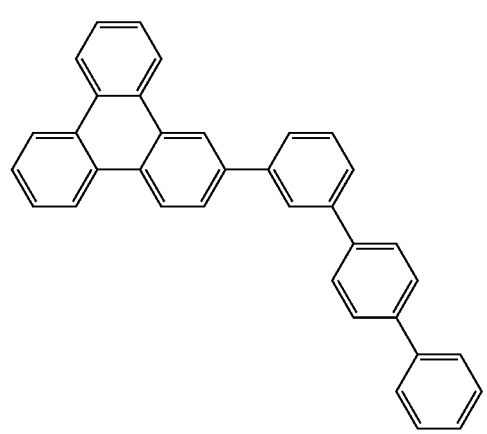

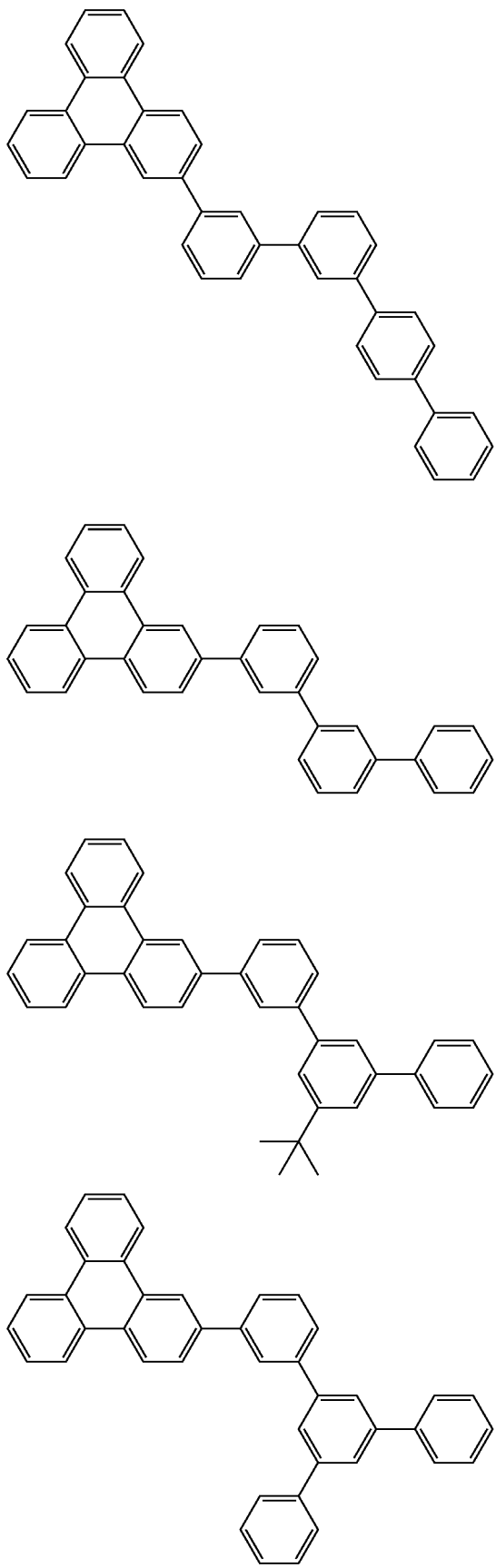

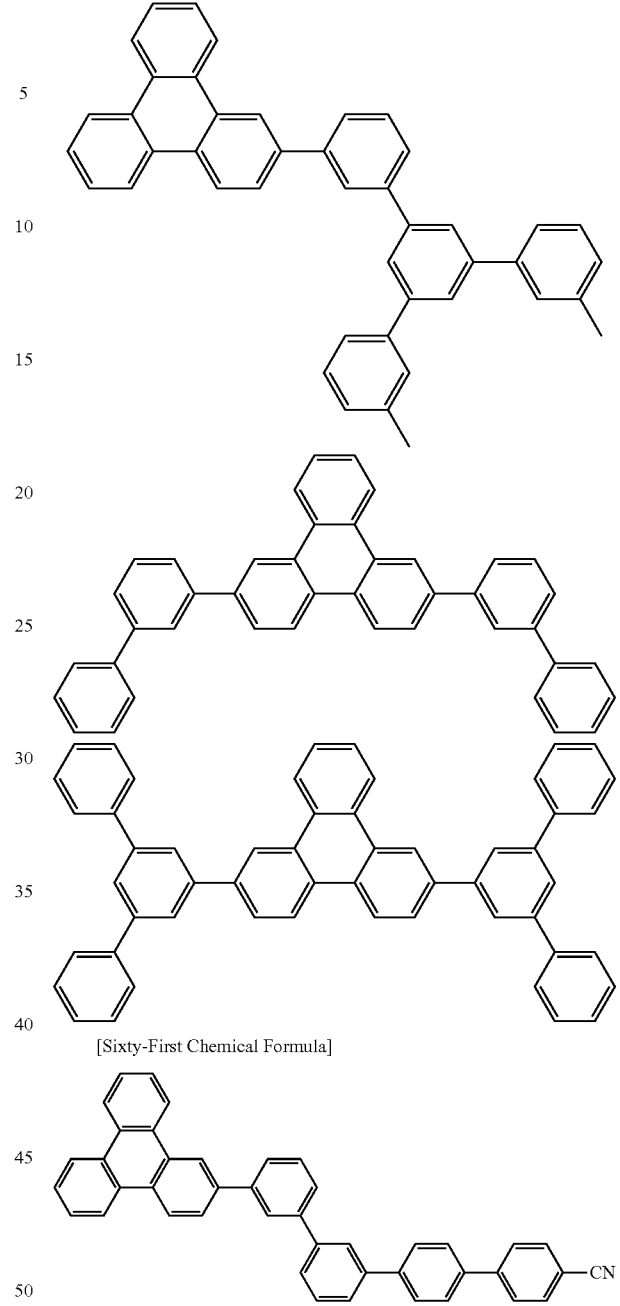

[Sixty-First Chemical Formula]

Compounds given as examples of the aforementioned aromatic hydrocarbon compound according to the present invention can be synthesized by the methods described in a pamphlet of International Publication 05/013388, a pamphlet of International Publication 06/130598, and a pamphlet of International Publication 09/021107.

After synthesis, it is preferable for purification by column chromatography, recrystallization, or the like to be performed, followed by sublimation purification. Sublimation purification not only allows organic impurities to be separated, but also allows inorganic salts, residual solvents, and the like to be effectively removed.

Note that the triphenylene derivative is preferably contained in, besides the light-emitting layer, an organic layer that is adjacent to the light-emitting layer between the light-emitting layer and the cathode, but application of this is not limited, and [the triphenylene derivative] may further be contained in any of the organic layers. The light-emitting layer, hole injection layer, hole transport layer, electron transport layer, electron injection layer, exciton blocking layer, charge blocking layer, or a plurality of these can be introduction layers that contain the triphenylene derivative according to the present invention.

The organic layer that contains the triphenylene derivative and is adjacent to the light-emitting layer between the cathode and the light-emitting layer is preferably a charge blocking layer or an electron transport layer, and more preferably a charge blocking layer.

Containing the triphenylene derivative in a layer adjacent to the light-emitting layer improves the durability and efficiency of the element. When the light-emitting layer is excited, the excitons tend to accumulate at the interface of the light-emitting layer and the adjacent layer, causing a phenomenon of breakdown of the adjacent layer, but because a triphenylene derivative has a structure with high durability, it is less susceptible to breakdown by excitons, which is believed to be why the aforementioned effect is obtained.

From the standpoint of ease of synthesis, the triphenylene derivative is preferably composed of only carbon atoms and hydrogen atoms.

If the triphenylene derivative is contained in a layer other than the light-emitting layer, it is preferably contained in an amount of 70 to 100 wt %, and more preferably 85 to 100 wt %. If the triphenylene derivative is contained in the light-emitting layer, it is preferably contained in an amount of 0.1 to 99 wt %, more preferably 1 to 95 wt %, and even more preferably 10 to 95 wt %, with respect to the total weight of the light-emitting layer.

From the standpoint of stable operation of the organo-electroluminescent element with respect to heat emission in element drive or during high-temperature drive, the glass transition temperature (Tg) of the triphenylene derivative according to the present invention is preferably at least 60° C. and no more than 400° C., more preferably at least 65° C. and no more than 300° C., and even more preferably at least 80° C. and no more than 180° C.

Moreover, the host material is preferably a host material with high planarity (hereinafter also referred to as a "planar host compound") because the regularity of the arrangement state will be higher, and in concrete terms, a compound having a shape in which the aspect ratio is 3 or more is more preferable.

The aspect ratio is the ratio of the molecular length and molecular thickness of the compound (molecular length/molecular thickness).

From the standpoint of the orientation, the aspect ratio of the host material used in the present invention is preferably 3 or more, and an aspect ratio of 3.5 or more is more preferable.

Here, the molecular length and molecular thickness are defined the same as in the description of the light-emitting layer.

In addition, among planar host compounds, a compound that is in the form of a disk is preferable as the host material used in the light-emitting layer of the present invention, and a discotic liquid crystalline host compound corresponding to the following is more preferable:

Discotic Liquid Crystalline Host Compound

A discotic liquid crystalline host compound forms a liquid crystal phase composed of disk-shaped molecules having high planarity.

Discotic liquid crystalline host compounds also include compounds having a structure in which linear alkyl groups, alkoxy groups, or substituted benzoyloxy groups are substituted radially as side chains of the mother nucleus at the molecular center. The compound is preferably one in which the molecule or cluster of molecules has rotational symmetry, and a specific orientation can be imparted.

The discotic liquid crystalline host compound is preferably selected from among triphenylene derivatives, pyrene derivatives, triazine derivatives, and carbazole derivatives, and more preferably selected from among triphenylene derivatives, pyrene derivatives, and triazine derivatives, and is most preferably a triphenylene derivative.

Discotic Liquid Crystalline Triphenylene Derivative

Any conventionally known discotic liquid crystalline triphenylene derivative can be used as the triphenylene derivative that exhibits liquid crystallinity, but it may be, for example, a triphenylene derivative expressed by General Formula T-I below:

[Sixty-Second Chemical Formula]

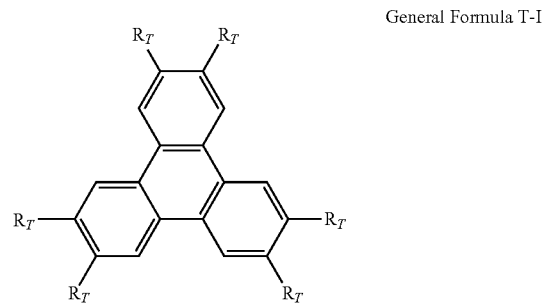

General Formula T-I

In General Formula T-I above, $R_T$ means $R_T^1$, $R_T^1$—O—, $R_T^1$—CO—O—, or $R_T^1$—O—CO—. Not all compounds having these groups are discotic liquid crystalline, but a suitable group that will result in discotic liquid crystallinity can be selected and used based on known art or the like. Examples of $R_T^1$ include an alkyl group; an aryl group; a phenylene group, a cyclohexylene group, or another such ring that has been incorporated into an alkyl group; an oxygen atom disposed between a carbon-carbon of an alkyl group, and so forth.

In concrete terms, examples of $R_T$ include $R_T^2$—, $R_T^2$—O—, $R_T^2$—O—$R_T^3$—, $R_T^2$—O—$R_T^3$—O—, $R_T^2$—O-Ph-COO—, $R_T^2$—(O—$R_T^3$)$_{nT}$—O-Ph-COO—, $R_T^2$—O-Ph-CH=CH—COO—, and $CH_2$=CH—COO—$R_T^3$—O-Ph-COO—. Here, $R_T^2$ represents an alkyl group which may have a polymerizable group, $R_T^3$ represents an alkylene group, Ph represents a phenylene group which may have a substituent, and $n_T$ is the repeating number of —(O—$R_T^3$)— and represents an integer of 1 or greater.

$R_T^2$ represents an alkyl group which may have a polymerizable group, and when it has a polymerizable group, having a polymerizable group at the very end of the alkyl group is preferable from the standpoint of the expression of an $N_D$ phase. Examples of polymerizable groups include an acrylic acid ester group, a methacrylic acid ester group, a crotonic acid ester group, and an epoxy group, and in terms of the rate of polymerization and the cost and ease of synthesis, an acrylic acid ester group or a methacrylic acid ester group is preferable, with an acrylic acid ester group being more preferable.

The carbon number of the alkyl group portion in the alkyl group which may have a polymerizable group represented by $R_T^2$ is preferably within a range of 1 to 20, more preferably a range of 1 to 15, and even more preferably a range of 3 to 10.

The carbon number of the alkylene group represented by $R_T^3$ is preferably within a range of 1 to 20, more preferably a range of 1 to 15, and even more preferably a range of 3 to 10.

Ph represents a phenylene group which may have a substituent, and examples of the substituent which [Ph] may have include a halogen atom such as a fluorine atom, an alkyl group, and an alkoxy group. From the standpoint of the expression of an $N_D$ phase, an alkyl group is preferable. The carbon number of the alkyl group or alkoxy group serving as the substituent is preferably within a range of 1 to 20, more preferably a range of 1 to 10, and even more preferably a range of 1 to 6.

$n_T$ is the repeating number of —(O—$R_T^3$)— and represents an integer of 1 or greater. $n_T$ is preferably an integer from 1 to 10, more preferably an integer from 1 to 6, and even more preferably an integer from 1 to 3.

From the standpoint of the expression of an $N_D$ phase, $R_T$ is preferably $R_T^2$—O-Ph-COO—, $R_T^2$—(O—$R_T^3$)$n_T$-O-Ph-COO—, or $R_T^2$—O-Ph-CH=CH—COO—, and more preferably $R_T^2$—O-Ph-COO—.

In terms of the expression of an $N_D$ phase, the triphenylene derivative expressed by General Formula T-I above is preferably a triphenylene derivative expressed by General Formula T-II below:

[Sixty-Third Chemical Formula]

General Formula T-II

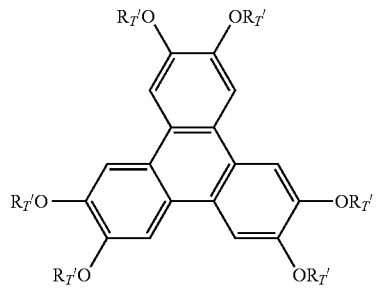

In General Formula T-II above, $R_T'$ represents $R_T^2$—O-Ph-CO—, $R_T^2$—(O—$R_T^3$)$n_T$-O-Ph-CO—, or $R_T^2$—O-Ph-CH=CH—CO—. $R_T^2$, Ph, $R_T^3$, and $n_T$ are defined the same as $R_T^2$, Ph, $R_T^3$, and $n_T$ in General Formula T-I above. Furthermore, concrete examples and preferred ranges of $R_T^2$, Ph, $R_T^3$, and $n_T$ in General Formula T-II above are also the same as those in General Formula T-I above.

It is more preferable if $R_T'$ is expressed by one of General Formulas T-II-1 to T-II-5 below because the expression of an $N_D$ phase will be better:

[Sixty-Fourth Chemical Formula]

(T-II-1)

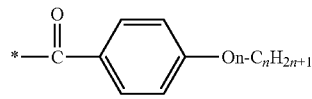

(T-II-2)

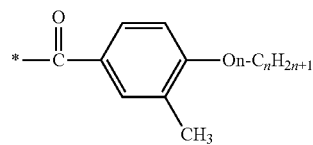

(T-II-3)

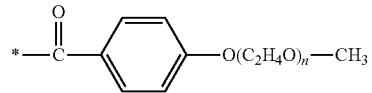

(T-II-4)

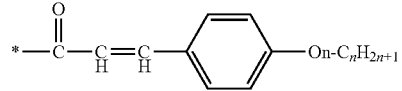

(T-II-5)

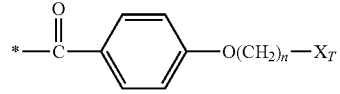

In General Formulas T-II-1 to T-II-5 above, n and n' represent each independently an integer of 1 or greater.

$X_T$ represents a polymerizable group.

n represents an integer of 1 or greater. n is preferably an integer from 1 to 20, more preferably an integer from 1 to 15, and even more preferably an integer from 3 to 10.

n' represents an integer of 1 or greater. n' is preferably an integer from 1 to 10, more preferably an integer from 1 to 6, and even more preferably an integer from 1 to 3.

$X_T$ represents a polymerizable group, and concrete examples and preferred ranges thereof are the same as the concrete examples and preferred ranges of the polymerizable group that may be possessed by the alkyl group represented by $R_T^2$ in General Formula T-I above.

In terms of resistance to electrical oxidation, it is also preferable for the triphenylene derivative expressed by General Formula T-I above to be a triphenylene derivative expressed by General Formula T-III below:

[Sixty-Fifth Chemical Formula]

(T-III)

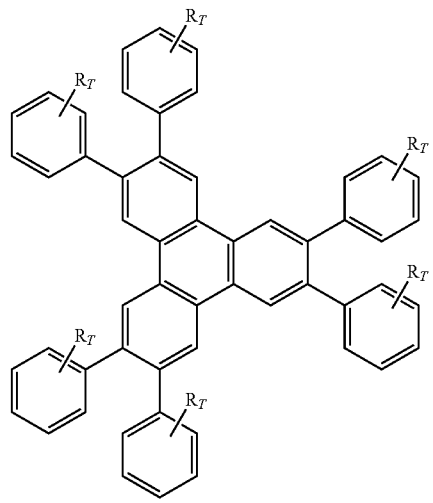

In General Formula T-III above, $R_T$ means $R_T^1$—, $R_T^1$—O—, $R_T^1$—CO—O—, or $R_T^1$—O—CO—. Examples of $R_T^1$ include an alkyl group; an aryl group; a phenylene group, a cyclohexylene group, or another such ring that has been incorporated into an alkyl group; an oxygen atom disposed between a carbon-carbon of an alkyl group, and so forth. Concrete examples and preferred ranges of $R_T$ are the same as the concrete examples and preferred ranges of $R_T$ in General Formula T-I above.

Of the triphenylene derivatives that exhibit liquid crystallinity in the present invention, those which manifest a liquid crystal phase between 20 and 300° C. are preferable. 40 to 280° C. is more preferable, and 60 to 250° C. is even more preferable. Here, [the phrase] "manifests a liquid crystal phase between 20 and 300° C." encompasses a case in which the liquid crystal temperature range straddles 20° C. (such as 10 to 22° C.), as well as a case in which it straddles 300° C. (such as 298 to 310° C.). The same holds true of the 40 to 280° C. and the 60 to 250° C. ranges.

Concrete examples of triphenylene derivatives that exhibit liquid crystallinity are given below, but the present invention is not limited to or by these:

[Sixty-Sixth Chemical Formula]

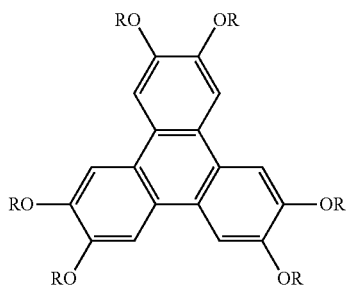

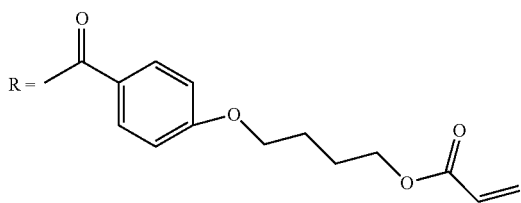

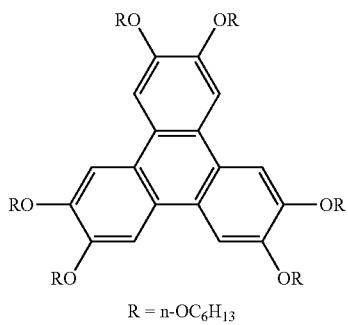

R = n-OC$_6$H$_{13}$

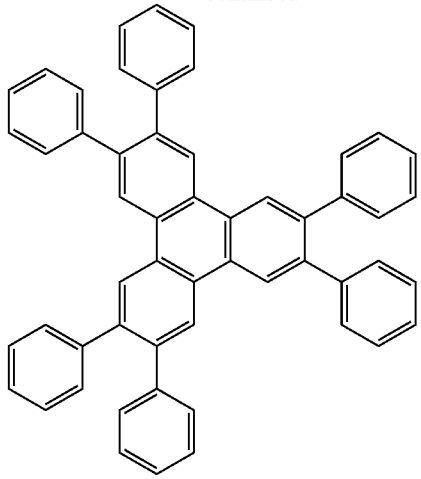

The amount of the host material contained in the light-emitting layer of the present invention is preferably 15 to 97 wt %, more preferably 30 to 95 wt %, and even more preferably 50 to 95 wt % in the light-emitting layer.

(Charge Transport Layer)

The charge transport layer is a layer in which charge movement occurs when voltage is applied to the organo-electroluminescent element. Concrete examples include a hole injection layer, a hole transport layer, an electron blocking layer, a hole blocking layer, an electron transport layer, or an electron injection layer.

—Hole Injection Layer and Hole Transport Layer—

The hole injection layer and the hole transport layer are layers having the function of accepting holes from the anode or the anode side and transporting them to the cathode side.

In the present invention, it is preferable to include a hole injection layer or a hole transport layer containing an electron-accepting dopant as the organic layer.

Examples of the materials used for the hole injection layer and the hole transport layer include publicly known materials such as 2-TNATA, TPD, NPD, DNTPD, and other such arylamine derivatives, CBP, mCP, TCTA, and other such carbazole derivatives, copper phthalocyanine, titanyl phthalocyanine, and other such phthalocyanine derivatives, alpha-4T, alpha-6T, and other such thiophene derivatives, fluorene derivatives, and quinoxaline derivatives. Preferable are arylamine derivatives, phthalocyanine derivatives, quinoxaline derivatives, and carbazole derivatives, and more preferable are arylamine derivatives and quinoxaline derivatives.

The thickness of the hole injection layer is generally 5 to 200 nm, preferably 10 to 100 nm, and more preferably 10 to 80 nm.

The thickness of the hole transport layer is generally 5 to 200 nm, preferably 5 to 100 nm, and more preferably 5 to 80 nm.

—Electron Injection Layer and Electron Transport Layer—

The electron injection layer and the electron transport layer are layers having the function of accepting electrons from the cathode or the cathode side and transporting them to the anode side.

Examples of the material used for the electron injection layer and the electron transport layer include publicly known materials such as PBD, tertiary butyl PBD, and other such oxadiazole derivatives, imidazopyridine derivatives, triphenylene derivatives, azacarbazole derivatives, Bphen, BCP, and other such phenanthrene derivatives, and $Alq_3$, Balq, and other such aluminum complexes, gallium complexes, zinc complexes, and other such metal complexes. Preferable are imidazopyridine derivatives, triphenylene derivatives, phenanthrene derivatives, aluminum complexes, gallium complexes, zinc complexes, and other such metal complexes, and more preferable are imidazopyridine derivatives, triphenylene derivatives, phenanthrene derivatives, and aluminum complexes.

The thickness of the electron injection layer is generally 5 to 100 nm, preferably 20 to 80 nm, and more preferably 25 to 60 nm.

The thickness of the electron transport layer is generally 1 to 100 nm, preferably 20 to 80 nm, and more preferably 25 to 60 nm.

Regarding the hole injection layer, hole transport layer, electron injection layer, and electron transport layer, what is stated in paragraph numbers [0165] to [0167] in Japanese Laid-Open Patent Application 2008-270736 can be applied to the present invention.

—Hole Blocking Layer—

The hole blocking layer is a layer having the function of preventing the holes transported from the anode side to the light-emitting layer from escaping to the cathode side. In the present invention, a hole blocking layer can be provided as an organic layer that is adjacent to the light-emitting layer on the cathode side.

Examples of organic compounds that constitute a hole blocking layer include aluminum(III) bis(2-methyl-8-quinolinolate[11]) 4-phenylphenolate (abbreviated as BAlq) and other such aluminum complexes, triazole derivatives, and phenanthroline derivatives such as 2,9-dimethyl-4,7-diphenyl-1,10-phenanthroline (abbreviated as BCP).

[11] Translator's note: The Japanese text literally reads "quinolinolate," but the English text provided in the original document in parentheses here reads "quinolinato."

The thickness of the hole blocking layer is preferably 1 to 500 nm, more preferably 5 to 200 nm, and even more preferably 10 to 100 nm.

The hole blocking layer may have a single-layer structure composed of one or more types of the aforementioned materials, or it may have a multilayer structure composed of a plurality of layers of the same composition or different compositions.

—Electron Blocking Layer—

The electron blocking layer is a layer having the function of preventing the electrons transported from the cathode side to the light-emitting layer from escaping to the anode side. In the present invention, an electron blocking layer can be provided as an organic layer that is adjacent to the light-emitting layer on the anode side.

As examples of organic compounds that constitute an electron blocking layer, those listed as [compounds for] the aforementioned hole transport layer can be used.

The thickness of the electron blocking layer is preferably 1 to 500 nm, more preferably 5 to 200 nm, and even more preferably 10 to 100 nm.

The electron blocking layer may have a single-layer structure composed of one or more types of the aforementioned materials, or may have a multilayer structure composed of a plurality of layers of the same composition or different compositions.

(First Intermediate Organic Layer)

The first intermediate organic layer in the present invention is composed of at least one organic layer positioned between the anode and the light-emitting layer, and examples of this at least one organic layer include the aforementioned hole injection layer, hole transport layer, and electron blocking layer. The first intermediate organic layer preferably includes at least one hole transport layer and is more preferably composed of a hole injection layer and a hole transport layer.

The thickness T1 of the first intermediate organic layer is generally 5 to 200 nm, preferably 10 to 150 nm, and more preferably 10 to 120 nm.

(Second Intermediate Organic Layer)

The second intermediate organic layer in the present invention is composed of at least one organic layer positioned between the cathode and the light-emitting layer, and examples of this at least one organic layer include the aforementioned hole blocking layer, electron transport layer, and electron injection layer. The second intermediate organic layer preferably includes at least one electron transport layer and is more preferably composed of two electron transport layers or composed of an electron injection layer and an electron transport layer.

The thickness T2 of the second intermediate organic layer is greater than 20 nm and less than 80 nm, preferably greater than 20 nm and less than 80 nm [sic], and from the standpoint of power efficiency, it is more preferably at least 25 nm and less than 60 nm.

(Thickness T1 of First Intermediate Organic Layer and Thickness T2 of Second Intermediate Organic Layer)

In the present invention, the relationship between the thickness T1 (nm) of the first intermediate organic layer and the thickness T2 (nm) of the second intermediate organic layer is such that $1.1<T1/T2<4.0$ and also such that $20\ \text{nm}<T2<80\ \text{nm}$, but from the standpoints of external quantum efficiency and power efficiency, [this relationship] is preferably such that $1.2<T1/T2<3.5$ and also such that $20\ \text{nm}<T2<80\ \text{nm}$, and more preferably such that $1.2<T1/T2<3.0$ and also such that $25\ \text{nm}<T2<80\ \text{nm}$.

If the maximum emission wavelength of the light-emitting material according to the present invention is 600 to 700 nm, from the standpoints of external quantum efficiency and power efficiency, the relationship between the thickness T1 (nm) of the first intermediate organic layer and the thickness T2 (nm) of the second intermediate organic layer is preferably such that $1.2<T1/T2<4.0$ and also such that $30\ \text{nm}<T2<80\ \text{nm}$. [This relationship] is more preferably such that $1.5<T1/T2<3.5$ and also such that $30\ \text{nm}<T2<80\ \text{nm}$, and even more preferably such that $1.8<T1/T2<3.0$ and also such that $50\ \text{nm}<T2<80\ \text{nm}$.

The aforementioned platinum complexes can be cited as examples of the light-emitting material in which the maximum emission wavelength is 600 to 700 nm.

If the maximum emission wavelength of the light-emitting material according to the present invention is 400 to 500 nm, then from the standpoints of external quantum efficiency and power efficiency, the relationship between the thickness T1 (nm) of the first intermediate organic layer and the thickness T2 (nm) of the second intermediate organic layer is preferably such that $1.1<T1/T2<3.0$ and also such that $20\ \text{nm}<T2<70\ \text{nm}$. [This relationship] is more preferably such that $1.2<T1/T2<2.8$ and also such that $25\ \text{nm}<T2<60\ \text{nm}$, and even more preferably such that $1.2<T1/T2<2.5$ and also such that $30\ \text{nm}<T2<50\ \text{nm}$.

The aforementioned pyrene derivatives and π-conjugated compounds can be cited as examples of the light-emitting material in which the maximum emission wavelength is 400 to 500 nm, with pyrene derivatives being preferable.

The maximum emission wavelength of the light-emitting material can be measured with an absolute quantum yield measurement device, a fluorescence spectrophotometer, or the like.

<Protective Layer>

In the present invention, the entire organic EL element may be protected by a protective layer.

Regarding the protective layer, what is stated in paragraph numbers [0169] and [0170] in Japanese Laid-Open Patent Application 2008-270736 can be applied to the present invention.

<Sealing Container>

The element of the present invention may be entirely sealed by using a sealing container.

Regarding the sealing container, what is stated in paragraph number [0171] in Japanese Laid-Open Patent Application 2008-270736 can be applied to the present invention.

<Drive>

The organoelectroluminescent element of the present invention can emit light by applying direct current (may include an alternating current component as needed) voltage (usually 2 to 15 volts) or DC current between the anode and the cathode.

For the method for driving the organoelectroluminescent element of the present invention, it is possible to apply the drive methods described in the respective Specifications or the like of Japanese Laid-Open Patent Applications H2-148687, H6-301355, H5-29080, H7-134558, H8-234685, and 118-241047, Japanese Patent 2,784,615, and U.S. Pat. Nos. 5,828,429 and 6,023,308.

The light extraction efficiency of the light-emitting element of the present invention can be improved by a variety of publicly known methods. For instance, the substrate surface shape can be machined (such as forming a fine texture pattern), the refractive index of the substrate, the ITO layer, and the organic layer can be controlled, the film thickness of the substrate and the ITO layer can be controlled, and so forth, all of which allows the light extraction efficiency to be improved and the external quantum efficiency and power efficiency to be raised.

The light-emitting element of the present invention is what is known as a top emission type, with which emitted light is extracted from the anode side.

The organic EL device of the present invention may have a resonator structure. For example, it may comprise a multilayer film mirror made up of a plurality of laminated films of different refractive indexes, a transparent or semi-transparent electrode, a light-emitting layer, and a metal electrode, all superposed on a transparent substrate. The light generated by the light-emitting layer is repeatedly reflected and resonates, with the metal electrode and the multilayer mirror serving as reflector plates.

In another preferred mode, the transparent or semi-transparent electrode and the metal electrode each function as a reflector plate on a transparent substrate, and the light generated by the light-emitting layer is repeatedly reflected and resonates between these.

In order to form a resonant structure, the optical path length, which is determined from the effective refractive index of the two reflector plates and the thickness and refractive index of each of the layers between the reflector plates, is adjusted to an optimum value for obtaining the desired resonance wavelength. The calculation formula in the case of the first mode is discussed in the Specification of Japanese Laid-Open Patent Application H9-180883. The calculation formula in the case of the second mode is discussed in the Specification of Japanese Laid-Open Patent Application 2004-127795.

The external quantum efficiency of the organoelectroluminescent element of the present invention is preferably at least 5% and more preferably at least 7%. The numerical value of the external quantum efficiency that can be used is the maximum value for external quantum efficiency when the element is driven at 20° C., or the value for external quantum efficiency near 100 to 300 cd/m$^2$ when the element is driven at 20° C.

The internal quantum efficiency of the organoelectroluminescent element of the present invention is preferably at least 30%, more preferably at least 50%, and even more preferably at least 70%. The internal quantum efficiency of the element is calculated by dividing the external quantum efficiency by the light extraction efficiency. The light extraction efficiency is approximately 20% with an ordinary organic EL element, but the light extraction efficiency can be raised to 20% or higher by modifying the shape of the substrate, the shape of the electrodes, the thickness of the organic layers, the thickness of the inorganic layers, the refractive index of the organic layers, the refractive index of the inorganic layers, and so forth.

(Applications of the Light-Emitting Element of the Present Invention)

The light-emitting element of the present invention can be utilized favorably in light emission devices, pixels, display elements, display devices, displays, backlights, electronic photography, illumination light sources, illumination devices, recording light sources, exposure light sources, reading light sources, road signs, trade signs, interior decorating, optical communications, and so forth. [This element] can be especially favorably used in devices that are driven in areas of high light emission brightness, such as in light emission devices, illumination devices, and display devices.

Next, the light emission device of the present invention will be described with reference to FIG. 2.

The light emission device of the present invention makes use of the aforementioned organoelectroluminescent element.

Figure 2:
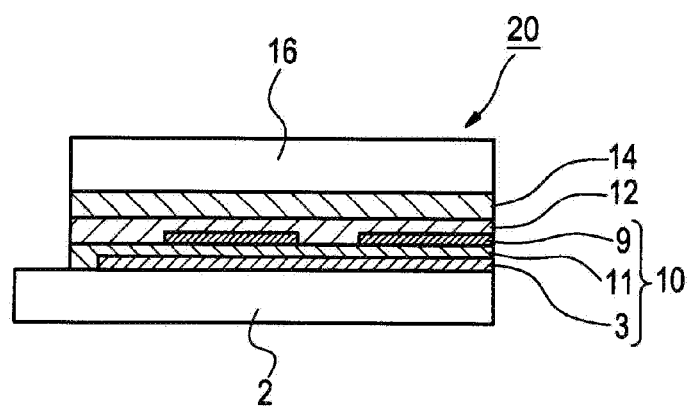
FIG. 2 is a schematic diagram showing one example of the light emission device according to the present invention.

FIG. 2 is a sectional view schematically showing one example of the light emission device of the present invention.

The light emission device 20 in FIG. 2 is made up of a transparent substrate (supporting substrate) 2, an organoelectroluminescent element 10, a sealing container 16, and the like.

The organoelectroluminescent element 10 is configured such that an anode (first electrode) 3, an organic layer 11, and a cathode (second electrode) 9 are sequentially laminated over the substrate 2. Furthermore, a protective layer 12 is laminated over the cathode 9, and in addition, the sealing container 16 is provided on the protective layer 12 via an adhesive layer 14. Note that parts of the electrodes 3 and 9, partitions, insulating layers, and so forth are not depicted.

Here, an epoxy resin or other such photosetting adhesive or thermosetting adhesive can be used as the adhesive layer 14. For example, a thermosetting adhesive sheet can also be used.

There are no particular restrictions on the applications of the light emission device of the present invention, but examples other than illumination devices include television sets, personal computers, portable telephones, electronic paper, and other such display devices.

(Illumination Device)

Next, the illumination device according to an embodiment of the present invention will be described with reference to FIG. 3.

Figure 3:
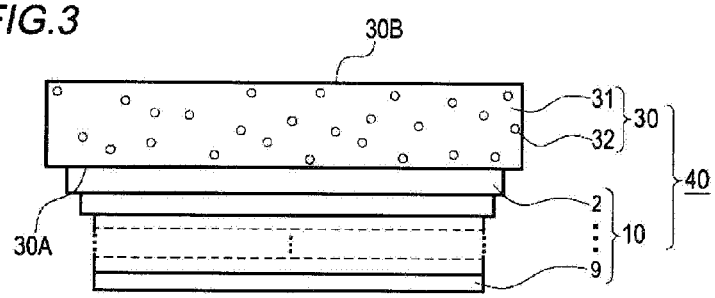
FIG. 3 is a schematic diagram showing one example of the illumination device according to the present invention.

FIG. 3 is a sectional view schematically showing one example of the illumination device according to an embodiment of the present invention.

As is shown in FIG. 3, the illumination device 40 according to an embodiment of the present invention comprises the aforementioned organic EL element 10 and a light-scattering member 30. In more concrete terms, the illumination device 40 is configured such that the substrate 2 of the organic EL element 10 is in contact with the light-scattering member 30.

There are no particular restrictions on the light-scattering member 30 as long as it is capable of scattering light, but in FIG. 3, it is a member in which microparticles 32 are dispersed in a transparent substrate 31. A glass substrate, for example, can be used favorably as the transparent substrate 31. Transparent resin microparticles can be used favorably as the microparticles 32. The glass substrate and the transparent resin microparticles can both be from prior art. This type of illumination device 40 is devised such that when light emitted from the organoelectroluminescent element 10 is incident on a light incidence face 30A of the light-scattering member 30, the incident light is scattered by the light-scattering member 30, and the scattered light exits a light emission face 30B as illuminating light.

WORKING EXAMPLES

The present invention will be described below in more concrete terms by giving working examples. The materials, reagents, substance quantities and ratios thereof, operations, and so forth given in the following working examples can be modified as needed without departing from the gist of the present invention. Therefore, the scope of the present invention is not limited to the following concrete examples:

The solvent mixing ratios given below are in volumetric ratio.

Synthesis Example 1

Synthesis of E-1

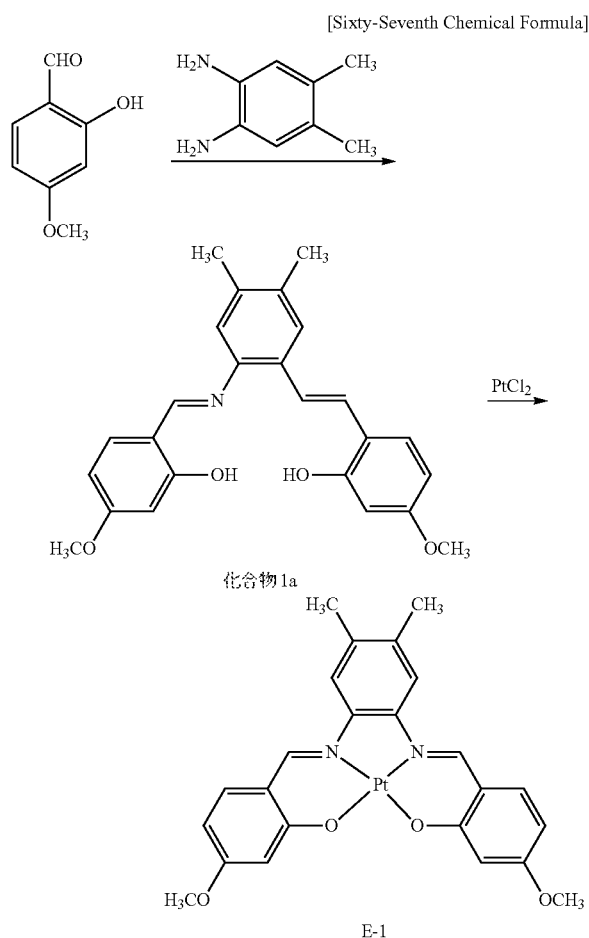

[Key for the text in the chemical formula: compound 1a]

(Synthesis of Compound 1a)

Five drops of acetic acid were dropped from a 1 mL Komagome pipette into an ethanol solution (30 mL) of 2-hydroxy-4-methoxybenzaldehyde (1.6 g) and 4,5-dimethyl-1,2-phenylenediamine (0.73 g), and [the system] was allowed to react for 6 hours at 80° C. The precipitated solids were filtered off and recrystallized with ethanol, which gave 2.0 g of compound 1a.

(Synthesis of E-1)

A DMSO (dimethyl sulfoxide) solution (15 mL) of $PtCl_2$ (0.61 g) was added dropwise at 80° C. to an acetonitrile solution (30 mL) of compound 1a (0.9 g) and sodium acetate (0.19 g), and [the system] was reacted for 7 hours. The reaction solution was filtered and recrystallized with THF, which gave 1.04 g of E-1. Note that the compound was identified by elemental analysis, NMR, and mass spectrography.

(Evaluation of PL (photoluminescence) retention)

Experimental Example 1

A washed quartz substrate was placed in a vapor deposition apparatus, and a film (light-emitting layer) was produced by co-depositing the host material and light-emitting material shown in Table 1 below at the light-emitting material doping concentration (weight concentration) shown in Table 1 below. This was termed Element B.

Metallic aluminum was then vapor-deposited in [a thickness of] 70 nm on the aforementioned film formed in Element B, thereby producing a cathode.

Without allowing it to touch the air, this laminate was placed in a glove box that had been replaced with nitrogen gas, and sealed using a glass sealing jar and a UV-setting adhesive (XNR5516HV, made by Nagase Chiba[12]). The element thus obtained was termed Element A.

[12] Translator's note: "Nagase Chiba" is now called "Nagase ChemteX."

The film (light-emitting layer) formed as described above was measured for its ART-IR deflection angle to calculate the order parameter (degree of orientation (S)) of the light-emitting material in the light-emitting layer of Element A and Element B.

Furthermore, C9220-02 absolute PL quantum efficiency measurement apparatus (made by Hamamatsu Photonics) was used to measure the quantum yield of each element, thereby measuring the absolute PL (photoluminescence) quantum efficiency of the Elements A and B that were produced. [The results were] termed PL (A) and PL (B), respectively.

The PL (A) and PL s(B) thus obtained were used to calculate the PL (photoluminescence) retention as follows:

$$PL\ \text{retention} = PL(A)/PL(B)$$

In general, when a metal (such as the aforementioned metallic aluminum) is laminated, of the phosphorescent component that is generated through photoexcitation, the optical wave component that vibrates in a direction perpendicular to the metal is quenched by the metal, and therefore not released from the film to the outside, so the quantum yield/PL retention decreases. On the other hand, quenching decreases and PL retention increases (that is, the PL is maintained) when the light-emitting material is oriented.

Experimental Examples 2 and 3

Other than changing the host material, the light-emitting material, and the doping concentration (weight concentration) of the light-emitting material in Experimental Example 1 as shown in Table 1 below, the order parameter (degree of orientation (S)) and the PL retention were found in the same manner as in Experimental Example 1. These results are given in Table 1 below:

TABLE 1

| | Light-emitting material | Doping concentration | Host material | Degree of orientation (S) | PL (A) | PL (B) | PL retention |
|---|---|---|---|---|---|---|---|
| Experimental Example 1 | E-1 | 15% | H-1 | 0.72 | 0.24 | 0.34 | 0.71 |
| Experimental Example 2 | E-1 | 9% | H-2 | 0.57 | 0.12 | 0.24 | 0.50 |
| Experimental Example 3 | E-2 | 10% | H-2 | 0.10 | 0.12 | 0.44 | 0.27 |

The structures of the host material and the light-emitting material given in Table 1 are shown below:

[Sixty-Eighth Chemical Formula]

E-1

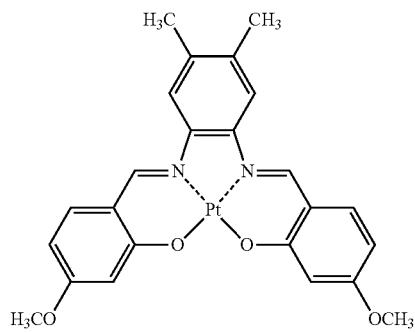

E-2

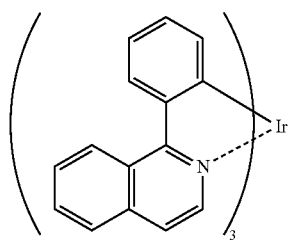

H-1

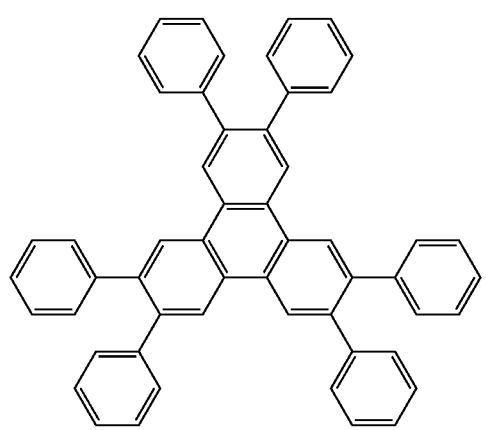

H-2

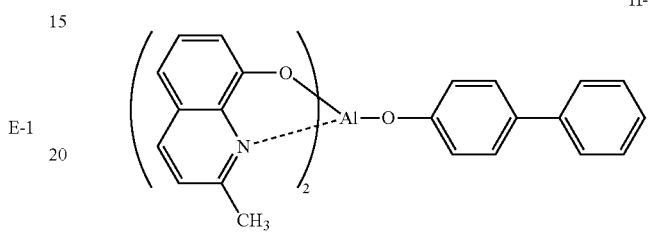

As can be seen from the results in Table 1, the higher is the order parameter (degree of orientation (S)) of the light-emitting material in the light-emitting layer, the higher is the PL retention, and in Experimental Example 1, in which the order parameter is 0.7 or more, the PL retention is particularly excellent. This is surmised to be because when the order parameter is 0.7 or more, the proportion of the emission of the component that undergoes quenching by metals is reduced significantly, and the efficiency of light extraction to the outside (glass substrate) is improved. Therefore, an element with an order parameter of at least 0.7, as in the present invention, allows a higher external quantum efficiency to be attained than a conventional element that does not satisfy such an order parameter condition.

Working Examples 1 to 3 and Comparative Examples 1 to 7

A glass substrate (OA-10, made by Nippon Electric Glass Co., surface resistance of 10 ohms/square (also referred to as Ω/sq.), refractive index of 1.47) having an ITO film measuring 2.5 cm² and 0.5 mm thick was put into a washing vessel and ultrasonically washed in 2-propanol, after which it was subjected to treatment with UV-ozone for 30 minutes. The following organic layers were sequentially deposited onto this transparent anode (ITO film) by a vacuum vapor deposition method:

First layer (hole injection layer): HIL-1; film thickness of 10 nm

Second layer (hole transport layer): HTL-1; film thickness of 50 nm

Third layer (light-emitting layer): E-1 and H-1 (weight ratio of 9:91); film thickness of 30 nm Fourth layer (first electron transport layer): Balq; film thickness of 5 nm Fifth layer (second electron transport layer): Alq$_3$; film thickness of 30 nm Over this, lithium fluoride was vapor-deposited in a thickness of 1 nm, followed by metallic aluminum in a thickness of 70 nm, which gave a cathode. Note that the lithium fluoride (1 nm) constitutes a layer located between the light-emitting layer and the cathode, but because it is an inorganic layer, it is not included in the thickness of the second intermediate organic layer of the present application.

This laminate was put in a glove box that had been replaced with nitrogen gas without coming into contact with the air, and was sealed using a glass sealing jar and a UV-setting adhesive (XNR5516HV, made by Nagase Chiba), which gave the element of Working Example 1.

Moreover, the order parameter (degree of orientation (S)) of the light-emitting material in the light-emitting layer of the element in Working Example 1 was obtained by placing a washed quartz substrate in a vapor deposition apparatus, co-depositing the host material and the light-emitting material having the same materials and compositions as the aforementioned third layer (light-emitting layer) to produce a film (light-emitting layer), and measuring the ATR-IR deflection thereof to calculate the order parameter (degree of orientation (S)) of the light-emitting material in this film, and the value thus obtained was used. Note that the light-emitting material being oriented in the horizontal direction with the substrate was confirmed by the fact that the order parameter (degree of orientation (S)) of the light-emitting material calculated in this way was 0.7 or more.

Other than changing the film thicknesses and materials of the various layers to the thicknesses and materials shown in Table 2 below, elements of Working Examples 2 and 3 and Comparative Examples 1 to 7 were obtained in the same manner as in Working Example 1.

The performance of the elements was evaluated as follows:

(a) External Quantum Efficiency

Using a source measurement unit 2400 made by Toyo Technica, DC voltage was applied to each element to cause it to emit light, and the brightness thereof was measured using a BM-8 brightness meter made by Topcon. The emission wavelength and the emission spectrum were measured using a PMA-11 spectrum analyzer made by Hamamatsu Photonics. Based on these [results], the external quantum efficiency when the brightness was close to 500 cd/m$^2$ was calculated by a brightness conversion method.

Note that the results for Working Examples 1 to 3 and Comparative Examples 1 to 3 given in Table 2 are relative values obtained using 1.0 for the external quantum efficiency in Comparative Example 1. For the efficiency, a larger number is preferable.

In addition, the results for Comparative Examples 4 and 5 given in Table 2 are relative values obtained using 1.0 for the external quantum efficiency in Comparative Example 5, and the results for Comparative Examples 6 and 7 are relative values obtained using 1.0 for the external quantum efficiency in Comparative Example 7.

(b) Power Efficiency

Using a source measurement unit 2400 made by Toyo Technica, DC voltage was applied to each element to cause it to emit light, and the brightness thereof was measured using a BM-8 brightness meter made by Topcon. The emission wavelength and the emission spectrum were measured using a PMA-11 spectrum analyzer made by Hamamatsu Photonics. Based on these [results], the power efficiency (lm/W) when the brightness was close to 500 cd/m$^2$ was calculated. Note that the results for Working Examples 1 to 3 and Comparative Examples 1 to 3 given in Table 2 are relative values obtained using 1.0 for the power efficiency in Comparative Example 1. Furthermore, the results for Comparative Examples 4 and 5 given in Table 2 are relative values obtained using 1.0 for the power efficiency in Comparative Example 5, and the results for Comparative Examples 6 and 7 are relative values obtained using 1.0 for the power efficiency in Comparative Example 7. For the efficiency, a larger number is preferable.

The above results are given in Table 2 below along with the film thickness T1 of the first intermediate organic layer, the film thickness T2 of the second intermediate organic layer, the T1/T2 value, and the maximum emission wavelength of the light-emitting material, for each element.

TABLE 2

| | Hole injection layer | | Hole transport layer | | Light-emitting layer | | | First electron transport layer | | Second electron transport layer | |
|---|---|---|---|---|---|---|---|---|---|---|---|
| | Material | Thickness (nm) | Material | Thickness (nm) | Light-emitting material | Host material | Thickness (nm) | Material | Thickness (nm) | Material | Thickness (nm) |
| Working Example 1 | HIL-1 | 10 | HTL-1 | 50 | E-1 | H-1 | 30 | Balq | 5 | Alq$_3$ | 30 |
| Working Example 2 | HIL-1 | 10 | HTL-1 | 38 | E-1 | H-1 | 30 | Balq | 5 | Alq$_3$ | 35 |
| Working Example 3 | HIL-1 | 10 | HTL-1 | 100 | E-1 | H-1 | 30 | Balq | 5 | Alq$_3$ | 35 |
| Comparative Ex. 1 | HIL-1 | 10 | HTL-1 | 30 | E-1 | H-1 | 30 | Balq | 5 | Alq$_3$ | 45 |
| Comparative Ex. 2 | HIL-1 | 10 | HTL-1 | 160 | E-1 | H-1 | 30 | Balq | 5 | Alq$_3$ | 80 |
| Comparative Ex. 3 | HIL-1 | 10 | HTL-1 | 160 | E-1 | H-1 | 30 | Balq | 5 | Alq$_3$ | 35 |
| Comparative Ex. 4 | HIL-1 | 10 | HTL-1 | 50 | E-1 | H-2 | 30 | ETL-1 | 3 | Alq$_3$ | 32 |
| Comparative Ex. 5 | HIL-1 | 10 | HTL-1 | 33 | E-1 | H-2 | 30 | ETL-1 | 3 | Alq$_3$ | 45 |
| Comparative Ex. 6 | HIL-1 | 10 | HTL-1 | 50 | E-2 | H-2 | 30 | Balq | 5 | Alq$_3$ | 30 |
| Comparative Ex. 7 | HIL-1 | 10 | HTL-1 | 30 | E-2 | H-2 | 30 | Balq | 5 | Alq$_3$ | 45 |

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 1 | 0.73 | 60 | 35 | 1.7 | 1.3 | 1.6 | 600 |
| Working Example 2 | 0.73 | 48 | 40 | 1.2 | 1.1 | 1.2 | 600 |
| Working Example 3 | 0.73 | 110 | 40 | 2.8 | 1.8 | 1.9 | 600 |
| Comparative Example 1 | 0.73 | 40 | 50 | 0.8 | 1.0 (reference) | 1.0 (reference) | 600 |
| Comparative Example 2 | 0.73 | 170 | 85 | 2.0 | 0.8 | 0.7 | 600 |
| Comparative Example 3 | 0.73 | 170 | 40 | 4.3 | 0.9 | 0.9 | 600 |
| Comparative Example 4 | 0.57 | 60 | 35 | 1.7 | 1.0 | 1.0 | 600 |
| Comparative Example 5 | 0.57 | 43 | 48 | 0.9 | 1.0 (reference) | 1.0 (reference) | 600 |
| Comparative Example 6 | 0.15 | 60 | 35 | 1.7 | 0.8 | 0.8 | 624 |
| Comparative Example 7 | 0.15 | 40 | 50 | 0.8 | 1.0 (reference) | 1.0 (reference) | 624 |

The structures of materials other than the aforementioned ones given in Table 2 will be shown below:

[Sixty-Ninth Chemical Formula]

HIL-1

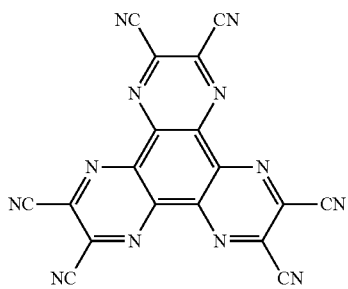

HTL-1

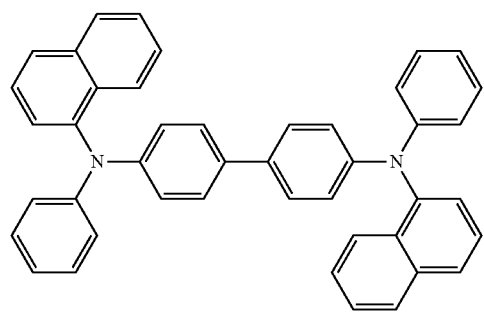

Balq

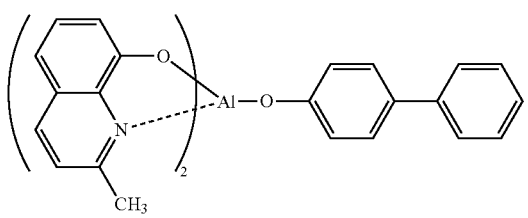

Alq3

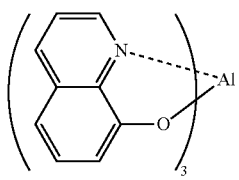

-continued

ETL-1

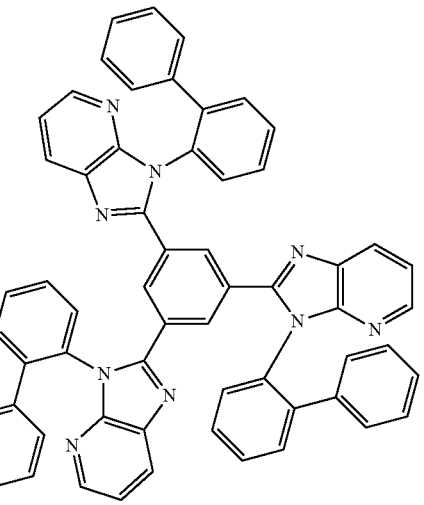

As can be seen from the results in Table 2, a comparison of Working Examples 1 to 3 and Comparative Examples 1 to 3, in which the order parameter (degree of orientation (S)) is the same, reveals that the external quantum efficiency and the power efficiency were better in Working Examples 1 to 3, in which the relationships 1.1<T1/T2<4.0 and also T2<80 nm were satisfied, than in Comparative Examples to 1 to 3. Moreover, as can be seen from Comparative Examples 4 and 5 and Comparative Examples 6 and 7, when the order parameter (degree of orientation (S)) was less than 0.7, the external quantum efficiency and the power efficiency in Comparative Examples 4 and 6, in which the relationship 1.1<T1/T2<4.0 was satisfied, tended to be the same as or inferior to those in Comparative Examples 5 and 7, in which this relationship was not satisfied.

As was described above, it can be seen that with the working examples of the present invention, in which the order parameter (degree of orientation (S)) is at least 0.7, and the relationships 1.1<T1/T2<4.0 and also T2<80 nm are satisfied, it is possible to satisfy both high external quantum efficiency and high power efficiency at the same time.

Working Example 4

A glass substrate (OA-10, made by Nippon Electric Glass Co., ITO layer thickness of 70 nm, refractive index of 1.47) having an ITO film measuring 2.5 cm² and 0.7 mm thick was put into a washing vessel and ultrasonically washed in 2-propanol, after which it was subjected to treatment with UV-ozone for 30 minutes. The following organic layers were sequentially deposited onto this transparent anode (ITO film) by a vacuum vapor deposition method:

First layer (hole injection layer): HIL-2; film thickness of 40 nm

Second layer (hole transport layer): HTL-2; film thickness of 10 nm

Third layer (light-emitting layer): BE-1 and H-3 (weight ratio of 5:95); film thickness of 30 nm Fourth layer (first electron transport layer): ETL-3; film thickness of 30 nm Over this, lithium fluoride was vapor-deposited in a thickness of 1 nm, followed by metallic aluminum in a thickness of 70 nm, which gave a cathode. Note that the lithium fluoride (1 nm) constitutes a layer located between the light-emitting layer and the cathode, but because it is an inorganic layer, it is not included in the thickness of the second intermediate organic layer of the present application.

This laminate was put in a glove box that had been replaced with nitrogen gas without coming into contact with the air, and was sealed using a glass sealing jar and a UV-setting adhesive (XNR5516HV, made by Nagase Chiba), which gave the element of Working Example 4-1.

Other than changing the film thicknesses and materials of the various layers to the thicknesses and materials shown in Table 3 below, elements of Working Examples 4-2 to 4-9 and Comparative Examples 8-1 to 8-5 were obtained in the same manner as in Working Example 4-1.

The external quantum efficiency and the power efficiency were calculated in the same manner as in Working Example 1. Relative values with the results of Comparative Example 8-1 being used as the references are given in Table 3 below along with the order parameter (degree of orientation (S)) of the light-emitting material as well as the T1, the T2, the T1/T2 value, and the maximum emission wavelength of the light-emitting material, for each element.

TABLE 3

| | Hole injection layer | | Hole transport layer | | Light-emitting layer | | | Electron transport layer | |
|---|---|---|---|---|---|---|---|---|---|
| | Material | Thickness (nm) | Material | Thickness (nm) | Light-emitting material | Host material | Thickness (nm) | Material | Thickness (nm) |
| Working Example 4-1 | HIL-2 | 40 | HTL-2 | 10 | BE-1 | H-3 | 30 | ETL-3 | 30 |
| Working Example 4-2 | HIL-2 | 40 | HTL-2 | 5 | BE-1 | H-3 | 30 | ETL-3 | 30 |
| Working Example 4-3 | HIL-2 | 44 | HTL-2 | 10 | BE-1 | H-3 | 30 | ETL-3 | 30 |
| Working Example 4-4 | HIL-2 | 50 | HTL-2 | 13 | BE-1 | H-3 | 30 | ETL-3 | 35 |
| Working Example 4-5 | HIL-2 | 55 | HTL-2 | 15 | BE-1 | H-3 | 30 | ETL-3 | 25 |
| Working Example 4-6 | HIL-2 | 40 | HTL-2 | 8 | BE-1 | H-3 | 30 | ETL-3 | 40 |
| Working Example 4-7 | HIL-2 | 60 | HTL-2 | 10 | BE-1 | H-3 | 30 | ETL-3 | 50 |
| Working Example 4-8 | HIL-2 | 58 | HTL-2 | 20 | BE-1 | H-3 | 30 | ETL-3 | 65 |
| Working Example 4-9 | HIL-2 | 59 | HTL-2 | 10 | BE-1 | H-3 | 30 | ETL-3 | 60 |
| Comparative Example 8-1 | HIL-2 | 96 | HTL-2 | 30 | BE-1 | H-3 | 30 | ETL-3 | 30 |
| Comparative Example 8-2 | HIL-2 | 30 | HTL-2 | 10 | BE-1 | H-3 | 30 | ETL-3 | 40 |
| Comparative Example 8-3 | HIL-2 | 14 | HTL-2 | 10 | BE-1 | H-3 | 30 | ETL-3 | 15 |
| Comparative Example 8-4 | HIL-2 | 98 | HTL-2 | 30 | BE-1 | H-3 | 30 | ETL-3 | 80 |
| Comparative Example 8-5 | HIL-2 | 45 | HTL-2 | 15 | BE-1 | H-3 | 30 | ETL-3 | 15 |

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 4-1 | 0.7 | 50 | 30 | 1.67 | 1.9 | 1.8 | 465 |
| Working Example 4-2 | 0.7 | 45 | 30 | 1.50 | 1.6 | 1.5 | 465 |
| Working Example 4-3 | 0.7 | 54 | 30 | 1.80 | 1.5 | 1.5 | 465 |
| Working Example 4-4 | 0.7 | 63 | 35 | 1.80 | 1.6 | 1.6 | 465 |
| Working Example 4-5 | 0.7 | 70 | 25 | 2.80 | 1.2 | 1.1 | 465 |
| Working Example 4-6 | 0.7 | 48 | 40 | 1.20 | 1.7 | 1.5 | 465 |
| Working Example 4-7 | 0.7 | 70 | 50 | 1.40 | 1.6 | 1.5 | 465 |
| Working Example 4-8 | 0.7 | 78 | 65 | 1.20 | 1.1 | 1.1 | 465 |
| Working Example 4-9 | 0.7 | 69 | 60 | 1.15 | 1.0 | 1.1 | 465 |
| Comparative Example 8-1 | 0.7 | 126 | 30 | 4.20 | 1.0 (reference) | 1.0 (reference) | 465 |
| Comparative Example 8-2 | 0.7 | 40 | 40 | 1.00 | 0.9 | 1.0 | 465 |
| Comparative Example 8-3 | 0.7 | 24 | 15 | 1.60 | 0.9 | 0.8 | 465 |
| Comparative Example 8-4 | 0.7 | 128 | 80 | 1.60 | 0.7 | 0.6 | 465 |
| Comparative Example 8-5 | 0.7 | 60 | 15 | 4.00 | 0.5 | 0.5 | 465 |

Working Example 5

Other than changing the film thicknesses and materials of the various layers to the thicknesses and materials shown in Table 4 below, elements of Working Examples 5-1 to 5-9 and Comparative Examples 9-1 to 9-5 were obtained in the same manner as in Working Example 4-1.

The external quantum efficiency and the power efficiency were calculated in the same manner as in Working Example 1. Relative values with the results of Comparative Example 9-1 being used as the references are given in Table 4 below along with the order parameter (degree of orientation (S)) of the light-emitting material as well as the T1, the T2, the T1/T2 value, and the maximum emission wavelength of the light-emitting material, for each element.

TABLE 4

| | Hole injection layer | | Hole transport layer | | Light-emitting layer | | | Electron transport layer | |
|---|---|---|---|---|---|---|---|---|---|
| | Material | Thickness (nm) | Material | Thickness (nm) | Light-emitting material | Host material | Thickness (nm) | Material | Thickness (nm) |
| Working Example 5-1 | HIL-2 | 40 | HTL-2 | 10 | BE-2 | H-3 | 30 | ETL-3 | 32 |
| Working Example 5-2 | HIL-2 | 40 | HTL-2 | 5 | BE-2 | H-3 | 30 | ETL-3 | 30 |
| Working Example 5-3 | HIL-2 | 44 | HTL-2 | 10 | BE-2 | H-3 | 30 | ETL-3 | 30 |
| Working Example 5-4 | HIL-2 | 50 | HTL-2 | 13 | BE-2 | H-3 | 30 | ETL-3 | 35 |
| Working Example 5-5 | HIL-2 | 55 | HTL-2 | 15 | BE-2 | H-3 | 30 | ETL-3 | 25 |
| Working Example 5-6 | HIL-2 | 40 | HTL-2 | 15 | BE-2 | H-3 | 30 | ETL-3 | 42 |
| Working Example 5-7 | HIL-2 | 60 | HTL-2 | 10 | BE-2 | H-3 | 30 | ETL-3 | 50 |
| Working Example 5-8 | HIL-2 | 58 | HTL-2 | 20 | BE-2 | H-3 | 30 | ETL-3 | 65 |
| Working Example 5-9 | HIL-2 | 59 | HTL-2 | 10 | BE-2 | H-3 | 30 | ETL-3 | 60 |
| Comparative Example 9-1 | HIL-2 | 96 | HTL-2 | 30 | BE-2 | H-3 | 30 | ETL-3 | 30 |
| Comparative Example 9-2 | HIL-2 | 30 | HTL-2 | 10 | BE-2 | H-3 | 30 | ETL-3 | 40 |
| Comparative Example 9-3 | HIL-2 | 14 | HTL-2 | 10 | BE-2 | H-3 | 30 | ETL-3 | 15 |
| Comparative Example 9-4 | HIL-2 | 98 | HTL-2 | 30 | BE-2 | H-3 | 30 | ETL-3 | 80 |
| Comparative Example 9-5 | HIL-2 | 45 | HTL-2 | 15 | BE-2 | H-3 | 30 | ETL-3 | 15 |

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 5-1 | 0.75 | 50 | 32 | 1.56 | 2.1 | 2.0 | 460 |
| Working Example 5-2 | 0.75 | 45 | 30 | 1.50 | 1.8 | 1.6 | 460 |
| Working Example 5-3 | 0.75 | 54 | 30 | 1.80 | 1.6 | 1.6 | 460 |
| Working Example 5-4 | 0.75 | 63 | 35 | 1.80 | 1.7 | 1.6 | 460 |
| Working Example 5-5 | 0.75 | 70 | 25 | 2.80 | 1.2 | 1.1 | 460 |
| Working Example 5-6 | 0.75 | 55 | 42 | 1.30 | 1.6 | 1.5 | 460 |
| Working Example 5-7 | 0.75 | 70 | 50 | 1.40 | 1.7 | 1.6 | 460 |
| Working Example 5-8 | 0.75 | 78 | 65 | 1.20 | 1.2 | 1.1 | 460 |
| Working Example 5-9 | 0.75 | 69 | 60 | 1.15 | 1.1 | 1.1 | 460 |
| Comparative Example 9-1 | 0.75 | 126 | 30 | 4.20 | 1.0 (reference) | 1.0 (reference) | 460 |
| Comparative Example 9-2 | 0.75 | 40 | 40 | 1.00 | 0.9 | 0.8 | 460 |
| Comparative Example 9-3 | 0.75 | 24 | 15 | 1.60 | 0.8 | 0.8 | 460 |
| Comparative Example 9-4 | 0.75 | 128 | 80 | 1.60 | 0.7 | 0.6 | 460 |
| Comparative Example 9-5 | 0.75 | 60 | 15 | 4.00 | 0.6 | 0.5 | 460 |

Working Example 6

Other than changing the film thicknesses and materials of the various layers to the thicknesses and materials shown in Table 5 below, elements of Working Examples 6-1 to 6-9 and Comparative Examples 10-1 to 10-5 were obtained in the same manner as in Working Example 4-1.

The external quantum efficiency and the power efficiency were calculated in the same manner as in Working Example 1. Relative values with the results of Comparative Example 10-1 being used as the references are given in Table 5 below along with the order parameter (degree of orientation (S)) of the light-emitting material as well as the T1, the T2, the T1/T2 value, and the maximum emission wavelength of the light-emitting material, for each element.

TABLE 5

| | Hole injection layer | | Hole transport layer | | Light-emitting layer | | | Electron transport layer | |
|---|---|---|---|---|---|---|---|---|---|
| | Material | Thickness (nm) | Material | Thickness (nm) | Light-emitting material | Host material | Thickness (nm) | Material | Thickness (nm) |
| Working Example 6-1 | HIL-2 | 40 | HTL-2 | 10 | BE-3 | H-3 | 30 | ETL-3 | 30 |
| Working Example 6-2 | HIL-2 | 40 | HTL-2 | 5 | BE-3 | H-3 | 30 | ETL-3 | 30 |
| Working Example 6-3 | HIL-2 | 44 | HTL-2 | 10 | BE-3 | H-3 | 30 | ETL-3 | 30 |
| Working Example 6-4 | HIL-2 | 50 | HTL-2 | 13 | BE-3 | H-3 | 30 | ETL-3 | 35 |
| Working Example 6-5 | HIL-2 | 55 | HTL-2 | 15 | BE-3 | H-3 | 30 | ETL-3 | 25 |
| Working Example 6-6 | HIL-2 | 40 | HTL-2 | 8 | BE-3 | H-3 | 30 | ETL-3 | 40 |
| Working Example 6-7 | HIL-2 | 60 | HTL-2 | 10 | BE-3 | H-3 | 30 | ETL-3 | 50 |
| Working Example 6-8 | HIL-2 | 58 | HTL-2 | 20 | BE-3 | H-3 | 30 | ETL-3 | 65 |
| Working Example 6-9 | HIL-2 | 59 | HTL-2 | 10 | BE-3 | H-3 | 30 | ETL-3 | 60 |
| Comparative Example 10-1 | HIL-2 | 99 | HTL-2 | 30 | BE-3 | H-3 | 30 | ETL-3 | 30 |
| Comparative Example 10-2 | HIL-2 | 30 | HTL-2 | 10 | BE-3 | H-3 | 30 | ETL-3 | 40 |

TABLE 5-continued

| | | | | | | | | | |
|---|---|---|---|---|---|---|---|---|---|
| Comparative Example 10-3 | HIL-2 | 14 | HTL-2 | 10 | BE-3 | H-3 | 30 | ETL-3 | 15 |
| Comparative Example 10-4 | HIL-2 | 98 | HTL-2 | 30 | BE-3 | H-3 | 30 | ETL-3 | 80 |
| Comparative Example 10-5 | HIL-2 | 45 | HTL-2 | 15 | BE-3 | H-3 | 30 | ETL-3 | 15 |

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 6-1 | 0.7 | 50 | 30 | 1.67 | 2.1 | 2.0 | 450 |
| Working Example 6-2 | 0.7 | 45 | 30 | 1.50 | 1.7 | 1.6 | 450 |
| Working Example 6-3 | 0.7 | 54 | 30 | 1.80 | 1.6 | 1.5 | 450 |
| Working Example 6-4 | 0.7 | 63 | 35 | 1.80 | 1.6 | 1.6 | 450 |
| Working Example 6-5 | 0.7 | 70 | 25 | 2.80 | 1.1 | 1.1 | 450 |
| Working Example 6-6 | 0.7 | 48 | 40 | 1.20 | 1.7 | 1.5 | 450 |
| Working Example 6-7 | 0.7 | 70 | 50 | 1.40 | 1.6 | 1.4 | 450 |
| Working Example 6-8 | 0.7 | 78 | 65 | 1.20 | 1.2 | 1.1 | 450 |
| Working Example 6-9 | 0.7 | 69 | 60 | 1.15 | 1.0 | 1.1 | 450 |
| Comparative Example 10-1 | 0.7 | 129 | 30 | 4.30 | 1.0 (reference) | 1.0 (reference) | 450 |
| Comparative Example 10-2 | 0.7 | 40 | 40 | 1.00 | 0.9 | 0.9 | 450 |
| Comparative Example 10-3 | 0.7 | 24 | 15 | 1.60 | 0.7 | 0.6 | 450 |
| Comparative Example 10-4 | 0.7 | 128 | 80 | 1.60 | 0.6 | 0.6 | 450 |
| Comparative Example 10-5 | 0.7 | 60 | 15 | 4.00 | 0.4 | 0.4 | 450 |

Working Example 7

Other than changing the film thicknesses and materials of the various layers to the thicknesses and materials shown in Table 6 below, elements of Working Examples 7-1 to 7-9 and Comparative Examples 11-1 to 11-5 were obtained in the same manner as in Working Example 4-1.

The external quantum efficiency and the power efficiency were calculated in the same manner as in Working Example 1. Relative values with the results of Comparative Example 11-1 being used as the references are given in Table 6 below along with the order parameter (degree of orientation (S)) of the light-emitting material as well as the T1, the T2, the T1/T2 value, and the maximum emission wavelength of the light-emitting material, for each element.

TABLE 6

| | Hole injection layer | | Hole transport layer | | Light-emitting layer | | | Electron transport layer | |
|---|---|---|---|---|---|---|---|---|---|
| | Material | Thickness (nm) | Material | Thickness (nm) | Light-emitting material | Host material | Thickness (nm) | Material | Thickness (nm) |
| Working Example 7-1 | HIL-2 | 40 | HTL-2 | 10 | BE-4 | H-3 | 30 | ETL-3 | 32 |
| Working Example 7-2 | HIL-2 | 40 | HTL-2 | 5 | BE-4 | H-3 | 30 | ETL-3 | 30 |
| Working Example 7-3 | HIL-2 | 44 | HTL-2 | 10 | BE-4 | H-3 | 30 | ETL-3 | 30 |
| Working Example 7-4 | HIL-2 | 50 | HTL-2 | 13 | BE-4 | H-3 | 30 | ETL-3 | 35 |
| Working Example 7-5 | HIL-2 | 55 | HTL-2 | 15 | BE-4 | H-3 | 30 | ETL-3 | 25 |
| Working Example 7-6 | HIL-2 | 40 | HTL-2 | 15 | BE-4 | H-3 | 30 | ETL-3 | 42 |
| Working Example 7-7 | HIL-2 | 60 | HTL-2 | 10 | BE-4 | H-3 | 30 | ETL-3 | 50 |
| Working Example 7-8 | HIL-2 | 58 | HTL-2 | 20 | BE-4 | H-3 | 30 | ETL-3 | 65 |
| Working Example 7-9 | HIL-2 | 59 | HTL-2 | 10 | BE-4 | H-3 | 30 | ETL-3 | 60 |
| Comparative Example 11-1 | HIL-2 | 96 | HTL-2 | 30 | BE-4 | H-3 | 30 | ETL-3 | 30 |
| Comparative Example 11-2 | HIL-2 | 30 | HTL-2 | 10 | BE-4 | H-3 | 30 | ETL-3 | 40 |
| Comparative Example 11-3 | HIL-2 | 14 | HTL-2 | 10 | BE-4 | H-3 | 30 | ETL-3 | 15 |
| Comparative Example 11-4 | HIL-2 | 98 | HTL-2 | 30 | BE-4 | H-3 | 30 | ETL-3 | 80 |
| Comparative Example 11-5 | HIL-2 | 45 | HTL-2 | 15 | BE-4 | H-3 | 30 | ETL-3 | 15 |

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 7-1 | 0.84 | 50 | 32 | 1.56 | 2.4 | 2.3 | 440 |
| Working Example 7-2 | 0.84 | 45 | 30 | 1.50 | 2.0 | 1.9 | 440 |
| Working Example 7-3 | 0.84 | 54 | 30 | 1.80 | 1.8 | 1.8 | 440 |
| Working Example 7-4 | 0.84 | 63 | 35 | 1.80 | 1.8 | 1.7 | 440 |
| Working Example 7-5 | 0.84 | 70 | 25 | 2.80 | 1.3 | 1.2 | 440 |
| Working Example 7-6 | 0.84 | 55 | 42 | 1.30 | 1.7 | 1.5 | 440 |
| Working Example 7-7 | 0.84 | 70 | 50 | 1.40 | 1.7 | 1.6 | 440 |
| Working Example 7-8 | 0.84 | 78 | 65 | 1.20 | 1.4 | 1.2 | 440 |
| Working Example 7-9 | 0.84 | 69 | 60 | 1.15 | 1.2 | 1.2 | 440 |
| Comparative Example 11-1 | 0.84 | 126 | 30 | 4.20 | 1.0 (reference) | 1.0 (reference) | 440 |
| Comparative Example 11-2 | 0.84 | 40 | 40 | 1.00 | 0.9 | 0.9 | 440 |
| Comparative Example 11-3 | 0.84 | 24 | 15 | 1.60 | 0.8 | 0.8 | 440 |
| Comparative Example 11-4 | 0.84 | 128 | 80 | 1.60 | 0.8 | 0.6 | 440 |
| Comparative Example 11-5 | 0.84 | 60 | 15 | 4.00 | 0.7 | 0.7 | 440 |

The structures of the materials given in Tables 3 to 6 are shown below:
[Seventieth Chemical Formula]
HIL-2
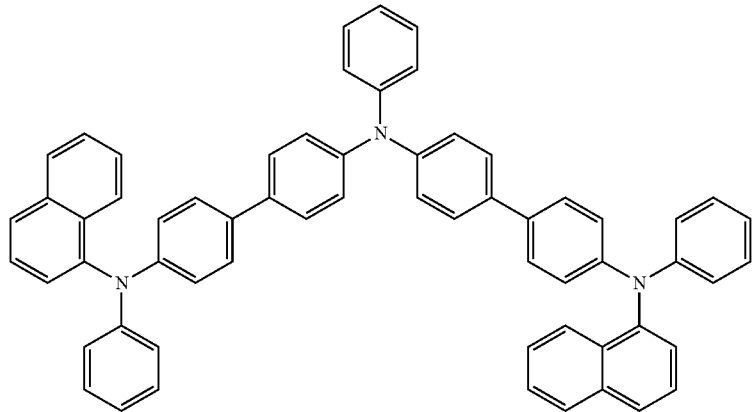
HTL-2
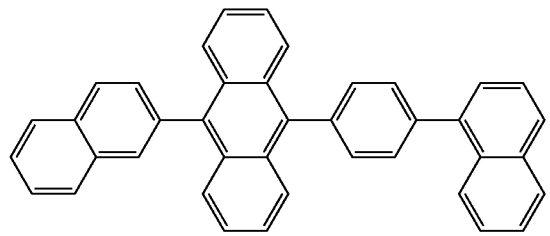
H-3
ETL-3
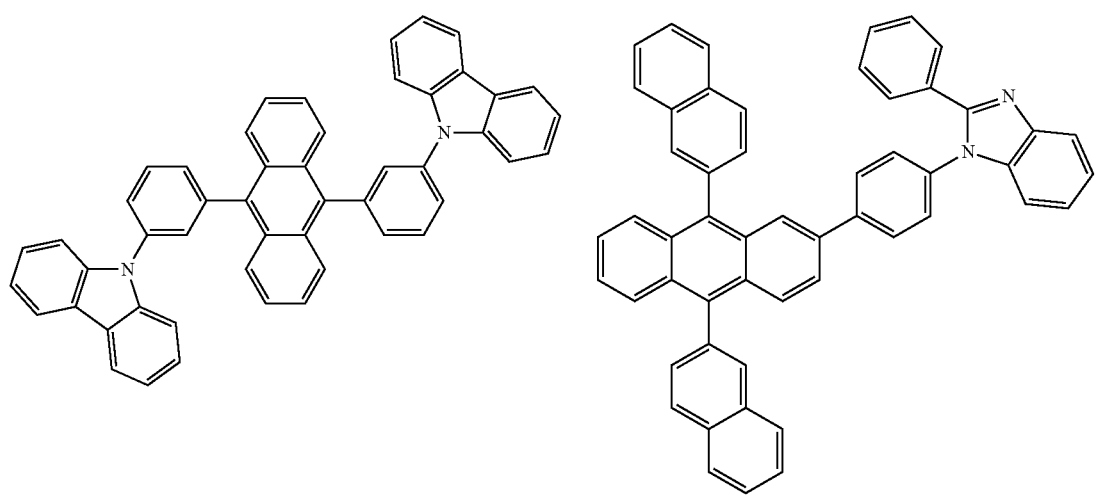

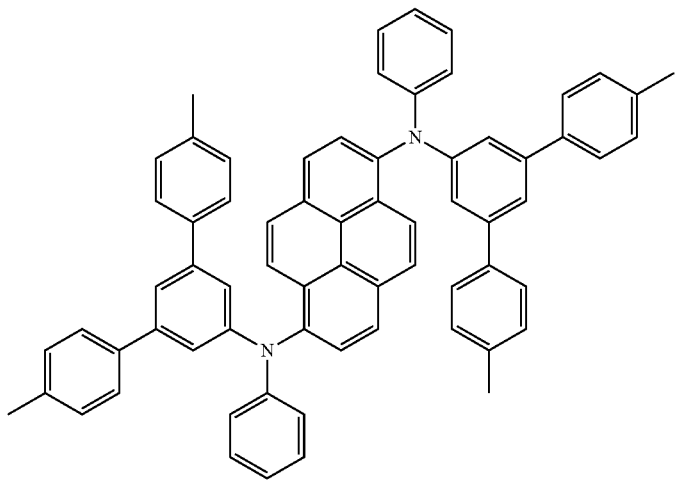
BE-1
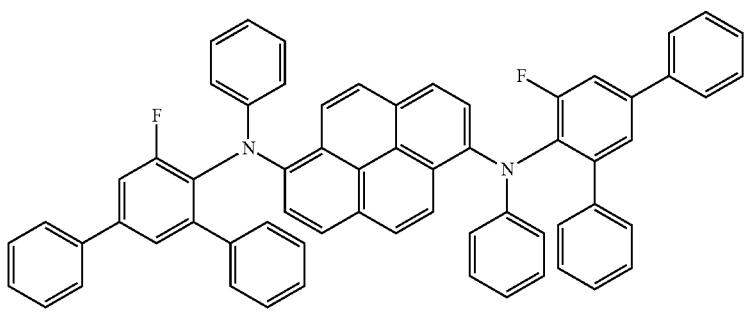
BE-2
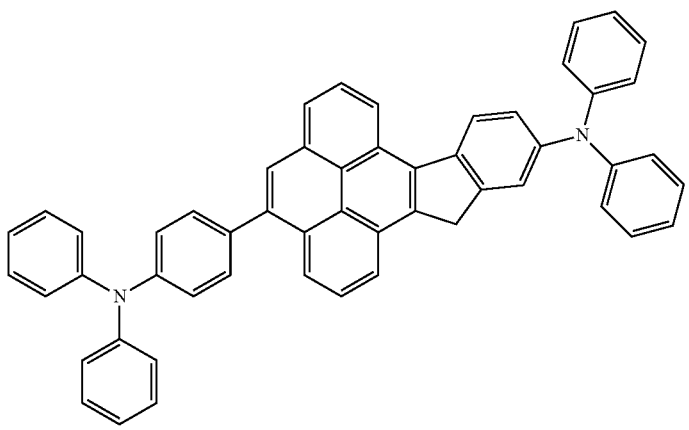
BE-3
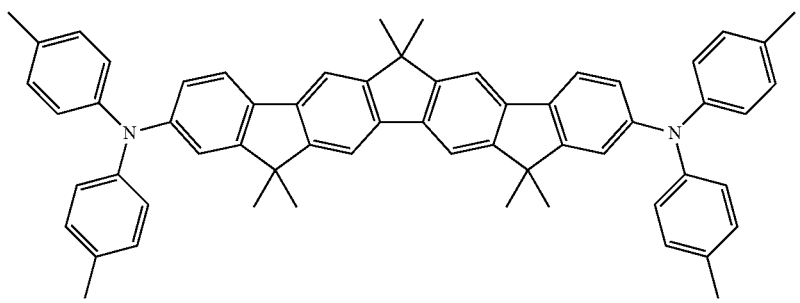
BE-4

It can be seen from the results in Tables 3 to 6 that even when a fluorescent material is used as the light-emitting material, it is possible to satisfy both high external quantum efficiency and high power efficiency at the same time with the working examples of the present invention, in which the order parameter (degree of orientation (S)) is at least 0.7, and the relationships 1.1<T1/T2<4.0 and also 20 nm<T2<80 nm are satisfied.

Example 12 being used as the references are given in Table 7 below along with the order parameter (degree of orientation (S)) of the light-emitting material as well as the T1, the T2, the T1/T2 value, and the maximum emission wavelength of the light-emitting material, for each element.

TABLE 7

|  | Orientation (S) | T1 (nm) | T2 (nm) | T1/T2 | External quantum efficiency (relative value) | Power efficiency (relative value) | Maximum emission wavelength (nm) |
| --- | --- | --- | --- | --- | --- | --- | --- |
| Working Example 8 | 0.7 | 50 | 30 | 1.67 | 1.9 | 1.9 | 465 |
| Comparative Example 12 | 0.7 | 125 | 30 | 4.17 | 1.0 (reference) | 1.0 (reference) | 465 |

Working Example 8

A glass substrate (OA-10, made by Nippon Electric Glass Co., ITO layer thickness of 70 nm, substrate refractive index of 1.47) having an ITO film measuring 2.5 cm$^2$ and 0.7 mm thick was put into a washing vessel and ultrasonically washed in 2-propanol, after which it was subjected to treatment with UV-ozone for 30 minutes. The following organic layers were sequentially deposited onto this transparent anode (ITO film) by a vacuum vapor deposition method:

First layer (hole injection layer): HIL-2; film thickness of 40 nm

Second layer (hole transport layer): HTL-2; film thickness of 10 nm

Third layer (light-emitting layer): BE-1 and H-3 (weight ratio of 5:95); film thickness of 25 nm Fourth layer (first electron transport layer): ETL-1; film thickness of 30 nm Over this, lithium fluoride was vapor-deposited in a thickness of 1 nm, followed by metallic aluminum in a thickness of 70 nm, which gave a cathode. Note that the lithium fluoride (1 nm) constitutes a layer located between the light-emitting layer and the cathode, but because it is an inorganic layer, it is not included in the thickness of the second intermediate organic layer of the present application.

This laminate was put in a glove box that had been replaced with nitrogen gas without coming into contact with the air, and was sealed using a glass sealing jar and a UV-setting adhesive (XNR5516HV, made by Nagase Chiba), which gave the element of Working Example 8.

Comparative Example 12

Other than changing as follows, the element of Comparative Example 12 was obtained in the same manner as in Working Example 8:

First layer (hole injection layer): HIL-2; film thickness of 95 nm

Second layer (hole transport layer): HTL-2; film thickness of 30 nm

For the elements of Working Example 8 and Comparative Example 12, the external quantum efficiency and the power efficiency were calculated in the same manner as in Working Example 1. Relative values with the results of Comparative

Working Example 9

A glass substrate (OA-10, made by Nippon Electric Glass Co., ITO layer thickness of 70 nm, substrate refractive index of 1.47) having an ITO film measuring 2.5 cm$^2$ and 0.7 mm thick was put into a washing vessel and ultrasonically washed in 2-propanol, after which it was subjected to treatment with UV-ozone for 30 minutes. The following organic layers were sequentially deposited onto this transparent anode (ITO film) by a vacuum vapor deposition method:

First layer (hole injection layer): HIL-2; film thickness of 40 nm

Second layer (hole transport layer): HTL-2; film thickness of 10 nm

Third layer (light-emitting layer): BE-1 and H-3 (weight ratio of 5:95); film thickness of 40 nm Fourth layer (first electron transport layer): ETL-1; film thickness of 30 nm Over this, lithium fluoride was vapor-deposited in a thickness of 1 nm, followed by metallic aluminum in a thickness of 70 nm, which gave a cathode. Note that the lithium fluoride (1 nm) constitutes a layer located between the light-emitting layer and the cathode, but because it is an inorganic layer, it is not included in the thickness of the second intermediate organic layer of the present application.

This laminate was put in a glove box that had been replaced with nitrogen gas without coming into contact with the air, and was sealed using a glass sealing jar and a UV-setting adhesive (XNR5516HV, made by Nagase Chiba), which gave the element of Working Example 9.

Comparative Example 13

Other than changing as follows, the element of Comparative Example 13 was obtained in the same manner as in Working Example 9:

First layer (hole injection layer): HIL-2; film thickness of 95 nm

Second layer (hole transport layer): HTL-2; film thickness of 30 nm

The external quantum efficiency and the power efficiency of the elements of Working Example 9 and Comparative Example 13 were calculated in the same manner as in Working Example 1. Relative values with the results of Comparative Example 13 being used as the references are given in Table 8 below along with the order parameter (degree of orientation (S)) of the light-emitting material as well as the T1, the T2, the T1/T2 value, and the maximum emission wavelength of the light-emitting material, for each element.

TABLE 8

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 9 | 0.7 | 50 | 30 | 1.67 | 1.8 | 1.7 | 465 |
| Comparative Example 13 | 0.7 | 125 | 30 | 4.17 | 1.0 (reference) | 1.0 (reference) | 465 |

Working Example 10-1

A glass substrate (OA-10, made by Nippon Electric Glass Co., ITO layer thickness of 50 nm, substrate refractive index of 1.47) having an ITO film measuring 2.5 cm$^2$ and 0.7 mm thick was put into a washing vessel and ultrasonically washed in 2-propanol, after which it was subjected to treatment with UV-ozone for 30 minutes. The following organic layers were sequentially deposited onto this transparent anode (ITO film) by a vacuum vapor deposition method:

First layer (hole injection layer): HIL-2; film thickness of 40 nm

Second layer (hole transport layer): HTL-2; film thickness of 10 nm

Third layer (light-emitting layer): BE-3 and H-3 (weight ratio of 5:95); film thickness of 30 nm Fourth layer (first electron transport layer): ETL-1; film thickness of 30 nm Over this, lithium fluoride was vapor-deposited in a thickness of 1 nm, followed by metallic aluminum in a thickness of 70 nm, which gave a cathode. Note that the lithium fluoride (1 nm) constitutes a layer located between the light-emitting layer and the cathode, but because it is an inorganic layer, it is not included in the thickness of the second intermediate organic layer of the present application.

This laminate was put in a glove box that had been replaced with nitrogen gas without coming into contact with the air, and was sealed using a glass sealing jar and a UV-setting adhesive (XNR5516HV, made by Nagase Chiba), which gave the element of Working Example 10-1.

Working Example 10-2

Other than changing as follows, the element of Working Example 10-2 was obtained in the same manner as in Working Example 10-1:

First layer (hole injection layer): HIL-2; film thickness of 50 nm

Second layer (hole transport layer): HTL-2; film thickness of 15 nm

Comparative Example 14

Other than changing as follows, the element of Comparative Example 14 was obtained in the same manner as in Working Example 10-1:

First layer (hole injection layer): HIL-2; film thickness of 95 nm

Second layer (hole transport layer): HTL-2; film thickness of 30 nm

For the elements of Working Examples 10-1 and 10-2 and Comparative Example 14, the external quantum efficiency and the power efficiency were calculated in the same manner as in Working Example 1. Relative values with the results of Comparative Example 14 being used as the references are given in Table 9 below:

TABLE 9

| | Orientation (S) | T1 (nm) | T2 (nm) | T1/T2 | External quantum efficiency (relative value) | Power efficiency (relative value) | Maximum emission wavelength (nm) |
|---|---|---|---|---|---|---|---|
| Working Example 10-1 | 0.7 | 50 | 30 | 1.67 | 1.6 | 1.5 | 450 |
| Working Example 10-2 | 0.7 | 65 | 30 | 2.17 | 1.8 | 1.9 | 450 |
| Comparative Example 14 | 0.7 | 125 | 30 | 4.17 | 1.0 (reference) | 1.0 (reference) | 450 |

As the results in Tables 7 to 9 also reveal, it can be seen that even when the film thickness of the ITO film or light-emitting layer is changed, it is possible to satisfy both high external quantum efficiency and high power efficiency at the same time with the working examples of the present invention, in which the order parameter (degree of orientation (S)) is at least 0.7, and the relationships 1.1<T1/T2<4.0 and also 20 nm<T2<80 nm are satisfied.

Working Example 11

Mode in which the Light-Scattering Layer (Light Extraction Layer is Formed on the Substrate Production of Microparticle Layer Transfer Material
<Formation of Reduced Texture Layer>

A substrate made of a polyethylene terephthalate (PET) film with a thickness of 100 μm was coated with a coating solution for producing a reduced texture layer of the following composition, and [this coating] was dried to form a reduced texture layer with an average thickness of 20 μm.

Note that the average thickness of the reduced texture layer is an average value found by cutting out part of the reduced texture layer and measuring at 10 sites with a scanning electron microscope (S-3400N made by Hitachi High-Technologies) (the same applies to measurements below).

<<Coating Solution for Reduced Texture Layer>>

40 weight parts binder A, 25 weight parts binder B, 10 weight parts plasticizer 1, 0.5 weight part surfactant 1, and 25 weight parts methyl ethyl ketone were mixed to prepare a coating solution for a reduced texture layer.

—Binder A—
methyl methacrylate/2-ethylhexyl acrylate/benzyl methacrylate/methacrylic acid copolymer (molar ratio)=55/11.7/4.5/28.8 (trade name: Aromatex FM601, made by Mitsui Chemicals, weight average molecular weight of 90,000, 21 wt % solids concentration)

—Binder B—
styrene/acrylic acid copolymer (molar ratio)=63/37 (trade name: Arosetto 7055, made by Nippon Shokubai, weight average molecular weight of 8,000, 41 wt % solids concentration)

—Plasticizer 1—
2,2-bis[4-(methacryloxypolyethoxy)phenyl]propane (made by Shin-Nakamura Chemical)

—Surfactant 1—
the following structure 1 (30 wt %):

[Seventy-First Chemical Formula]

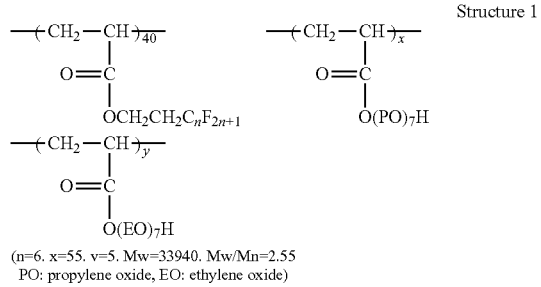

(n=6, x=55, y=5, Mw=33940, Mw/Mn=2.55
PO: propylene oxide, EO: ethylene oxide)

methyl ethyl ketone (70 wt %)

<Formation of the Intermediate Layer>

Next, an intermediate layer with an average thickness of 1.6 μm was formed by coating the aforementioned reduced texture layer with an intermediate layer coating solution having the following composition:

—Intermediate Layer Coating Solution—
2.1 weight parts polyvinyl alcohol (PVA205 (saponification value of 88%), made by Kuraray), 0.95 weight part polyvinyl pyrrolidone (PVP, K-30; made by ISP Japan), 44 weight parts methanol, and 53 weight parts distilled water were mixed to prepare an intermediate layer coating solution.

<Formation of Microparticle Layer>

Next, a microparticle layer with an average thickness of 10 μm was formed by coating the intermediate layer with a microparticle layer composition 1 prepared as follows and drying [this coating]:

<<Microparticle Layer Composition 1>>

30 weight parts microparticle dispersion 1 and 8 weight parts propylene glycol monomethyl ether acetate (MMPG-Ac, made by Daicel Chemical) were mixed at a temperature of 24° C. (±2° C.) and stirred for 10 minutes at 150 rpm. Then, 53 weight parts methyl ethyl ketone, 5 weight parts binder C, 0.002 weight part hydroquinone monomethyl ether, 4.2 weight parts DPHA solution, 0.16 weight part 2,4-bis(trichloromethyl)-6-[4-(N,N-diethoxycarbonylmethyl)amino-3-bromophenyl]-s-triazine, and 0.044 weight part surfactant 1 were added in this order at a temperature of 25° C. (±2° C.), and [the system] was stirred for 30 minutes at 150 rpm at a temperature of 40° C. (±2° C.) to prepare a microparticle layer composition.

—Microparticle Dispersion 1—
As first particles, Optobeads 2000M made by Nissan Chemical (100 wt % solids) (average particle size of 2 μm): 45 wt %
As second particles, MT-05 microparticle titanium oxide made by Tayca (average particle size of 10 nm, refractive index of 2.72): 9.5 wt %
Dispersant expressed by the following structural formula (compound 1): 0.5 wt %

[Seventy-Second Chemical Formula]

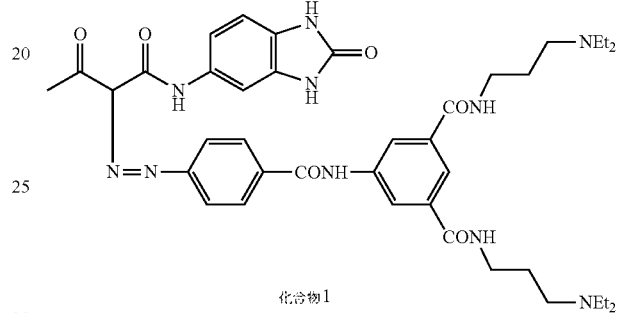

[Key for the text in the chemical formula: compound 1]
polymer (a random copolymer of benzyl methacrylate/methacrylic acid=72/28 (molar ratio), weight average molecular weight of 37,000): 5 wt %
propylene glycol monomethyl ether acetate: 40 wt %

—Binder C—
polymer (random copolymer of benzyl methacrylate/methacrylic acid=78/22 (molar ratio), weight average molecular weight of 38,000): 27 wt %
propylene glycol monomethyl ether acetate: 73 wt %

—DPHA Solution—
dipentaerythritol hexacrylate (containing 500 ppm polymerization inhibitor MEHQ, made by Nippon Kayaku, trade name: Kayarad DPHA): 76 wt %
propylene glycol monomethyl ether acetate: 24 wt %

Finally, a cover film made of polypropylene with a thickness of 12 μm was affixed over the produced microparticle layer, thereby producing a microparticle layer transfer material.

A glass substrate (OA-10, Nippon Electric Glass, with a refractive index of 1.47) was placed in a washing vessel and was ultrasonically washed in a neutral detergent, after which it was ultrasonically washed in pure water and then heated and dried for 120 minutes at 120° C. After drying, a silane coupling solution (0.3 wt % aqueous solution of N-β(aminoethyl) γ-aminopropyltrimethoxysilane, trade name KBM603, made by Shin-Etsu Chemical) was sprayed onto the aforementioned substrate by shower for 20 seconds, which was followed by washing with a pure water shower and heating and drying (2 hours at 80° C.).

Next, with the silane coupling-treated glass substrate thus obtained, the cover film was removed from the microparticle layer transfer material produced as described above, and the surface of the microparticle layer exposed after this removal was superposed over the surface of the aforementioned silane coupling-treated glass substrate such that the two surfaces were in contact, and a laminator was used to laminate the two at a rubber roller temperature of 130° C., a line pressure of 100N/cm, and a conveyance speed of 2.2 meters/minute over a substrate that had been heated for two minutes at 100° C.

Afterwards, [this product] was exposed with a proximity-type exposure device having an ultra-high pressure mercury lamp (made by Hitachi High-Tech Electronics Engineering) and heat-treated for 30 minutes at 100° C., thereby producing a high-refractive index glass substrate with an attached microparticle layer, in which the substrate and the microparticle layer were stuck together with substantially no gap, and the base material (base film) serves as a protective sheet.

Next, a film of ITO (indium tin oxide) was formed by a sputtering method so as to obtain a thickness of 100 nm on the surface of the aforementioned high-refractive index glass substrate with an attached microparticle layer, on the side opposite from the microparticle layer.

An organoelectroluminescent element was produced, [with everything] from the vapor deposition of the first layer (hole injection layer) onward being carried out in the same manner as in Working Example 1.

Working Example 12

Mode in which the Light-Scattering Layer (Light Extraction Layer) is Formed on a High-Refractive Index Glass Substrate with a Refractive Index of at Least 1.8

An organoelectroluminescent element was produced in the same manner as in Working Example 11, except that the glass substrate described in Working Example 11 above was changed to SLH-53 (made by Ohara, with a refractive index of 1.81).

The external quantum efficiency and power efficiency of the elements produced in Working Examples 11 and 12 above were evaluated in the same manner as in Working Example 1. These results are given in Table 10 along with the results of Working Example 1 and Comparative Example 1 given in Table 2.

TABLE 10

|  | External quantum efficiency (relative value) | Power efficiency (relative value) |
| --- | --- | --- |
| Working Example 1 | 1.3 | 1.6 |
| Working Example 11 | 1.6 | 1.9 |
| Working Example 12 | 1.9 | 2.0 |
| Comparative Example 1 | 1.0 (reference) | 1.0 (reference) |

As can be seen from the results in Table 10 above, it became evident that the external quantum efficiency and power efficiency can be increased by providing a light-scattering layer (light extraction layer), and that the additional use of a high-refractive index glass with a refractive index of at least 1.8 as the substrate makes it possible to obtain even higher external quantum efficiency and power efficiency.

INDUSTRIAL APPLICABILITY

With the present invention, it is possible to provide an organoelectroluminescent element which can satisfy both high external quantum efficiency and high power efficiency at the same time as well as a light emission device, display device, and illumination device in which such an organoelectroluminescent element is used.

The present invention was described in detail and with reference to specific embodiments, but it should be apparent to a person skilled in the art that various modifications and adjustments can be made without departing from the spirit and scope of the present invention.

The present application is based on a Japanese patent application filed on Apr. 12, 2011 (Japanese Patent Application 2011-088682) and a Japanese patent application filed on Mar. 12, 2012 (Japanese Patent Application 2012-054390), and the contents thereof are hereby incorporated herein as references.

DESCRIPTION OF SYMBOLS 2 substrate
3 anode
4 hole injection layer
5 hole transport layer
6 light-emitting layer
7 first electron transport layer
8 second electron transport layer
9 cathode
10 organoelectroluminescent element
11 organic layer
12 protective layer
14 adhesive layer
15 light extraction layer
16 sealing container
20 light emission device
30 light-scattering member
30A light incidence face
30B light emission face
31 transparent substrate
32 microparticles
40 illumination device

The invention claimed is:

1. An organoelectroluminescent element which has on a substrate an anode, a first intermediate organic layer composed of at least one organic layer, a light-emitting layer, a second intermediate organic layer composed of at least one organic layer, and a cathode in this order and in which light is extracted from said anode side, wherein
said light-emitting layer contains a single light-emitting material that is oriented in a horizontal direction with the substrate, the order parameter of said light-emitting material in said light-emitting layer is at least 0.7,
wherein said light-emitting material has a structure of Formula 1:

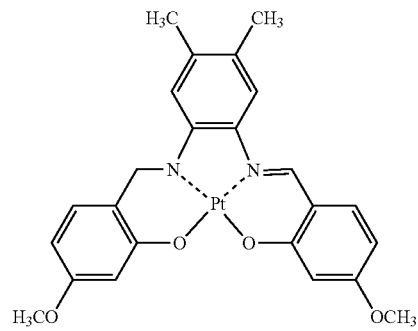

Formula 1 and said light-emitting layer further contains a single host material having a structure of Formula 2:

Formula 2

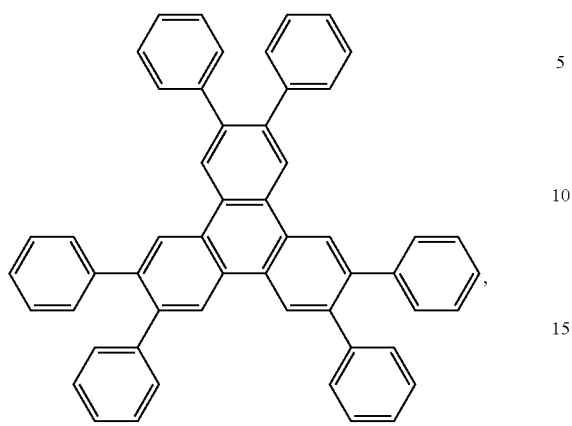

the relationship between thickness T1 (nm) of said first intermediate organic layer and thickness T2 (nm) of said second intermediate organic layer is such that 1.2<T1/T2<2.8 and also such that T1 is 48 nm to 11Onm and T2 is 35 nm to 40 nm; and wherein the organoelectroluminescent element does not comprise a fluorescent light emitting material.

2. A device comprising the organoelectroluminescent element according to claim 1, wherein the device is a light emission device, a display device or an illumination device.

* * * * *

UNITED STATES PATENT AND TRADEMARK OFFICE
CERTIFICATE OF CORRECTION

PATENT NO. : 11,177,450 B2
APPLICATION NO. : 14/110669
DATED : November 16, 2021
INVENTOR(S) : Naoyuki Hayashi et al.

Page 1 of 2

It is certified that error appears in the above-identified patent and that said Letters Patent is hereby corrected as shown below:

In the Claims

Column 172, Line 37, cancel the text beginning with "1. An organoelectroluminescent" and ending in "emitting material." in Column 173, Line 26, and insert the following claim:
--1. An organoelectroluminescent element which has on a substrate an anode, a first intermediate organic layer composed of at least one organic layer, a light-emitting layer, a second intermediate organic layer composed of at least one organic layer, and a cathode in this order and in which light is extracted from said anode side, wherein said light-emitting layer contains a single light-emitting material that is oriented in a horizontal direction with the substrate, the order parameter of said light-emitting material in said light-emitting layer is at least 0.7, wherein said light-emitting material has a structure of Formula I:

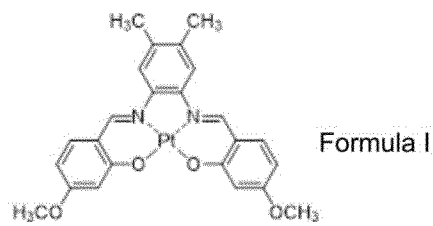

Formula I and said light-emitting layer further contains a single host material having a structure of Formula 2:

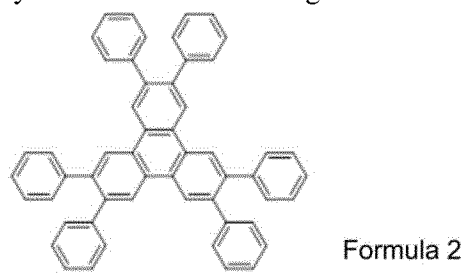

Formula 2 the relationship between thickness T1 (nm) of said first intermediate organic layer and thickness T2 (nm) of said second intermediate organic layer is such that 1.2<T1/T2<2.8 and also such that T1 is 48 nm to 110 nm and T2 is 35 nm to 40 nm; and Signed and Sealed this
Twelfth Day of April, 2022

Drew Hirshfeld
*Performing the Functions and Duties of the
Under Secretary of Commerce for Intellectual Property and
Director of the United States Patent and Trademark Office* wherein the organoelectroluminescent element does not comprise a fluorescent light emitting material.--